(12) United States Patent
Okuyama et al.

(10) Patent No.: US 12,183,663 B2
(45) Date of Patent: *Dec. 31, 2024

(54) SEMICONDUCTOR DEVICE

(71) Applicant: ROHM CO., LTD., Kyoto (JP)

(72) Inventors: Kazuki Okuyama, Kyoto (JP); Shuntaro Takahashi, Kyoto (JP); Motoharu Haga, Kyoto (JP); Shingo Yoshida, Kyoto (JP); Kazuhisa Kumagai, Kyoto (JP); Hajime Okuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/510,204

(22) Filed: Nov. 15, 2023

(65) Prior Publication Data

US 2024/0087996 A1    Mar. 14, 2024

Related U.S. Application Data

(63) Continuation of application No. 17/044,658, filed as application No. PCT/JP2019/015863 on Apr. 11, 2019, now Pat. No. 12,021,012.

(30) Foreign Application Priority Data

Apr. 11, 2018   (JP) ................... 2018-076113

(51) Int. Cl.
*H01L 23/495*    (2006.01)
*H01L 21/48*     (2006.01)
(Continued)

(52) U.S. Cl.
CPC .... *H01L 23/49562* (2013.01); *H01L 21/4825* (2013.01); *H01L 21/565* (2013.01);
(Continued)

(58) Field of Classification Search
CPC .......... H01L 23/49562; H01L 23/3114; H01L 23/34; H01L 23/49582; H01L 23/4952;
(Continued)

(56) References Cited

U.S. PATENT DOCUMENTS 5,642,252 A    6/1997  Sakamoto et al.
5,666,009 A    9/1997  Kumano et al.
(Continued)

FOREIGN PATENT DOCUMENTS

DE    102005010013 A1    9/2006
JP      H0758293 A       3/1995
(Continued)

OTHER PUBLICATIONS

International Search Report issued in International Application No. PCT/JP2019/015863, 2 pages, Jul. 16, 2019.
(Continued)

*Primary Examiner* — Marc Anthony Armand
(74) *Attorney, Agent, or Firm* — HSML P.C.

(57) ABSTRACT

A semiconductor device includes a semiconductor element and a first connection member. The semiconductor element includes a substrate and an electrode pad. The substrate includes a transistor formation region, in which a transistor is formed and which is shaped to be non-quadrangular. The electrode pad is located on the transistor formation region. The first connection member is connected to the electrode pad at one location. The electrode pad is arranged to cover a center of gravity of the transistor formation region in a plan view of the electrode pad. In the plan view, a connection region in which the first connection member is connected to the electrode pad includes a center of gravity position of the transistor formation region.

16 Claims, 58 Drawing Sheets

(51) Int. Cl.
*H01L 21/56* (2006.01)
*H01L 21/765* (2006.01)
*H01L 23/00* (2006.01)
*H01L 23/31* (2006.01)
*H01L 23/34* (2006.01)
*H01L 29/40* (2006.01)
*H01L 29/66* (2006.01)
*H01L 29/78* (2006.01)

(52) U.S. Cl.
CPC ........ *H01L 21/765* (2013.01); *H01L 23/3114* (2013.01); *H01L 23/34* (2013.01); *H01L 23/49513* (2013.01); *H01L 23/4952* (2013.01); *H01L 23/49582* (2013.01); *H01L 24/48* (2013.01); *H01L 29/407* (2013.01); *H01L 29/66734* (2013.01); *H01L 29/7813* (2013.01); *H01L 2224/48245* (2013.01); *H01L 2224/48472* (2013.01); *H01L 2924/13091* (2013.01)

(58) Field of Classification Search
CPC . H01L 21/4825; H01L 21/565; H01L 21/765; H01L 29/407; H01L 29/66734; H01L 29/7813
See application file for complete search history.

(56) References Cited

U.S. PATENT DOCUMENTS

| | | | |
|---|---|---|---|
| 6,218,889 | B1 | 4/2001 | Fujiki et al. |
| 6,963,140 | B2 * | 11/2005 | Sin .................... H01L 23/49562 257/784 |
| 2007/0108601 | A1 | 5/2007 | Ong et al. |
| 2011/0079792 | A1 * | 4/2011 | Lostetter ............. H01L 21/6715 257/77 |
| 2013/0020715 | A1 | 1/2013 | Satou et al. |
| 2014/0231926 | A1 | 8/2014 | Okumura |
| 2014/0264383 | A1 | 9/2014 | Kajiwara et al. |
| 2015/0364587 | A1 | 12/2015 | Yoshinaga et al. |
| 2016/0141231 | A1 | 5/2016 | Yoshihara et al. |
| 2016/0289443 | A1 | 10/2016 | Iwatani et al. |
| 2017/0179108 | A1 * | 6/2017 | Okuda ................ H01L 23/4952 |
| 2018/0178658 | A1 | 6/2018 | Wu |
| 2020/0111727 | A1 | 4/2020 | Tsuno |

FOREIGN PATENT DOCUMENTS

| | | |
|---|---|---|
| JP | H11177087 A | 7/1999 |
| JP | 2004221269 A | 8/2004 |
| JP | 2013-507007 | 2/2013 |
| JP | 2014-003095 | 1/2014 |
| JP | 2014212146 A | 11/2014 |
| JP | 2015-023211 | 2/2015 |
| JP | 2016004877 A | 1/2016 |
| JP | 2016225469 A | 12/2016 |
| JP | 2017-147433 | 8/2017 |
| JP | 2018046127 A | 3/2018 |
| KR | 1020070016063 A | 2/2007 |
| WO | 2006134643 A1 | 12/2006 |
| WO | 2016157259 A1 | 10/2016 |

OTHER PUBLICATIONS

Notice of Reasons for Refusal issued for Japanese Patent Application No. 2020-513453, Dispatch Date: Mar. 1, 2023, 8 pages including English machine translation.
First Office Action issued for Chinese Patent Application No. 201980023618.0, dated May 8, 2023, 12 pages including partial English machine translation.
Office Action issued for German Patent Application No. 11 2019 001 917.1, dated Jan. 9, 2024, 11 pages including partial English machine translation.
Notice of Reasons for Refusal issued for Japanese Patent Application No. 2023-143401, Dispatch Date: Oct. 22, 2024, 27 pages including English machine translation.

* cited by examiner

SEMICONDUCTOR DEVICE

TECHNICAL FIELD

The present invention relates to a semiconductor device.

BACKGROUND ART

A vertical MOSFET is one known example of a semiconductor device in which a drain electrode is formed on a surface at a side mounted on a lead frame, and a source electrode pad and a gate electrode pad are formed on a surface at the opposite side of the surface on which the drain electrode is formed (refer to, for example, patent document 1).

PRIOR ART DOCUMENT

Patent Document

Patent Document 1: Japanese Laid-Open Patent Publication No. 2015-23211

SUMMARY OF THE INVENTION

Problems that the Invention is to Solve

The semiconductor device may be connected to an inductive load in which case it will need to absorb the energy emitted from the inductive load when turned off. When the energy applied by the inductive load to the semiconductor device exceeds a predetermined value, the semiconductor device may fail due to a rise in temperature. Active clamp capacity is an index showing the absorbable amount of the energy stored inductive load. As the value of the active clamp capacity increases, more energy, which is stored in the inductive load, can be absorbed. Thus, it is preferable that the value of the active clamp capacity be large.

It is an object of the present invention to provide a semiconductor device that increases the active clamp capacity.

Means for Solving the Problem

A semiconductor device that achieves the above object includes a semiconductor element including a substrate and a first connection member. The substrate includes a transistor formation region, in which a transistor is formed and which is shaped to be non-quadrangular, and an electrode pad on the transistor formation region. The first connection member is connected to the electrode pad at one location. The electrode pad is arranged to cover a center of gravity of the transistor formation region in a plan view of the electrode pad. In the plan view, a connection region in which the first connection member is connected to the electrode pad includes a center of gravity position of the transistor formation region.

To increase the active clamp capacity of the semiconductor device, the inventors of the present invention have studied the position where the first connection member, which is connected to the semiconductor element, is connected to the electrode pad in the transistor formation region of the semiconductor element. The inventors of the present invention have found that the active clamp capacity increases when the first connection member is connected to the electrode pad at a position corresponding to the center of gravity position of the transistor formation region. In this regard, the present semiconductor device is configured so that the connection region, in which the first connection member is connected to the electrode pad, includes the center of gravity position of the transistor formation region. Accordingly, the active clamp capacity is increased.

A semiconductor device that achieves the above object includes a semiconductor element and a first connection member. The semiconductor element includes a substrate, having a transistor formation region, in which a transistor is formed and which is shaped to be non-quadrangular, and an electrode pad on the transistor formation region. The first connection member is connected to the electrode pad at multiple locations. The transistor formation region is divided into divided regions having equal areas in accordance with the number of locations where the first connection member is connected. The electrode pad is arranged to cover a center of gravity of each of the plurality of divided regions in a plan view. In the plan view, a connection region in which the first connection member is connected to the electrode pad includes a center of gravity position of each of the divided regions.

To increase the active clamp capacity of the semiconductor device, the inventors of the present invention have studied the position where the first connection member, which is connected to the semiconductor element, is connected to the electrode pad in the transistor formation region of the semiconductor element. The inventors of the present invention have found that when the first connection member is connected to the electrode pad at two locations, the active clamp capacity increases by connecting the first connection member to the electrode pad at positions corresponding to the center of gravity position of each of two divided regions having equal areas obtained by dividing the transistor formation region. In this regard, the present semiconductor device is configured so that the connection region, in which the first connection member is connected to the electrode pad, includes the center of gravity position of the transistor formation region. Accordingly, the active clamp capacity is increased.

A semiconductor device that achieves the above object includes a semiconductor element and first connection members. The semiconductor element includes a substrate, having a transistor formation region, in which a transistor is formed and which is shaped to be non-quadrangular, and an electrode pad on the transistor formation region. The first connection members are connected to the electrode pad. The transistor formation region is divided into divided regions having equal areas in accordance with the number of the first connection members. The electrode pad is arranged to cover a center of gravity of each of the divided regions in a plan view. In the plan view, a connection region in which the first connection members are each connected to the electrode pad includes a center of gravity position of each of the divided regions.

To increase the active clamp capacity of the semiconductor device, the inventors of the present invention have studied the position where the first connection member, which is connected to the semiconductor element, is connected to the electrode pad in the transistor formation region of the semiconductor element. The inventors of the present invention have found that when the first connection members are connected to the electrode pad at two locations, the active clamp capacity increases by connecting the first connection members to the electrode pad at positions corresponding to the center of gravity position of each of the divided regions having equal areas obtained by dividing the transistor formation region in accordance with the number of the first connection members. In this regard, the present semiconductor device is configured so that the connection region, in which the first connection members are connected to the electrode pad, includes the center of gravity position of each of the divided regions having equal areas obtained by dividing the connection region in accordance with the number of the first connection members. Accordingly, the active clamp capacity is increased.

Effects of the Invention

The semiconductor device increases the active clamp capacity.

BRIEF DESCRIPTION OF THE DRAWINGS

FIG. 24 is a schematic plan view showing an active region and a source pad of the semiconductor element in a semiconductor device according to a fourth embodiment.

FIG. 25 is a schematic plan view showing the active region and the source pad of the semiconductor element.

MODES FOR CARRYING OUT THE INVENTION

Figure 1:
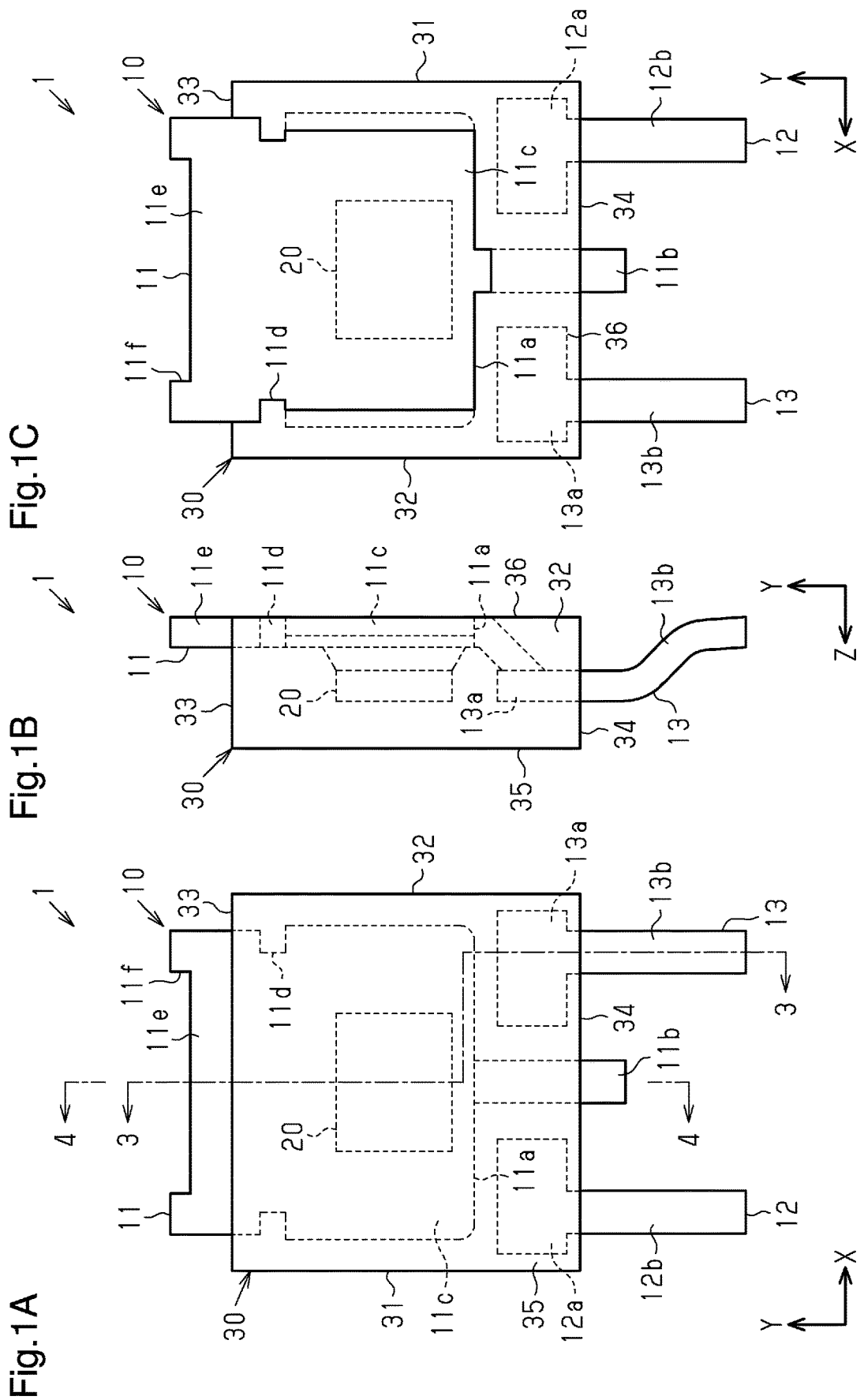
FIG. 1A is a plan view of a semiconductor device according to a first embodiment.
FIG. 1B is side view of the semiconductor device.
FIG. 1C is a bottom view of the semiconductor device.

Embodiments of a semiconductor device will now be described with reference to the drawings. The embodiment described below exemplifies a configuration and method for embodying a technical concept and is not intended to limit the material, shape, structure, arrangement, dimensions, and the like of each component to the description. The embodiment described below may undergo various modifications.

In the present specification, "a state in which member A is connected to member B" includes a case in which member A and member B are directly connected physically and a case in which member A and member B are indirectly connected by another member that does not affect the electric connection state.

Similarly, "a state in which member C is arranged between member A and member B" includes a case in which member A is directly connected to member C or member B is directly connected to member C and a case in which member A is indirectly connected to member C by another member that does not affect the electric connection state or member B is indirectly connected to member C by another member that does not affect the electric connection state.

First Embodiment

As shown in FIGS. 1A to 3, a semiconductor device 1 includes a lead frame 10, a semiconductor element 20 mounted on the lead frame 10, and an encapsulation resin 30 that encapsulates part of the lead frame 10 and the semiconductor element 20. The semiconductor element 20 includes a transistor connected to, for example, an inductive load and turns the transistor on and off. Preferably, in the semiconductor device 1, for example, the semiconductor element 20 has an ON resistance of 30 mΩ or less. One example of the ON resistance of the semiconductor element 20 is 28 mΩ. The semiconductor device 1 is used in, for example, control circuitry of a vehicle on-board electric device. Examples of a vehicle on-board electric device includes an engine, an air conditioning device, a steering device, and the like. The encapsulation resin 30 is sized so that the dimension in the horizontal direction X is approximately 6.6 mm, the dimension in the vertical direction Y is approximately 6.1 mm, and the dimension in the thickness direction Z is approximately 2.3 mm. The semiconductor device 1 may be used in a controller for a device other than a vehicle on-board electric device (e.g., outdoor unit of air conditioner).

The encapsulation resin 30 includes a first side surface 31 and a second side surface 32, which are side surfaces in the horizontal direction X, a third side surface 33 and a fourth side surface 34, which are side surfaces in the vertical direction Y, and a fifth side surface 35 and a sixth side surface 36, which are side surfaces in the thickness direction Z. The encapsulation resin 30 is formed from a thermosetting resin in which a filler is dispersed and mixed. One example of the thermosetting resin is an epoxy resin. One example of the filler is a silica filler. The compound ratio of the filler to the epoxy resin is 85 to 90 volume percent. Preferably, the material used for the encapsulation resin 30 has a coefficient of linear expansion that is greater than 10 ppm/K and less than 15 ppm/K. The coefficient of linear expansion of the encapsulation resin 30 may be changed in accordance with, for example, the compound ratio of the filler. In the present embodiment, the coefficient of linear expansion of the encapsulation resin 30 is 12 ppm/K.

Figure 3:
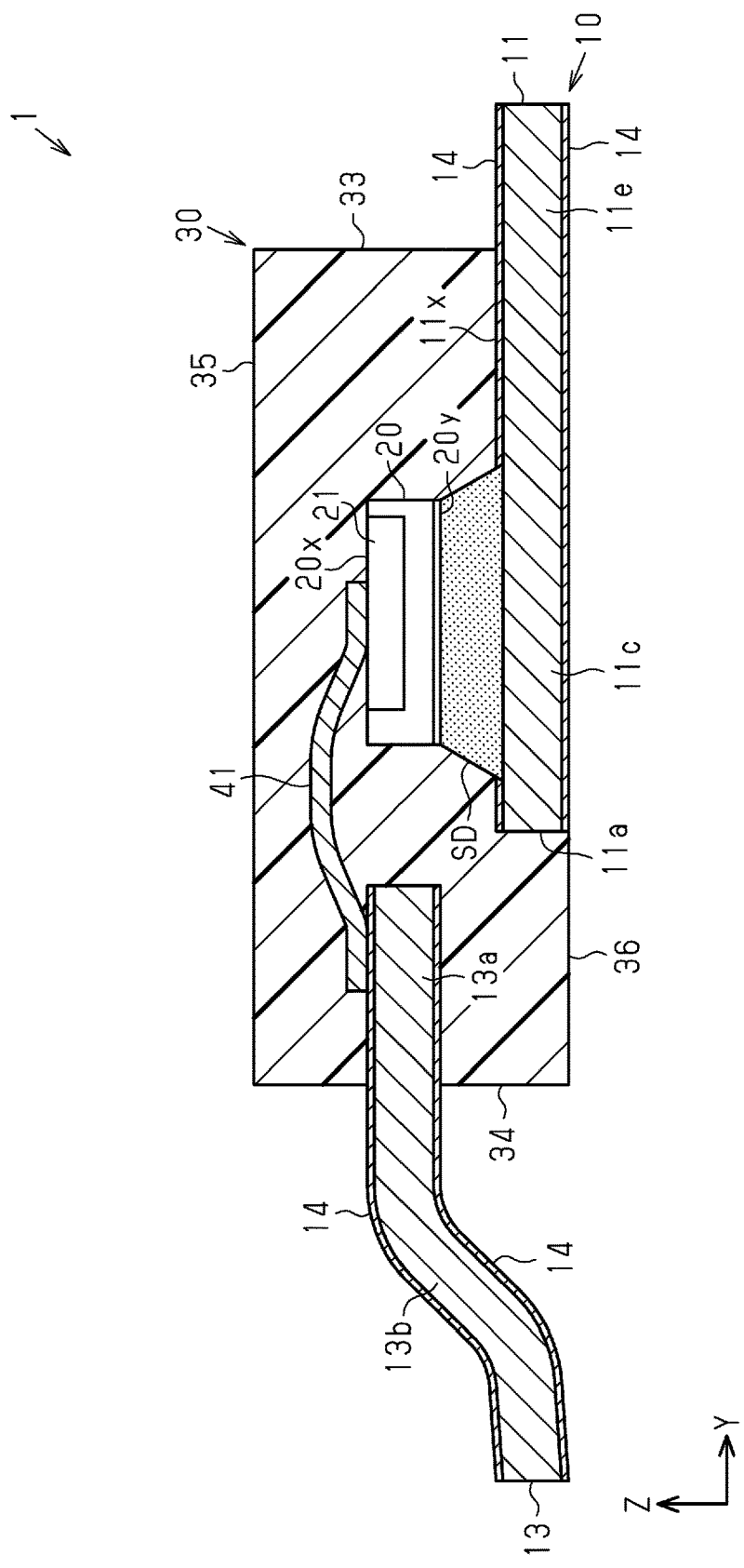
FIG. 3 is a cross-sectional view taken along line 3-3 in FIG. 1.
Figure 4:
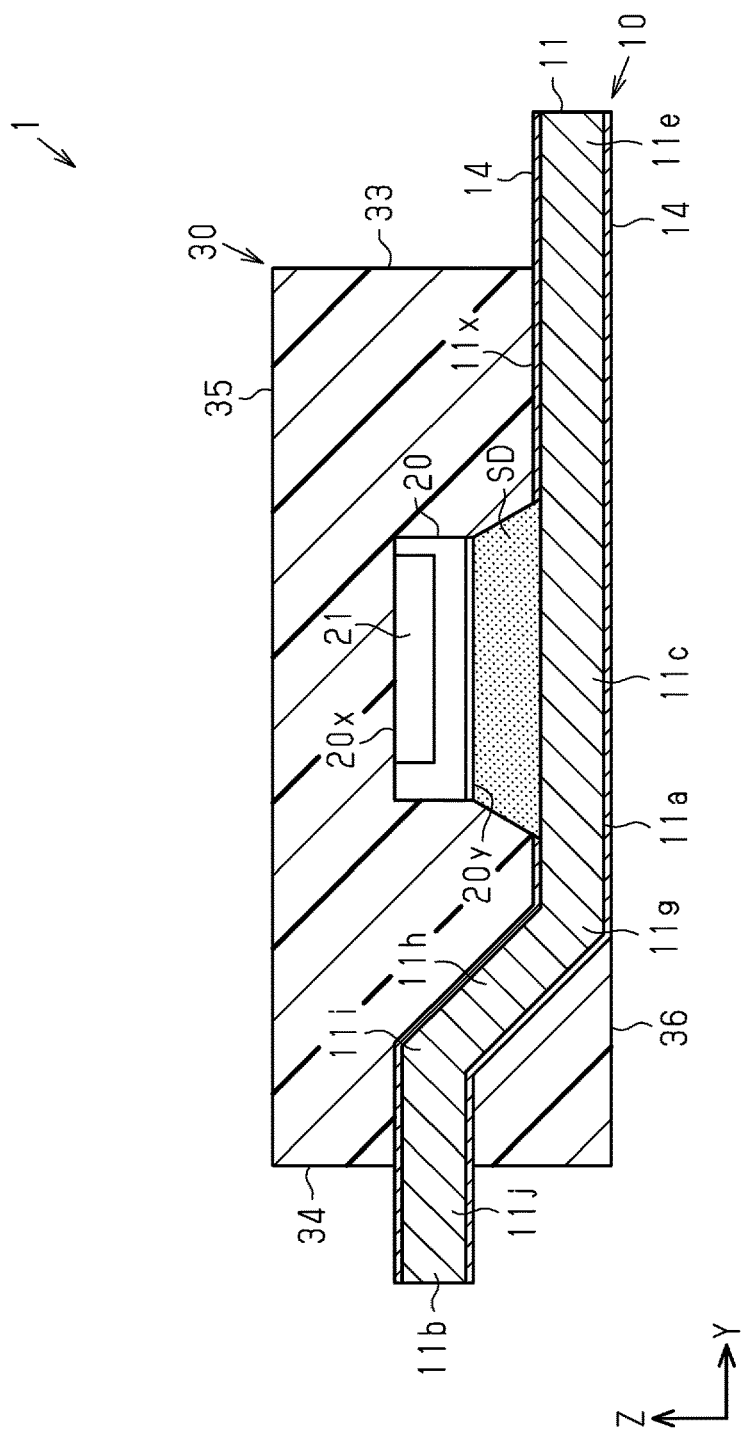
FIG. 4 is a cross-sectional view taken along line 4-4 in FIG. 1.

The lead frame 10 includes a first lead frame 11, a second lead frame 12, and a third lead frame 13. Each of the lead frames 11, 12, and 13 is formed from, for example, copper (Cu). A nickel (Ni) plating is applied to the outer surface of each of the lead frames 11, 12, and 13. FIGS. 3 and 4 each show one example of a plating layer 14 on the first lead frame 11 and the second lead frame 12.

Figure 2:
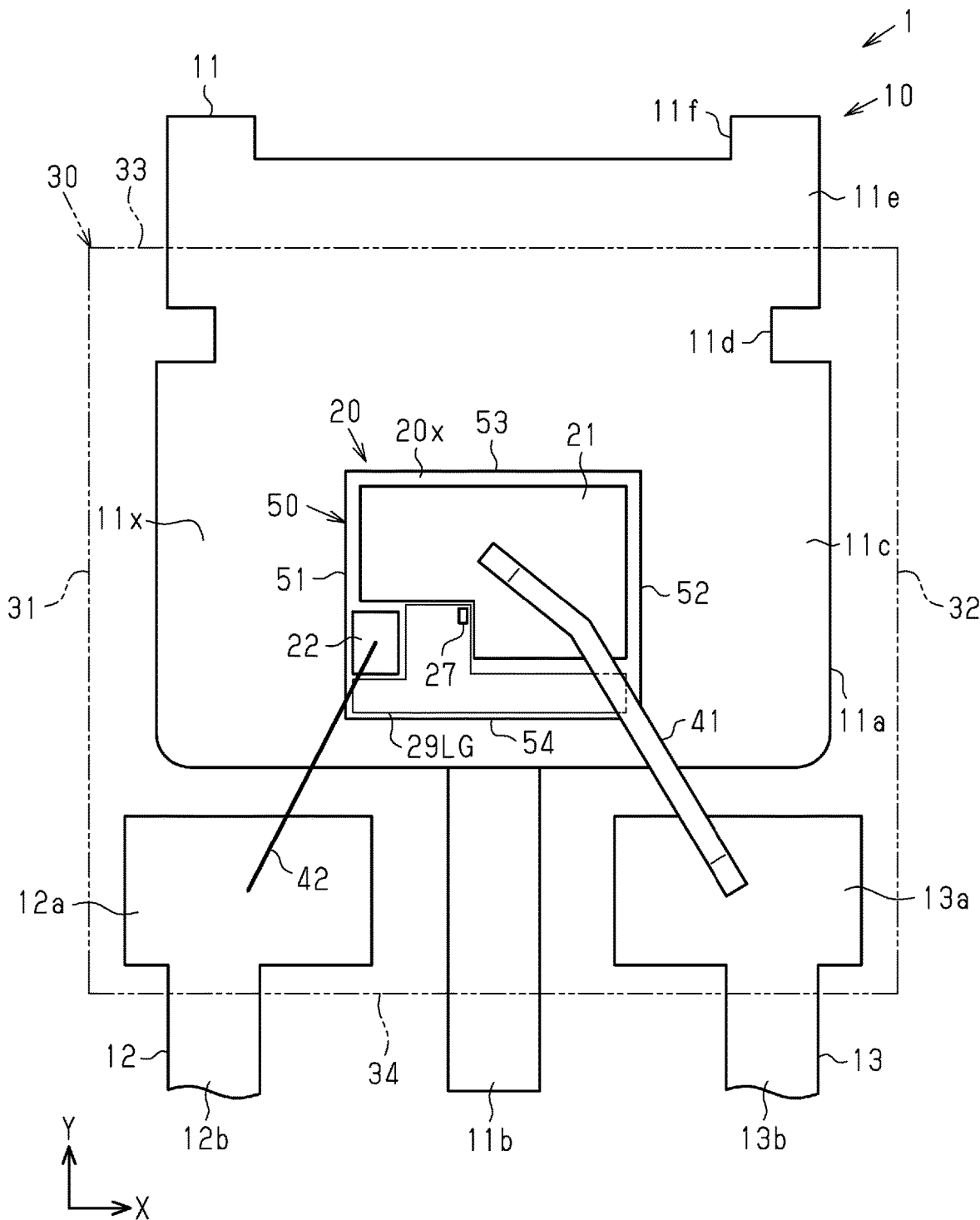
FIG. 2 is a plan view showing the internal structure of the semiconductor device.

As shown in FIGS. 1A and 2, the first lead frame 11 includes an output terminal OUT. A first island 11a and a first terminal 11b are included. The first island 11a and the first terminal 11b are formed integrally. The first island 11a and the first terminal 11b may be formed separately and then coupled to each other.

The first island 11a is rectangular in a plan view. Part of the first island 11a in the vertical direction Y projects from the third side surface 33 of the encapsulation resin 30 in the vertical direction Y As shown in FIGS. 1B and 1C, the first island 11a is exposed from the sixth side surface 36 of the encapsulation resin 30. The first island 11a includes a main body 11c located in the encapsulation resin 30, a narrow portion 11d located proximate to the third side surface 33 in the encapsulation resin 30, and a distal end 11e extending from the narrow portion 11d in the vertical direction Y Part of the distal end 11e projects out of the third side surface 33 of the encapsulation resin 30. In the present embodiment, the dimension of the distal end 11e in the horizontal direction X is less than the dimension of the main body 11c in the horizontal direction X. The edge of the distal end 11e in the vertical direction Y includes a recess 11f that is recessed toward the third side surface 33. The narrow portion 11d forms recesses in the horizontal direction X. Thus, the adhesion of the first island 11a with the encapsulation resin 30 is improved. This restricts movement of the first island 11a in the vertical direction Y relative to the encapsulation resin 30.

As shown in FIGS. 1A and 1C, the portion of the main body 11c of the first island 11a exposed from the sixth side surface 36 of the encapsulation resin 30 has a smaller area than the main body 11c in a plan view. More specifically, in the thickness direction Z, the portion of the main body 11c closer to the fifth side surface 35 of the encapsulation resin 30 is longer in the horizontal direction X than the portion of the main body 11c closer to the sixth side surface 36 of the encapsulation resin 30. As a result, the portion of the main body 11c closer to the fifth side surface 35 of the encapsulation resin 30 is held by the encapsulation resin 30 in the thickness direction Z. This restricts movement of the first lead frame 11 in the thickness direction Z.

The first island 11a may have any shape. For example, at least one of the narrow portion 11d and the recess 11f can be omitted. Further, the dimension of the distal end 11e in the horizontal direction X can be greater than or equal to the dimension of the main body 11c in the horizontal direction X. Further, the distal end 11e can form the output terminal OUT. Additionally, the area of the portion in the main body 11c of the first island 11a exposed from the sixth side surface 36 of the encapsulation resin 30 can be equal to the area of the main body 11c in a plan view.

As shown in FIG. 4, the first terminal 11b that forms the output terminal OUT projects from the fourth side surface 34 of the encapsulation resin 30 in the vertical direction Y The portion of the first terminal 11b projecting out of the fourth side surface 34 of the encapsulation resin 30 is located closer to the first island 11a than the fifth side surface 35 of the encapsulation resin 30 in the thickness direction Z. The first terminal 11b includes a first bent portion 11g, which is bent toward the fifth side surface 35 of the encapsulation resin 30 from a portion connected to the first island 11a, an inclined portion 11h, which is inclined toward the fifth side surface 35 in the direction of the fourth side surface 34 of the encapsulation resin 30, a second bent portion 11i, which is bent again near the fourth side surface 34 of the encapsulation resin 30, and a distal end portion 11j, which is orthogonal to the thickness direction Z and extends in the vertical direction Y Part of the distal end portion 11j projects out of the fourth side surface 34 of the encapsulation resin 30. In the present embodiment, the first bent portion 11g, the inclined portion 11h, the second bent portion 11i, and the distal end portion 11j are formed integrally.

As shown in FIG. 2, the second lead frame 12 forms an input terminal IN. The second lead frame 12 is located close to the first side surface 31 and fourth side surface 34 of the encapsulation resin 30. The second lead frame 12 includes a second island 12a and a second terminal 12b. The second island 12a and the second terminal 12b are formed integrally. The second island 12a and the second terminal 12b may be formed separately and then coupled to each other.

The second island 12a is rectangular and longer in the horizontal direction X than in the vertical direction Y in a plan view. The second island 12a is located closer to the fourth side surface 34 of the encapsulation resin 30 than the first island 11a in the vertical direction Y The second island 12a is located closer to the first side surface 31 of the encapsulation resin 30 than the first terminal 11b in the horizontal direction X. The second island 12a is located closer to the fifth side surface 35 of the encapsulation resin 30 than the first island 11a in the thickness direction Z.

The second terminal 12b extends from a portion of the second island 12a near the first side surface 31 of the encapsulation resin 30 in the vertical direction Y The second terminal 12b projects out of the fourth side surface 34 of the encapsulation resin 30. The portion of the second terminal 12b projecting out of the fourth side surface 34 of the encapsulation resin 30 is longer in the vertical direction Y than the portion of the first terminal 11b projecting out of the fourth side surface 34 of the encapsulation resin 30 in the vertical direction Y The second terminal 12b has a distal end portion bent to be located at the same position as the first island 11a in the thickness direction Z.

The third lead frame 13 forms a ground terminal GND. The third lead frame 13 includes a third island 13a and a third terminal 13b. The third island 13a and the third terminal 13b are formed integrally. The third island 13a and the third terminal 13b may be formed integrally and then coupled to each other.

The third island 13a is rectangular and longer in the horizontal direction X than in the vertical direction Y in a plan view. The third island 13a is located closer to the fourth side surface 34 of the encapsulation resin 30 than the first island 11a in the vertical direction Y The third island 13a is located closer to the second side surface 32 of the encapsulation resin 30 than the first terminal 11b in the horizontal direction X. The third island 13a is located closer to the fifth side surface 35 of the encapsulation resin 30 than the first island 11a in the thickness direction Z (refer to FIG. 3).

The third terminal 13b extends from a portion of the third island 13a near the second side surface 32 of the encapsulation resin 30 in the vertical direction Y The third terminal 13b projects out of the fourth side surface 34 of the encapsulation resin 30. The portion of the third terminal 13b projecting out of the fourth side surface 34 of the encapsulation resin 30 is longer in the vertical direction Y than the portion of the first terminal 11b projecting out of the fourth side surface 34 of the encapsulation resin 30 in the vertical direction Y and equal in length in the vertical direction Y to the portion of the second terminal 12b projecting out of the fourth side surface 34 of the encapsulation resin 30. The third terminal 13b has a distal end portion bent to be located at the same position as the first island 11a in the thickness direction Z (refer to FIG. 3).

As shown in FIGS. 2 and 3, the semiconductor element 20 is mounted on a surface 11x of the main body 11c of the first lead frame 11. More specifically, solder SD is applied to the surface 11x of the main body 11c. The semiconductor element 20 is placed on the solder SD. As shown in FIG. 2, the semiconductor element 20 is arranged on a portion of the main body 11c near the fourth side surface 34 of the encapsulation resin 30 in the vertical direction Y (near second island 12a and third island 13a in vertical direction Y). The semiconductor element 20 is arranged at the middle of the main body 11c in the horizontal direction X.

The semiconductor element 20 of the present embodiment is a power MOSFET or IGBT. The semiconductor element 20 is rectangular and laid out to be longer in the horizontal direction X than the vertical direction Y in a plan view. The semiconductor element 20 of the present embodiment is sized so that the dimension in the vertical direction Y is 2.25 mm and the dimension in the horizontal direction X is 2.68 mm. There is no limit to the shape and dimensions of the semiconductor element 20 in a plan view. For example, the semiconductor element 20 may be a square so that the dimension in the vertical direction Y is equal to the dimension in the horizontal direction X.

A source pad 21, which is one example of an electrode pad, and a gate pad 22, which is one example of a control electrode pad, are arranged in a front surface 20x the semiconductor element 20. A drain electrode is arranged in a back surface 20y of the semiconductor element 20 (refer to FIG. 3), that is, the surface of the semiconductor element 20 opposing the first island 11a. The drain electrode is electrically connected by the solder SD to the first island 11a (first lead frame 11).

The source pad 21 is connected to one end of a first wire 41, which is one example of a connection member. The other end of the first wire 41 is connected to the third island 13a of the third lead frame 13. The first wire 41 is, for example, wedge-bonded and connected to each of the source pad 21 and the third island 13a. In the present embodiment, there is one first wire 41. The first wire 41 of the present embodiment is an aluminum wire that uses aluminum (Al). Preferably, the first wire 41 has a diameter of, for example, 100 m. Further preferably, the diameter of the first wire 41 is, for example, 300 μm to 400 μm. In the present embodiment, the diameter of the first wire 41 is approximately 300 μm. The first wire 41 may be a copper wire that uses copper (Cu).

As shown in FIG. 2, one end of a second wire 42 is connected to the gate pad 22. The other end of the second wire 42 is connected to the second island 12a of the second lead frame 12. The second wire 42 is, for example, wedge-bonded and connected to each of the gate pad 22 and the second island 12a. In the present embodiment, there is one second wire 42. The material of the second wire 42 is, for example, aluminum (Al) and copper (Cu). Aluminum is used for the second wire 42 of the present embodiment. The second wire 42 has a smaller diameter than the first wire 41. The diameter of the second wire 42 is, for example, 125 μm.

Figure 5:
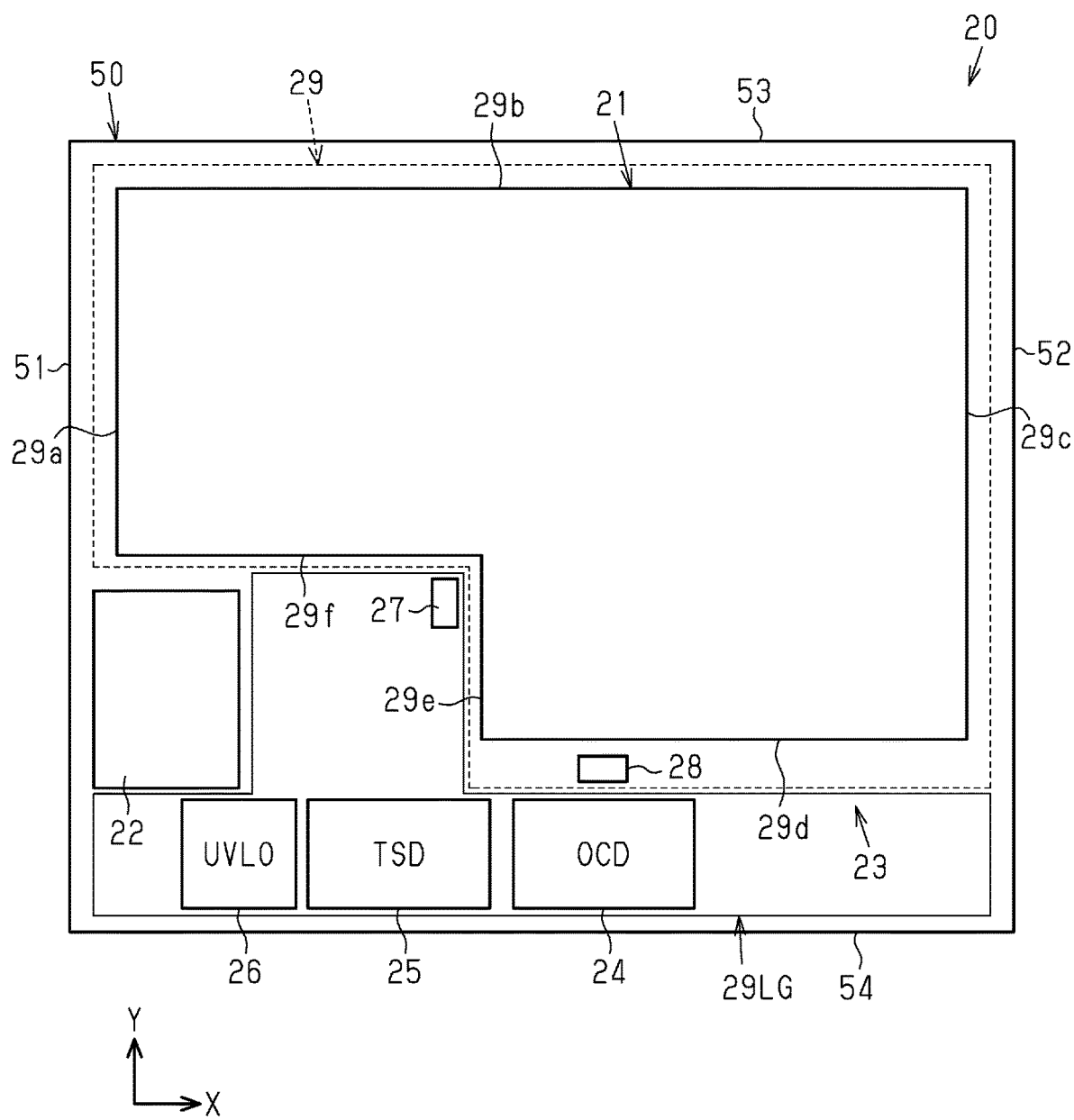
FIG. 5 is a plan view showing the internal structure of the semiconductor device.

As shown in FIGS. 2 and 5, the semiconductor element 20 includes a substrate 50 that is rectangular in a plan view. The substrate 50 includes a first side surface 51 and a second side surface 52 that extend in the vertical direction Y and a third side surface 53 and a fourth side surface 54 that extend in the horizontal direction X. The first side surface 51 is the side surface of the substrate 50 on the same side as the first side surface 31 of the encapsulation resin 30, the second side surface 52 is the side surface of the substrate 50 on the same side as the second side surface 32 of the encapsulation resin 30, the third side surface 53 is the side surface of the substrate 50 on the same side as the third side surface 33 of the encapsulation resin 30, and the fourth side surface 54 is the side surface of the substrate 50 on the same side as the fourth side surface 34 of the encapsulation resin 30.

The semiconductor element 20 includes a switching circuit 23 having metal insulator semiconductor field effect transistors (MISFETs), which are examples of functional elements formed in the outermost part of the substrate 50. As an example of control circuitry that controls the switching circuit 23, the semiconductor element 20 further includes an over current detection (OCD) circuit 24, a thermal shut down (TSD) circuit 25, an under voltage lock out (UVLO) circuit 26, a temperature sensor 27, and a current sensor 28. The over current detection circuit 24, the thermal shut down circuit 25, the under voltage lock out circuit 26, the temperature sensor 27, and the current sensor 28 are each formed in the outermost part of the substrate 50. Thus, the semiconductor element 20 is an Intelligent Power Switch (IPS) in which the switching circuit 23 (power MISFETs), the over current detection circuit 24, the thermal shut down circuit 25, the under voltage lock out circuit 26, the temperature sensor 27, and the current sensor 28 are formed in the outermost part of the same substrate 50.

The switching circuit 23 is formed in an active region 29 set on the substrate 50. The active region 29 is substantially L-shaped in a plan view to avoid the gate pad 22 and the temperature sensor 27. More specifically, the active region 29 is shaped to include, in a plan view, a first side 29a that is the closest to the first side surface 51 of the substrate 50, a second side 29b that is the closest to the third side surface 53 of the substrate 50, a third side 29c that is closest to the second side surface 52 of the substrate 50, a fourth side 29d that is the closest to the fourth side surface 54 of the substrate 50, and a fifth side 29e and sixth side 29f that form a cutaway portion of the active region 29. The fifth side 29e extends in the vertical direction Y, and the sixth side 29f extends in the horizontal direction X. One end of the first side 29a is connected to the second side 29b, and the other end of the first side 29a is connected to the sixth side 29f. The end of the second side 29b opposite to the first side 29a is connected to the third side 29c. The end of the third side 29c opposite to the second side 29b is connected to the fourth side 29d. The end of the fourth side 29d opposite to the third side 29c is connected to the fifth side 29e. The end of the fifth side 29e opposite to the fourth side 29d is connected to the sixth side 29f. As apparent from FIG. 5, the first side 29a is shorter than the third side 29c, and the second side 29b is longer than the fourth side 29d. The active region 29 is covered by the source pad 21. The source pad 21 is substantially L-shaped in a plan view. More specifically, the source pad 21 is arranged on the substrate 50 near the third side surface 53. The source pad 21 is substantially L-shaped in a plan view by cutting away the region of the substrate 50 at the side where the gate pad 22 is arranged, that is, the region of the substrate 50 near the first side surface 51 and the second side surface 52. In the present embodiment, the source pad 21 and the active region 29 have similar shapes. The shape of source pad 21 and the shape of the active region 29 may be changed. In one example, the shape of the source pad 21 may differ from the shape of the active region 29.

Further, as shown in FIGS. 2 and 5, the semiconductor element 20 includes a control circuitry region 29LG formed to avoid the source pad 21 and the gate pad 22. The control circuitry region 29LG includes a first portion located closer to the fourth side surface 54 of the substrate 50 than the source pad 21 and the gate pad 22 and a second portion extending from the first portion toward the third side surface 53 of the substrate 50. The second portion is formed between the gate pad 22 and the source pad 21 in the horizontal direction X. The over current detection circuit 24, the thermal shut down circuit 25, the under voltage lock out circuit 26, and the temperature sensor 27 are arranged in the control circuitry region 29LG. The over current detection circuit 24, the thermal shut down circuit 25, and the under voltage lock out circuit 26 are located in the control circuitry region 29LG closer to the fourth side surface 54 of the substrate 50 than the active region 29. The over current detection circuit 24, the thermal shut down circuit 25, and the under voltage lock out circuit 26, and the horizontal direction X are laid out in a single line. The under voltage lock out circuit 26 is located in the control circuitry region 29LG closer to the first side surface 51 of the substrate 50 than the over current detection circuit 24 and the thermal shut down circuit 25. Part of the under voltage lock out circuit 26 is located next to the gate pad 22 in the vertical direction Y.

The temperature sensor 27 is arranged in the control circuitry region 29LG. The temperature sensor 27 is set in a region outside the source pad 21 at a position where the temperature becomes the highest when the semiconductor device 1 is driven. The position of the temperature sensor 27 is, for example, set by performing a simulation or the like based on the temperature distribution of the substrate 50 when the semiconductor device 1 is driven. In the present embodiment, the temperature sensor 27 is located near the intersection point of the fifth side 29e and the sixth side 29f in the active region 29.

The current sensor 28 is located between the over current detection circuit 24 and the source pad 21 on the substrate 50. The current sensor 28 is arranged in the active region 29. The current sensor 28 is located closer to the over current detection circuit 24 than the source pad 21 in the vertical direction Y.

Figure 6:
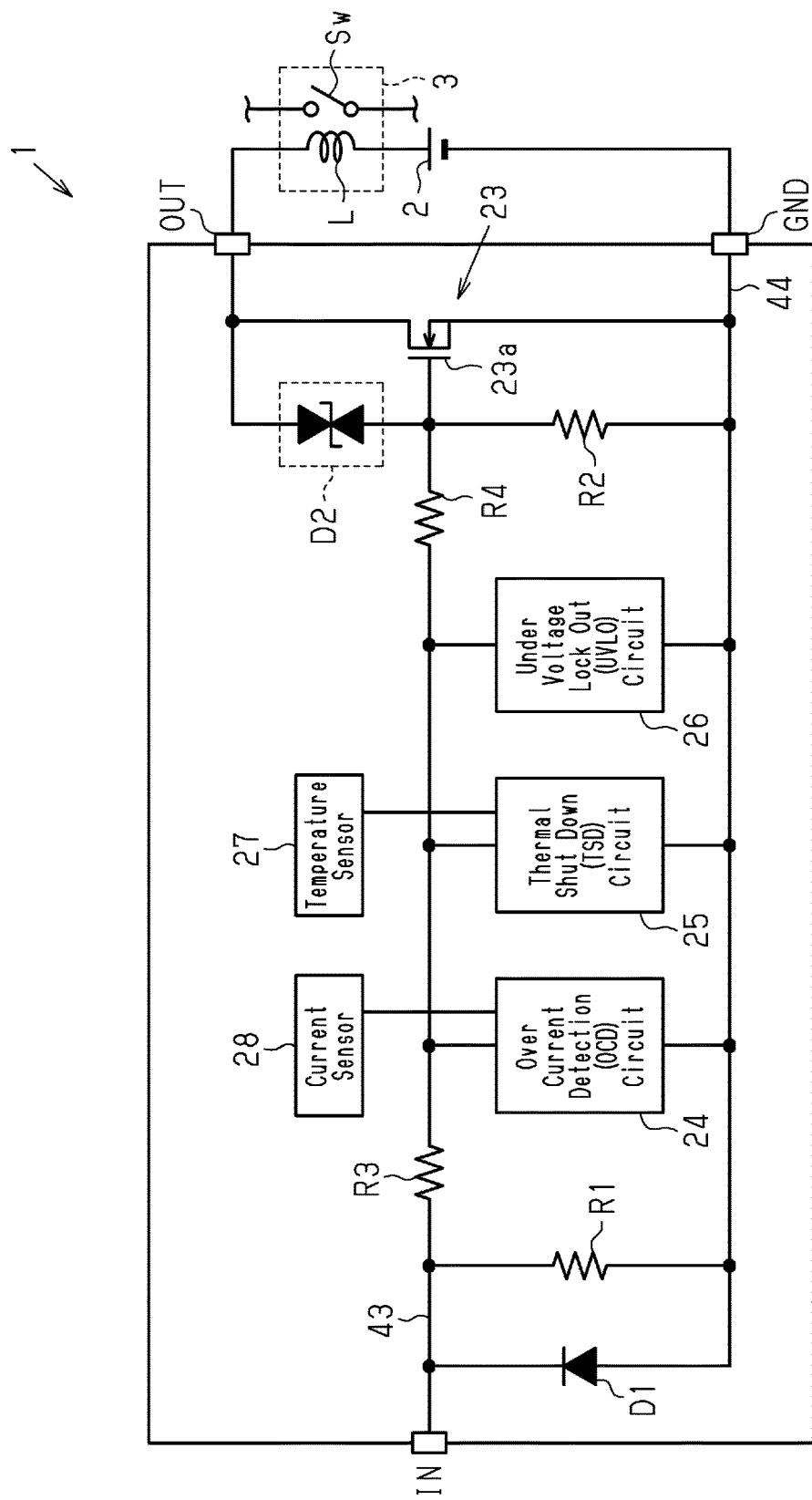
FIG. 6 is a circuit diagram showing the circuitry of the semiconductor device.

The electrical configuration of the semiconductor device 1 will now be described with reference to FIG. 6. FIG. 6 shows one example of the circuit configuration of the semiconductor device 1. In the example shown in FIG. 6, a battery 2 and an inductive load 3 are externally connected to the output terminal OUT and the ground terminal GND. Further, in the example shown in FIG. 6, the inductive load 3 is a relay including a coil L.

The switching circuit 23 is connected between the output terminal OUT and the ground terminal GND. The switching circuit 23 includes the power MISFET (hereafter referred to as "the MISFET 23a"), which is one example of a power transistor. The MISFET 23a includes a gate terminal G, which serves as a control terminal, a drain terminal D, and a source terminal S. The switching circuit 23 is laid out so that the drain terminal D of the MISFET 23a is connected to the output terminal OUT and the source terminal S is connected to the ground terminal GND. The switching circuit 23 includes a plurality of power MISFETs. However, only one MISFET 23a is shown in FIG. 6 for the sake of brevity.

An input line 43 is connected between the input terminal IN and the gate terminal G of the MISFET 23a. A ground line 44 is connected between the ground terminal GND and the source terminal S of the MISFET 23a. A diode D1, a first resistor R1, the over current detection circuit 24, the thermal shut down circuit 25, the under voltage lock out circuit 26, and a second resistor R2 are connected in parallel to one another between the input line 43 and the ground line 44 in order from the input terminal IN. A third resistor R3 is connected in series between the first resistor R1 and the over current detection circuit 24 in the input line 43. A fourth resistor R4 is connected in series between the under voltage lock out circuit 26 and the second resistor R2 in the input line 43.

The current sensor 28 is electrically connected to the over current detection circuit 24. The current sensor 28 detects, for example, the current flowing through the switching circuit 23. The current value detected by the current sensor 28 is provided to the over current detection circuit 24. The over current detection circuit 24 is driven in accordance with the current value provided from the current sensor 28. In one example of the over current detection circuit 24, when current that is greater than or equal to a predetermined value (over current) flows through the switching circuit 23 due to a short circuit, the over current detection circuit 24 restricts the flow of current to protect the circuitry.

The temperature sensor 27 is electrically connected to the thermal shut down circuit 25. The temperature sensor 27 detects the temperature of the substrate 50. The temperature of the substrate 50 detected by the temperature sensor 27 is provided to the thermal shut down circuit 25. The thermal shut down circuit 25 is driven in accordance with the temperature of the substrate 50 provided from the temperature sensor 27. In one example, when the temperature of the substrate 50 becomes greater than or equal to a predetermined value, the thermal shut down circuit 25 stops the switching circuit 23 with the over current detection circuit 24. As a result, an increase in the temperature of the substrate 50 is limited.

The under voltage lock out circuit 26 is configured to prohibit actuation of the switching circuit 23 when the potential difference between the input line 43 and the ground line 44 is less than or equal to a predetermined value and permit actuation of the switching circuit 23 when the potential difference is greater than or equal to a predetermined value.

A clamp diode D2 is electrically connected between the gate terminal G and drain terminal D of the MISFET 23a. The clamp diode D2 is formed by reverse-bias-connecting two diodes. The two diodes may include a Zener diode. The clamp diode D2 may be formed by any number of diodes.

When the input terminal IN has a high level, the MISFET 23a of the semiconductor device 1 is turned on and current flows from the battery 2 through the coil L of the inductive load 3 and the MISFET 23a.

When the input terminal IN shifts from a high level to a low level, the MISFET 23a is turned off. In this case, the current flowing through the inductive load 3 increases the output voltage Vout at the output terminal OUT. The output voltage Vout at the output terminal OUT increases to a voltage determined by the battery 2 and the clamp diode D2 (e.g., 48 V). The current that flows via the clamp diode D2 to the resistor R2 when the output voltage Vout rises slightly increases the gate voltage of the MISFET 23a. Consequently, current flows through the MISFET 23a. This results in an active clamp state, that is, a state in which gate voltage is generated so that a small amount of current flows to the MISFET 23a. The active clamp state continues until the current from the battery 2 to the MISFET 23a becomes 0 A, and the output voltage Vout decreases to the voltage of the battery 2.

Connection of Source Pad to First Wire

Figure 7:
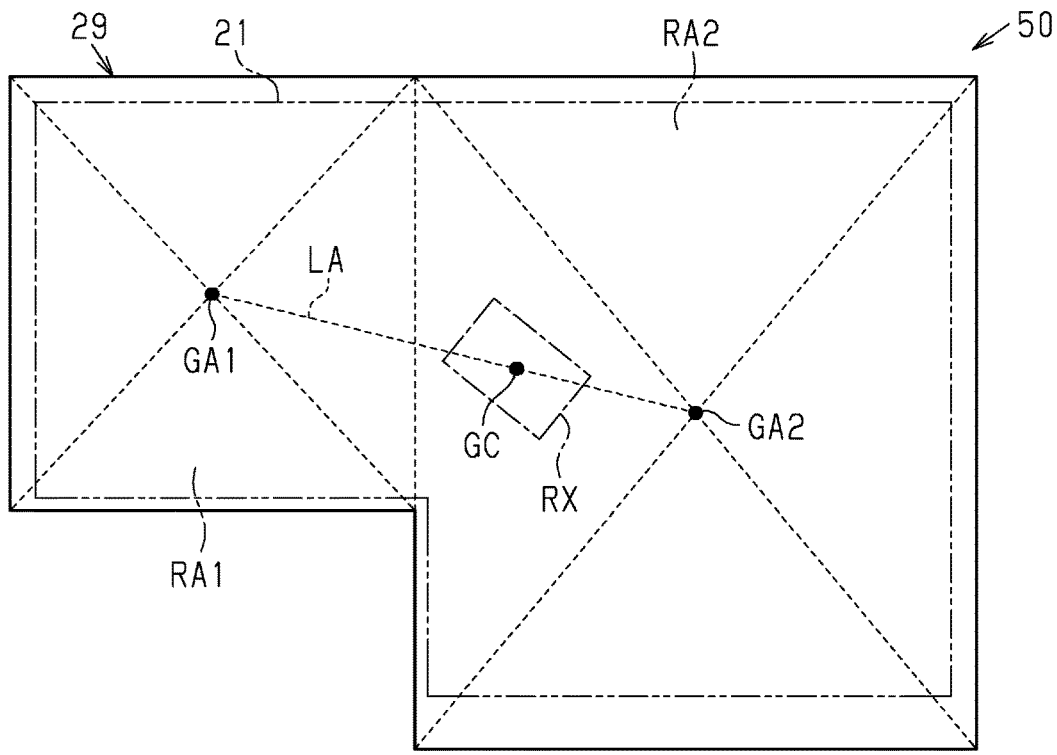
FIG. 7 is a schematic plan view showing an active region and a source pad of a semiconductor element.
Figure 8:
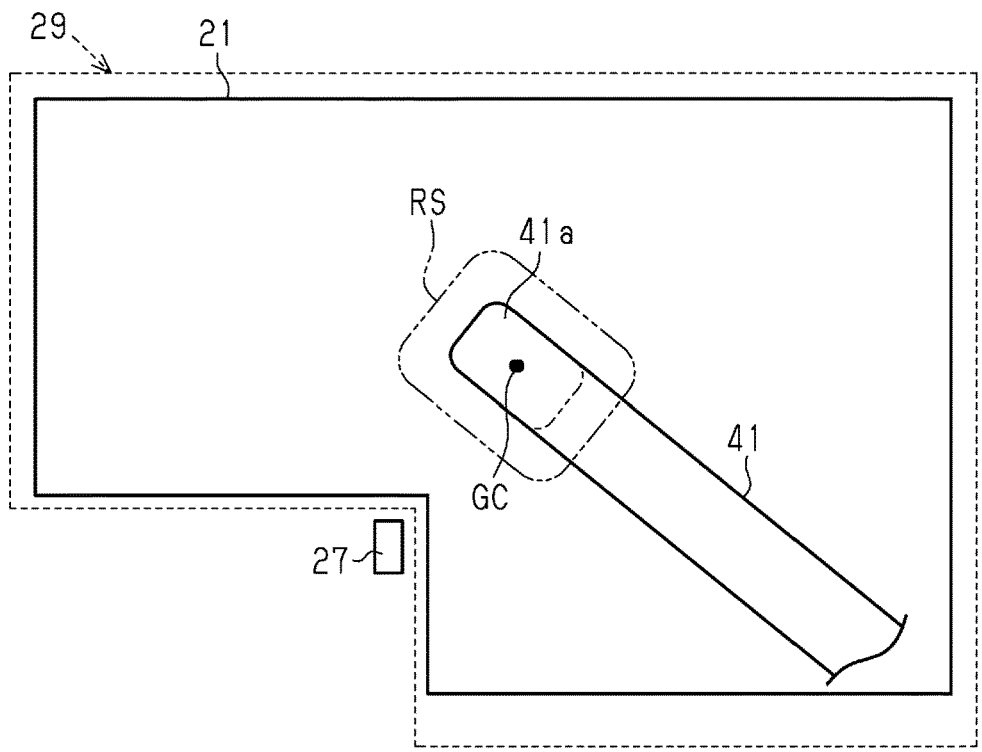
FIG. 8 is a schematic plan view showing an active region and a source pad of the semiconductor element.

FIGS. 7 and 8 are enlarged plan views showing part of the substrate 50. FIG. 7 shows the active region 29 with solid lines and the source pad 21 with double-dashed lines. FIG. 8 shows the active region 29 with broken lines and the source pad 21 with solid lines.

The inventors of the present inventor have conducted a study on where to connect the first wire 41 to the source pad 21 of the semiconductor element 20 to increase the active clamp capacity Eac of the semiconductor device 1. Further, the inventors of the present invention have found that the active clamp capacity Eac increases when the first wire 41 is connected to a connection position including the center of gravity position GC of the active region 29 in the semiconductor element 20. Accordingly, in the present embodiment, the first wire 41 is connected to the source pad 21 so as to be superimposed with the center of gravity position GC of the active region 29.

The center of gravity position GC of the active region 29 is obtained as described below.

As shown in FIG. 7, the active region 29 is first divided into two regions, namely, a first region RA1 and a second region RA2. Preferably, the first region RA1 and the second region RA2 are rectangular regions. Then, the center of gravity position GA1 of the first region RA1 and the center of gravity position GA2 of the second region RA2 are obtained. As shown in FIG. 7, the first region RA1 and the second region RA2 are rectangular. Thus, the center of gravity position GA1 of the first region RA1 is the intersection point of the diagonals of the first region RA1, and the center of gravity position GA2 of the second region RA2 is the intersection point of the diagonals of the second region RA2. Then, the area SA1 of the first region RA1 and the area SA2 of the second region RA2 are obtained. The center of gravity position GC of the active region 29 is obtained from the relationship of the distance DA1 between the center of gravity position GA1 and the center of gravity position GC of the active region 29 and the distance DA2 between the center of gravity position GA2 and the center of gravity position GC of the active region 29 in a line segment LA connecting the center of gravity position GA1 and the center of gravity position GA2 with the area SA1 of the first region RA1 and the area SA2 of the second region RA2. More specifically, the ratio of the distance DA2 to the distance DA1 (DA2/DA1) and the inverse proportion of the ratio of the area SA2 of the second region RA2 to the area SA1 of the first region RA1 (SA1/SA2) are equal (DA2/DA1=SA1/SA2). Accordingly, the center of gravity position GC of the active region 29 is obtained by obtaining at least one of the distances DA1 and DA2. Further, as shown in FIG. 7, the source pad 21 is arranged over the center of gravity position GC of the active region 29.

Region RX shown by the single-dashed lines in FIG. 7 indicates a tool head (hereinafter, referred to as the wedge RX) used when ultrasonic-bonding the first wire 41 to the source pad 21 with a wedge bonding device (not shown). The wedge bonding device moves the wedge RX to position the center of the wedge RX above the center of gravity position GC of the active region 29. The end of the first wire 41, which is passed through the wedge RX, is connected and superimposed with the center of gravity position GC of the active region 29, as shown in FIG. 8. More specifically, the region (wedge RX) where the first wire 41 contacts the source pad 21 includes the center of gravity position GC of the active region 29. In the present embodiment, the center position of the region (wedge RX) where the first wire 41 is connected to the source pad 21 coincides with the center of gravity position GC of the active region 29.

As shown in FIGS. 2 and 8, the first wire 41 includes a connection portion 41a that is connected to the source pad 21 and extended in a direction differing from the horizontal direction X and the vertical direction Y in a plan view of the semiconductor device 1. In the present embodiment, the connection portion 41a extends from the semiconductor element 20 toward the third island 13a.

In FIG. 8, region RS shown by the double-dashed lines surrounding the connection portion 41a of the first wire 41 is set to include a margin that takes into consideration differences in the diameter of the first wire 41 and differences in the positions where the first wire 41 is connected to the source pad 21 by the wedge bonding device. Thus, the connection portion 41a of the first wire 41 will always be located in region RS. For example, region RS may be set as an opening 89 that opens in a surface protection film 88 (refer to FIG. 9) from the source pad 21. Preferably, the opening 89 is set to widen region RS.

More specifically, in the first embodiment, as shown in FIG. 7, the active region 29 is substantially L-shaped and joins the first region RA1, which is a small quadrangle, and the second region RA2, which is a large quadrangle. The first wire 41, which serves as the connection member, and the source pad 21 are connected to each other at a position on the line segment LA, which connects the center of gravity position GA1 of the first region RA1 and the center of gravity position GA2 of the second region RA2.

Further, the semiconductor element 20 includes a transistor. The semiconductor device includes the second lead frame (external control terminal) 12, which ON/OFF-controls the transistor, and the third lead frame (external terminal) 13, which is connected to the first wire 41 serving as the connection member. As shown in FIG. 2, the second lead frame 12 is arranged at the side of the first region RA1, which is a small quadrangle, and the third lead frame 13 is arranged at the side of the second region RA2, which is a large quadrangle. In other words, the second lead frame 12 is located at a position closer to the first region RA1 than the second region RA2, and the third lead frame 13 is located at a position closer to the second region RA2 than the first region RA1.

Further, as shown in FIGS. 2 and 5, the semiconductor element 20 includes the gate pad (external control terminal) 22, which is connected to the second lead frame (external control terminal) 12. In a region surrounded by a line extending from one side of the small quadrangular first region RA1 (first side 29a) and a line extending from one side of the second region RA2 (fourth side 29d), the gate pad 22 is arranged in a quadrangular region that does not include a transistor.

As shown in FIG. 5, the source pad 21 is substantially L-shaped. The source pad 21 is formed over the small quadrangular first region RA1 and the large quadrangular second region RA2, which are included in the active region 29. The source pad 21 is configured so that the first side 29a, which is the farthest from the second region RA2 of the source pad 21, coincides with the position of the gate pad 22 in the horizontal direction X. In detail, the gate pad 22 includes a left side and a right side with respect to the horizontal direction X as viewed in FIG. 5, and the left side of the gate pad 22 extends to a position farther from the second region RA2 in the horizontal direction X than the right side of the gate pad 22. The first side 29a of the source pad 21 coincides with a position between the left side and the right side of the gate pad 22 in the horizontal direction X.

Further, the temperature sensor 27 is located between the gate pad 22 and the source pad 21.

Structure of MISFET

The structure of the MISFET 23a will now be described in detail with reference to FIGS. 9 to 11.

Figure 9:
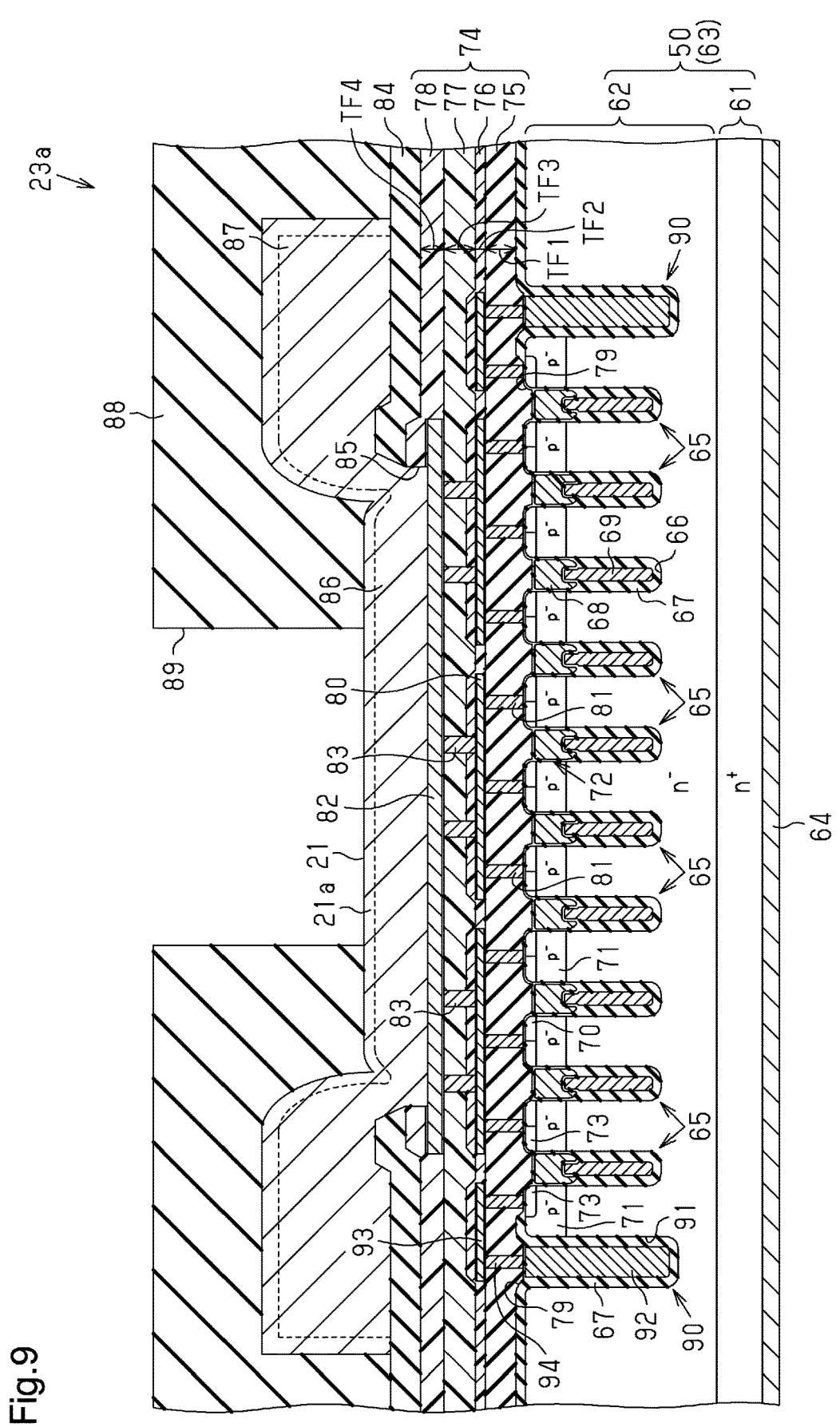
FIG. 9 is a schematic cross-sectional view showing the structure of a MISFET that forms part of the semiconductor element.

As shown in FIG. 9, the substrate 50, on which the MISFET 23a is formed, uses, for example, a silicon substrate. The substrate 50 includes an n+ type semiconductor substrate 61 and an n-type epitaxial layer 62 formed on the semiconductor substrate 61. The semiconductor substrate 61 and the epitaxial layer 62 form a drain region 63. The front surface of the substrate 50 is formed by the epitaxial layer 62, and the back layer of the substrate 50 is formed by the semiconductor substrate 61. The epitaxial layer 62 has a thickness of, for example, 9.5 µm.

The source pad 21 is formed on the front surface of the substrate 50, and a drain electrode 64 is formed on the back surface of the substrate 50. The trench gate structures 65 are formed in the front side of the active region 29 in the substrate 50. The trench gate structures 65 are each formed in the outermost part of the epitaxial layer 62 and include a trench 66, which is dug into the epitaxial layer 62, and a gate electrode 68 and embedded electrode 69, which are embedded in the trench 66 sandwiching a gate insulation film 67.

Figure 10:
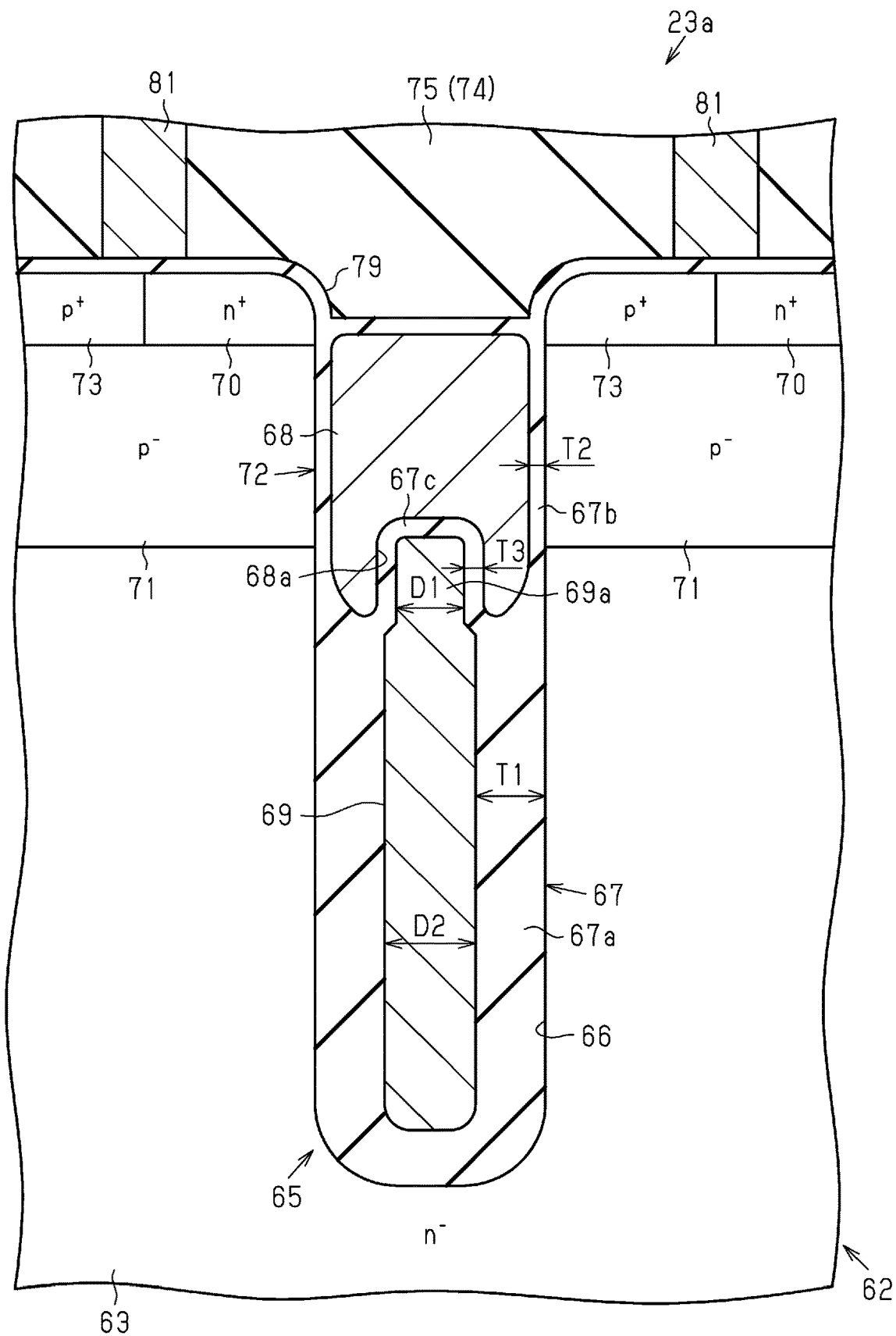
FIG. 10 is an enlarged view showing one trench-gate structure of FIG. 9 and its surrounding.

As shown in FIG. 10, the gate electrode 68 and the embedded electrode 69 are separated (insulated) in the depth direction of the trench 66 by the gate insulation film 67. The gate electrode 68 is located at the open side of the trench 66, and the embedded electrode 69 is located closer to the bottom of the trench 66 than the gate electrode 68. One example of the gate insulation film 67 is a silicon oxide film.

The gate insulation film 67 includes a thick film portion 67a, which is in contact with the embedded electrode 69, and a thin film portion 67b, which is in contact with the gate electrode 68. The thick film portion 67a of the gate insulation film 67 has one surface (surface closer to drain region 63) and an opposite surface that extend along the inner wall of the trench 66. Further, the thick film portion 67a has a stack structure in which a silicon oxide film having low density is formed on a silicon oxide film having high density. The thickness T1 of the thick film portion 67a of the gate insulation film 67 is greater than the thickness T2 of the thin film portion 67b (T2<T1). The thickness T1 of the thick film portion 67a is greater than the thickness T3 of a separating portion 67c that separates the gate electrode 68 and the embedded electrode 69 in the gate insulation film 67 (T3<T1). The thickness T3 of the separating portion 67c is greater than the thickness T2 of the thin film portion 67b (T2<T3<T1). The thickness T1 of the thick film portion 67a, the thickness T2 of the thin film portion 67b, and the thickness T3 of the separating portion 67c may be freely changed. For example, the thickness T2 of the thin film portion 67b may be equal to the thickness T3 of the separating portion 67c.

The gate electrode 68 is formed from, for example, polysilicon. The lower end of the gate electrode 68 includes a recess 68a that opens toward the embedded electrode 69. The upper end 69a of the embedded electrode 69 is accommodated in the recess 68a. In this manner, the upper end 69a of the embedded electrode 69 is opposed to the gate electrode 68 through the thin film portion 67b of the gate insulation film 67. The embedded electrode 69 is formed from, for example, polysilicon. In the present embodiment, the embedded electrode 69 is covered by the thick film portion 67a of the gate insulation film 67 and the separating portion 67c so as to float electrically with respect to an external device. The embedded electrode 69 may have the same potential as the source pad 21 (ground potential). In a cross-sectional view of the embedded electrode 69, the width D1 of the upper end 69a is less than the width D2 of the portion of the embedded electrode 69 at the lower side (toward back surface of substrate 50) of the upper end 69a.

FIGS. 9 and 10 show an example of the trench 66 formed to be substantially orthogonal to the front surface of the epitaxial layer 62. The trench 66 may be formed to be tapered in the depth direction of the trench 66 so that its opening gradually narrows toward the bottom of the trench 66 in a cross-sectional view. Further, FIGS. 9 and 10 show an example in which the bottom of the trench 66 has a flat portion that is parallel to the front surface of the epitaxial layer 62. However, the bottom of the trench 66 may be outwardly curved from the side surface of the trench 66.

An n+ type the source region 70, a p-type the body region 71, and the drain region 63 (epitaxial layer 62) are formed in order in the depth direction from the front surface side of the substrate 50 beside (at opposite sides) the trench gate structures 65. The source region 70, the body region 71, and the drain region 63 are formed to be in contact with the trench gate structures 65 and oppose the gate electrode 68 from the opposite side of the gate insulation film 67. Further, the drain region 63 is opposed to the embedded electrode 69 from the opposite side of the gate insulation film 67.

The body region 71 between adjacent ones of the trench gate structures 65 is shaped by one of the trench gate structures 65 and the other one of the trench gate structures 65. The source region 70 is exposed from the surface of the body region 71. The shape of the source region 70 in a plan view corresponds to the shape of a channel formation region 72, which becomes a current path, in a plan view. Underneath the source region 70, the body region 71, which forms the side surfaces of the trench gate structures 65, is the channel formation region 72. Channel formation in the channel formation region 72 is controlled by the trench gate structures 65 (the gate electrode 68).

Figure 11:
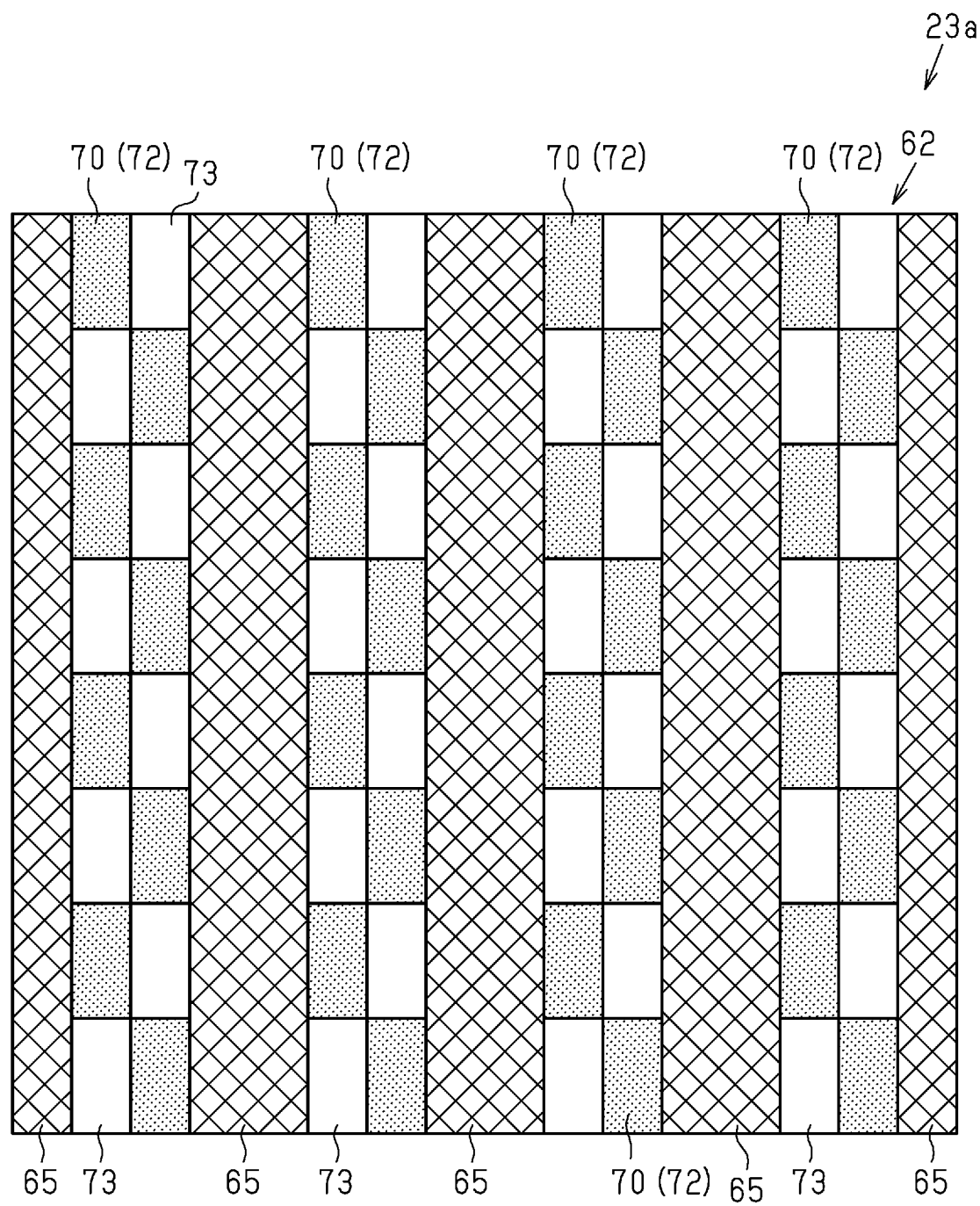
FIG. 11 is a schematic plan view showing an epitaxial layer of the MISFET.

FIG. 11 shows one example of the structure of the epitaxial layer 62 of the MISFET 23a in a plan view. As shown in FIG. 11, in the body region 71 (refer to FIG. 10) sandwiched between adjacent ones of the trench gate structures 65, the source region 70 is alternately formed at the side of one of the trench gate structures 65 and the side of the other one of the trench gate structures 65. Each source region 70 has the same area. In this manner, in the MISFET 23a of the present embodiment, the percentage of the area occupied by the channel formation region 72 per unit area is approximately 50%.

When regions between the trench gate structures 65 entirely include the channel formation region 72, the percentage of the area occupied by the channel formation region 72 per unit area is 100%. Further, the area of the channel formation region 72 is defined as the area of the region that becomes the current path in a plan view. More specifically, the area of the channel formation region 72 is defined as the opposing area of the source region 70 opposing the drain region 63 (the epitaxial layer 62) with the body region 71 located therebetween. The percentage of the area occupied by the channel formation region 72 per unit area is the percentage of the area of the channel formation region 72 occupying a predetermined region between the trench gate structures 65. The predetermined region is a region having a predetermined area obtained by multiplying the width between the trench gate structures 65 by any length taken in the longitudinal direction of the trench gate structures 65.

A p+ type body contact region 73 is formed between the trench gate structures 65 and exposed from the body region 71 at portions other than the source region 70. The body contact region 73 is formed in contact with the side surfaces of the trench gate structures 65 partially opposing the gate electrode 68 with the gate insulation film 67 located therebetween. In the present embodiment, the depth of the body contact region 73 is equal to the depth of the source region 70.

The depths of the body contact region 73 and the source region 70 can be freely changed. In one example, the depth of the body contact region 73 is greater than the depth of the source region 70. Further, the body contact region 73 can be omitted from the MISFET 23a. In this case, the body region 71 will be exposed from the surface of the epitaxial layer 62.

As shown in FIG. 9, a deep trench isolation (DTI) structure 90, which serves as an element isolation structure that partitions the region where the MISFET 23a is formed from other regions, is formed in the epitaxial layer 62. For example, the DTI structure 90 is formed to have a substantially closed shape in a plan view taken from a direction normal to the surface of the epitaxial layer 62 (hereinafter, simple referred to as "the plan view"). The DTI structure 90 includes a trench 91, which is formed by digging the epitaxial layer 62, and an insulator 92, which is embedded in the trench 91 sandwiching the gate insulation film 67. One example of the insulator 92 is polysilicon. The insulator 92 may be silicon oxide. The present embodiment illustrates an example in which the DTI structure 90 is formed as an element isolation structure. However, the element isolation structure may be of a pn connection-isolation type, that is, a diffusion-isolation type including a p-type diffusion region having a closed shape and partitioning the region where the MISFET 23a is formed.

An interlayer insulation film 74 is formed on the surface of the epitaxial layer 62. The interlayer insulation film 74 incudes at least one of a silicon oxide film and a silicon nitride film. The interlayer insulation film 74 has a stack structure in which a first interlayer insulation film 75, a second interlayer insulation film 76, a third interlayer insulation film 77, and a fourth interlayer insulation film 78 are stacked in order from the surface of the epitaxial layer 62. The first interlayer insulation film 75, the second interlayer insulation film 76, the third interlayer insulation film 77, and the fourth interlayer insulation film 78 are each formed by, for example, an insulator of silicon oxide, silicon nitride, or the like. The first interlayer insulation film 75, the second interlayer insulation film 76, the third interlayer insulation film 77, and the fourth interlayer insulation film 78 may each be formed from, for example, high density plasma-CVD-undoped silica glass (HDP-USG). The first interlayer insulation film 75 covers the surface of the epitaxial layer 62. The first interlayer insulation film 75 fills recesses 79 that are formed by the difference in height between the upper surface of the gate electrodes 68 and the surface of the epitaxial layer 62. The first interlayer insulation film 75 has a thickness TF1 of, for example, 13500 Å, the second interlayer insulation film 76 has a thickness TF2 of, for example, 8000 Å, the third interlayer insulation film 77 has a thickness TF3 of, for example, 13500 Å, and the fourth interlayer insulation film 78 has a thickness TF4 of, for example, 10000 Å.

A first source electrode 80 is formed as a first metal (first metal layer) on the first interlayer insulation film 75. The first source electrode 80 is an electrode film including, for example, one or more metal species selected from a group of aluminum (Al), copper (Cu), titanium (Ti), tungsten (W), and tantalum (Ta). The first source electrode 80 has a thickness of, for example, 4000 Å. The first source electrode 80 is electrically connected via a corresponding contact 81 to the source region 70 and the body contact region 73. The first source electrode 80 is covered by the second interlayer insulation film 76.

The body region 71 between the trench gate structure 65 and the DTI structure 90 includes the body contact region 73 but does not include the source region 70. Thus, the contact 81 on the body region 71 between the trench gate structure 65 and the DTI structure 90 is electrically connected to the body contact region 73. Wiring 93 is formed on the first interlayer insulation film 75 and electrically connected to the contact 81. The wiring 93 extends to cover the DTI structure 90. The wiring 93 is electrically connected to contacts 94. The contacts 94 are connected to the insulators 92. Although not shown in FIG. 9, the wiring 93 is connected to the first source electrode 80.

A second source electrode 82 is formed as a second metal (second metal layer) on the third interlayer insulation film 77. The second source electrode 82 is an electrode film including, for example, one or more metal species selected from a group of aluminum (Al), copper (Cu), titanium (Ti), tungsten (W), and tantalum (Ta). The second source electrode 82 has a thickness of, for example, 8000 Å. The second source electrode 82 is electrically connected via a corresponding contact 83 to the first source electrode 80. The peripheral portion of the second source electrode 82 is covered by the fourth interlayer insulation film 78.

A passivation film 84 is formed on the surface of the fourth interlayer insulation film 78. The passivation film 84 includes, for example, at least one of silicon nitride and silicon oxide. The passivation film 84 may be a laminated film including a silicon oxide film and a silicon nitride film formed on the silicon oxide film. The passivation film 84 of the present embodiment is formed by a silicon nitride film. the passivation film 84 has a thickness of, for example, 11000 Å.

The source pad 21 is arranged in an opening 85 that extends through the fourth interlayer insulation film 78 and the passivation film 84. The source pad 21 includes an inner portion 86, which contacts the second source electrode 82 in the opening 85, and an outer portion 87, which extends beyond the opening 85 and covers the passivation film 84. The inner portion 86 of the source pad 21 86 has a thickness of, for example, 42000 Å.

The surface protection film 88 is formed on the surface of the source pad 21. One example of the surface protection film 88 is a film including polyimide. The surface protection film 88 covers part of the inner portion 86 of the source pad 21 and part of the outer portion 87. The surface protection film 88 includes the opening 89 to connect the first wire 41 to the source pad 21.

Structure of Semiconductor Element Forming Control Circuitry

The structure of a control semiconductor element forming the over current detection circuit 24, the thermal shut down circuit 25, and the under voltage lock out circuit 26 in the control circuitry that controls the MISFET 23a of the semiconductor device 1 will now be described with reference to FIGS. 12 to 17. Examples of the control semiconductor element include a low-voltage complementary MOS (CMOS) FET, a MOS capacitor, a polysilicon resistor, a high-voltage P-channel MOSFET, a high-voltage N-channel MOSFET, and an NPN transistor. The control semiconductor elements are arranged on the substrate 50 in the same manner as the MISFET 23a. In the description hereafter, n-type impurities (n-type) will include impurities mainly composed of pentavalent elements (e.g., phosphorus (P), arsenic (As), etc.), and p-type impurities (p-type) will include impurities mainly composed of trivalent elements (e.g., boron (B), indium (In), gallium (Ga), etc.).

Figure 12:
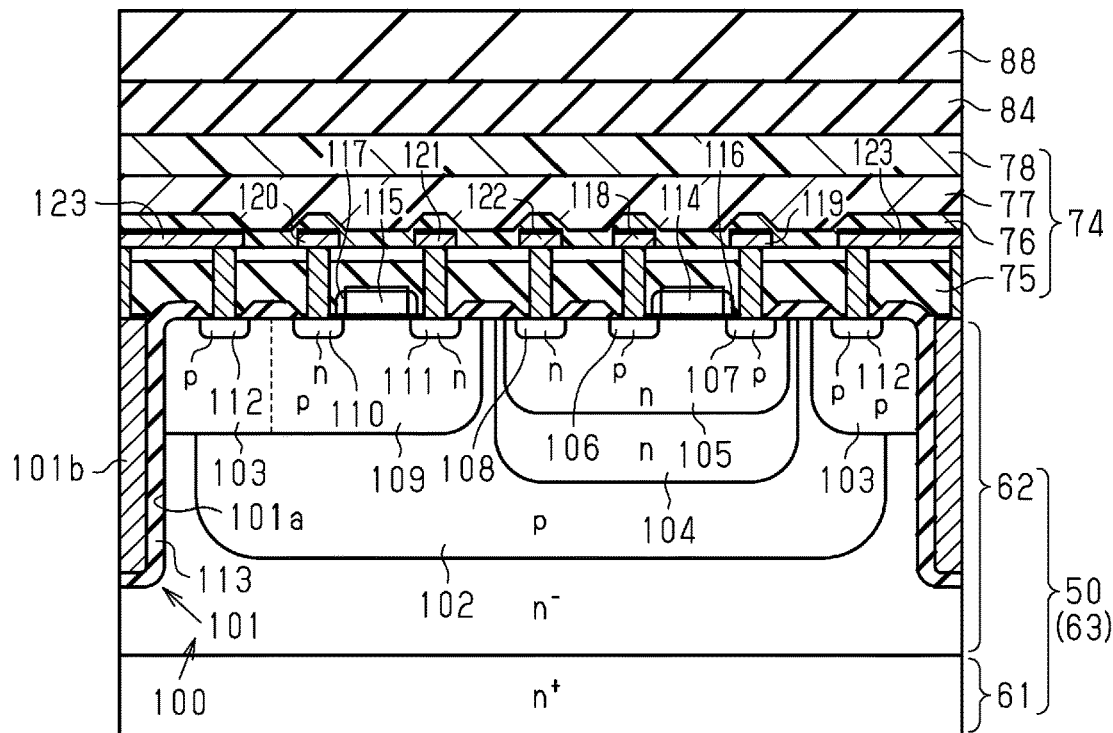
FIG. 12 is a schematic cross-sectional view showing the structure of a low-voltage CMOSFET that forms part of the semiconductor element.

FIG. 12 shows a low-voltage CMOSFET including a CMOS region 100 that forms a CMOS transistor. A DTI structure 101, which serves as an element isolation structure that partitions the CMOS region 100 from other regions, is formed in the epitaxial layer 62 of the substrate 50. The DTI structure 101 is formed to have a substantially closed shape in a plan view taken from a direction normal to the surface of the epitaxial layer 62 (hereinafter, simple referred to as "the plan view"). The DTI structure 101 includes an insulator 101b that is embedded in a trench 101a formed in the epitaxial layer 62. One example of the insulator 101b is polysilicon. The insulator 101b may be silicon oxide. The present embodiment illustrates an example in which the DTI structure 101 is formed as an element isolation structure. However, the element isolation structure may be of a pn connection-isolation type, that is, a diffusion-isolation type including a p-type diffusion region having a closed shape and partitioning the CMOS region 100.

A first P-well region 102, which is a p-type high-voltage well region, is formed in the CMOS region 100 spaced apart from the DTI structure 101. To space apart the DTI structure 101 and the first P-well region 102, a second P-well region 103, which is a p-type low-voltage well region, is formed in the outermost part of the epitaxial layer 62. The second P-well region 103 is formed to have a substantially closed shape next to the DTI structure 101. When the DTI structure 101 is formed in strips instead of having a substantially closed shaped, the second P-well region 103 is also formed in strips next to each DTI structure 101. The second P-well region 103 has a higher impurity concentration than the first P-well region 102.

Two n-type well regions, namely, a first N-well region 104 and a second N-well region 105, are formed in the outermost part of the epitaxial layer 62 in the first P-well region 102. The first N-well region 104 is formed to surround the second N-well region 105. The thickness of the first N-well region 104 is less than the thickness of the first P-well region 102. The thickness of the second N-well region 105 is less than the thickness of the first N-well region 104. The first N-well region 104 has a higher impurity concentration than the first P-well region 102. The second N-well region 105 has a higher impurity concentration than the first N-well region 104. In the description hereafter, thickness refers to length in a direction normal to the surface of the epitaxial layer 62.

A p-type source region 106, a p-type drain region 107, and an n-type contact region 108 are formed in the outermost part of the epitaxial layer 62 in the second N-well region 105. The source region 106, the drain region 107, and the contact region 108 are spaced apart from one another. The source region 106 is formed between the contact region 108 and the drain region 107. The source region 106, the drain region 107, and the contact region 108 each have a higher impurity concentration than the second N-well region 105.

A third P-well region 109, which is a p-type low-voltage well region, is formed in the outermost part of the epitaxial layer 62 in the CMOS region 100 spaced apart from the first N-well region 104. The third P-well region 109 is formed integrally with the second P-well region 103. An n-type source region 110, an n-type drain region 111, and a p-type contact region 112 are formed in the outermost part of the third P-well region 109. The source region 110, the drain region 111, and the contact region 112 are spaced apart from one another. The contact region 112 is formed near the DTI structure 101, which is adjacent to the third P-well region 109, in the third P-well region 109 (second P-well region 103). In other words, the contact region 112 is formed in the third P-well region 109 at a region where the second P-well region 103 is integrally formed. Thus, the contact region 112 also serves as a contact region of the second P-well region 103. The source region 110 is formed between the drain region 111 and the contact region 112.

An insulation film 113 is formed in the CMOS region 100 on the surface of the epitaxial layer 62 and between the trench 101a and the insulator 101b of the DTI structure 101. One example of the insulation film 113 is a silicon oxide film. A first gate electrode 114, which is opposed to the second N-well region 105, and a second gate electrode 115, which is opposed to the third P-well region 109, are formed on the insulation film 113. The gate electrodes 114 and 115 are each formed from, for example, polysilicon to which an impurity is added. The two side surfaces of the gate electrodes 114 and 115 are covered by, for example, side walls 116 and 117 including an insulative material such as silicon oxide or silicon nitride.

In the same manner as the MISFET 23a, the interlayer insulation film 74 and the passivation film 84 are stacked in this order on the epitaxial layer 62 in the CMOS region 100. A first source electrode 118, a first drain electrode 119, a first gate electrode (not shown), a second source electrode 120, a second drain electrode 121, a second gate electrode (not shown), a back gate electrode 122, and a ground electrode 123 are formed as a first metal on the first interlayer insulation film 75. These electrodes are electrode films including, for example, one or more metal species selected from a group of aluminum, copper, titanium, tungsten, and tantalum.

The first source electrode 118 is electrically connected to the source region 106 of the second N-well region 105 by a contact, the first drain electrode 119 is electrically connected to the drain region 107 of the second N-well region 105 by a contact, and the back gate electrode 122 is electrically connected to the contact region 108 of the second N-well region 105 by a contact. A p-type MOSFET is formed in this manner.

The second source electrode 120 is electrically connected to the source region 110 of the third P-well region 109 by a contact, and the second drain electrode 121 is electrically connected to the drain region 111 of the third P-well region 109 by a contact. An n-type MOSFET is formed in this manner.

The ground electrode 123 is electrically connected to the contact region 112 of the second P-well region 103 by a contact. The ground electrode 123 is electrically connected to the insulator 101b of the DTI structure 101 by a contact. Further, the ground electrode 123, which is electrically connected to the contact region 112 of the third P-well region 109, becomes the back gate of the n-type MOSFET formed on the third P-well region 109. Thus, the DTI structure 101, the third P-well region 109, and the first P-well region 102 have ground potential.

A third source electrode, a third drain electrode, a third gate electrode, a fourth source electrode, and a fourth gate electrode (none shown) are formed as a second metal on the third interlayer insulation film 77. The third source electrode is electrically connected to the first source electrode 118, the third drain electrode is electrically connected to the first drain electrode 119 and the second drain electrode 121, and the third gate electrode is electrically connected to the first gate electrode 114. Further, the fourth source electrode is electrically connected to the second source electrode 120, and the fourth gate electrode is connected to the second gate electrode. In this manner, the third drain electrode electrically connects the first drain electrode 119 and the second drain electrode 121 to form a CMOS transistor.

Figure 13:
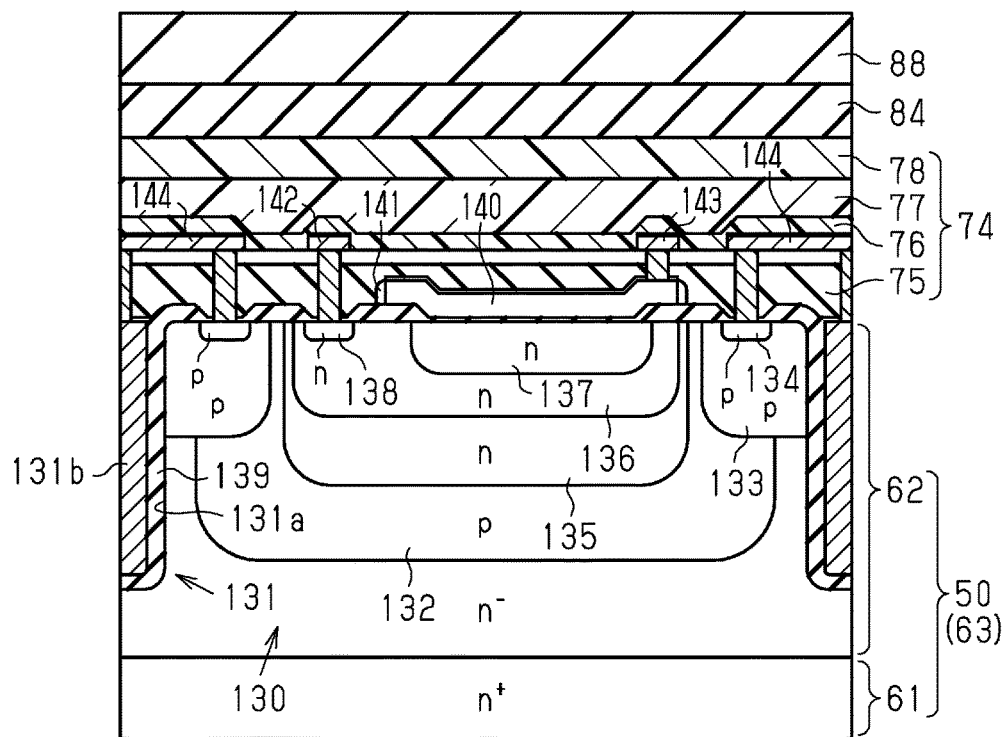
FIG. 13 is a schematic cross-sectional view showing the structure of a MOS capacitor that forms part of the semiconductor element.

FIG. 13 shows a MOS capacitor including a capacitor region 130 that forms a capacitor. A DTI structure 131, which serves as an element isolation structure that partitions the capacitor region 130 from other regions, is formed in the epitaxial layer 62 of the substrate 50. The DTI structure 131 has the same structure as the DTI structure 101 of the low-voltage CMOSFET (refer to FIG. 12). In the structure, an insulator 131b is embedded in a trench 131a. One example of the insulator 131b is polysilicon. The insulator 131b may be silicon oxide. The present embodiment illustrates an example in which the DTI structure 131 is formed as an element isolation structure. However, the element isolation structure may be of a pn connection-isolation type including a p-type diffusion region having a closed shape and partitioning the capacitor region 130.

The capacitor region 130 includes a first P-well region 132, which is p-type high-voltage well region, and a second P-well region 133, which is a p-type low-voltage well region. The first P-well region 132 is spaced apart from the DTI structure 131. To space apart the DTI structure 131 and the first P-well region 132, the second P-well region 133 is formed across the first P-well region 132 and adjacent to the DTI structure 131. The thickness of the second P-well region 133 is less than the thickness of the first P-well region 132. The second P-well region 133 has a higher impurity concentration than the first P-well region 132. A p-type contact region 134 is formed in the outermost part of the second P-well region 133.

Three n-type well regions, namely, a first N-well region 135, a second N-well region 136, and a third N-well region 137, are formed in the outermost part of the first P-well region 132 in the epitaxial layer 62. The first N-well region 135 is formed to surround the second N-well region 136. The second N-well region 136 is formed to surround the third N-well region 137. The thickness of the first N-well region 135 is less than the thickness of the first P-well region 132. The thickness of the second N-well region 136 is less than the thickness of the first N-well region 135. The thickness of the third N-well region 137 is less than the thickness of the second N-well region 136. The first N-well region 135 has a higher impurity concentration than the first P-well region 132. The second N-well region 136 has a higher impurity concentration than the first N-well region 135. The third N-well region 137 has a higher impurity concentration than the second N-well region 136. An n-type contact region 138 is formed in the outermost part of the second N-well region 136 outside the third N-well region 137. The contact region 138 has a higher impurity concentration than the second N-well region 136.

An insulation film 139 is formed in the capacitor region 130 on the surface of the epitaxial layer 62 and between the trench 131a and the insulator 131b of the DTI structure 131. One example of the insulation film 139 is a silicon oxide film. A gate electrode 140 is formed on the insulation film 139. The gate electrode 140 entirely covers the third N-well region 137 and partially covers the second N-well region 136. The gate electrode 140 is formed from, for example, polysilicon to which an impurity is added. The two side surfaces of the gate electrodes 140 are covered by, for example, a side wall 141 including an insulative material such as silicon oxide or silicon nitride.

In the same manner as the MISFET 23a, the interlayer insulation film 74 and the passivation film 84 are stacked in this order on the epitaxial layer 62 in the capacitor region 130. A first electrode 142, a first gate electrode 143, and a ground electrode 144 are formed as a first metal on the first interlayer insulation film 75 These electrodes are electrode films including, for example, one or more metal species selected from a group of aluminum, copper, titanium, tungsten, and tantalum.

The first electrode 142 is electrically connected to the contact region 138 of the second N-well region 136 by a contact, and the first gate electrode 143 is electrically connected to the gate electrode 140 by a contact. The ground electrode 144 is electrically connected to the contact region 134 of the second P-well region 133 by a contact. The ground electrode 144 is electrically connected to the insulator 131b of the DTI structure 131 by a contact. Thus, the DTI structure 131 and the second P-well region 133 have ground potential.

A second electrode and a second gate electrode (none shown) are formed as a second metal on the third interlayer insulation film 77. The second electrode is electrically connected to the first electrode 142, and the second gate electrode is electrically connected to the first gate electrode 143.

Figure 14:
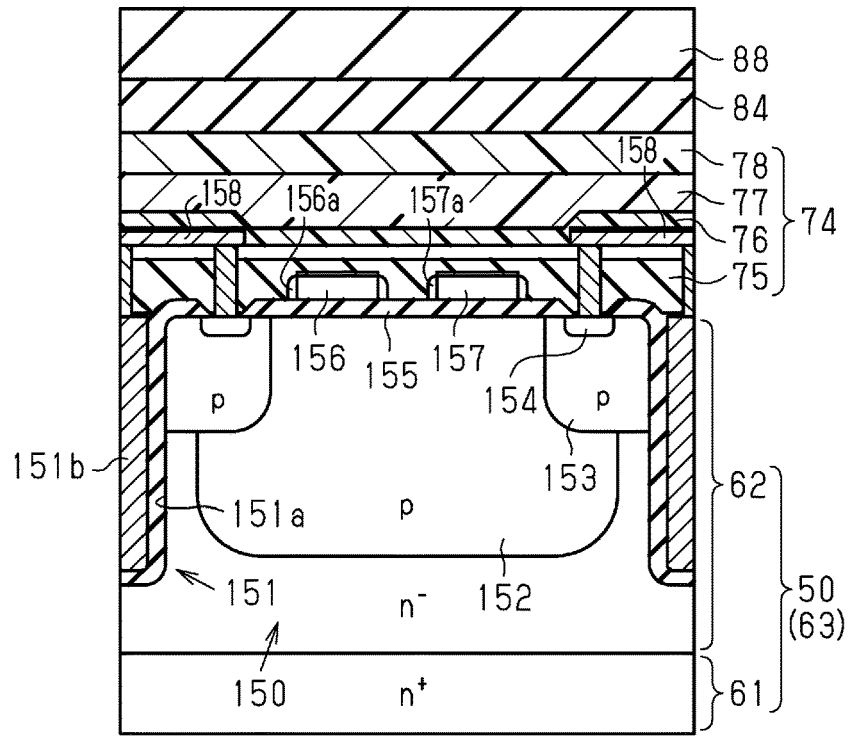
FIG. 14 is a schematic cross-sectional view showing the structure of a polysilicon resistor that forms part of the semiconductor element.

FIG. 14 shows a polysilicon resistor including a resistor region 150 that forms a resistor. A DTI structure 151, which serves as an element isolation structure that partitions the resistor region 150 from other regions, is formed in the epitaxial layer 62 of the substrate 50. The DTI structure 151 has the same structure as the DTI structure 101 of the low-voltage CMOSFET (refer to FIG. 12). In the structure, an insulator 151b is embedded in a trench 151a. One example of the insulator 151b is polysilicon. The insulator 151b may be silicon oxide. The present embodiment illustrates an example in which the DTI structure 151 is formed as an element isolation structure. However, the element isolation structure may be of a pn connection-isolation type including a p-type diffusion region having a closed shape and partitioning the resistor region 150.

The resistor region 150 includes a first P-well region 152, which is a p-type high-voltage well region, and a second P-well region 153, which is a p-type low-voltage well region. The first P-well region 152 is spaced apart from the DTI structure 151. To space apart the DTI structure 151 and the first P-well region 152, the second P-well region 153 is formed across the first P-well region 152 and adjacent to the DTI structure 151. The thickness of the second P-well region 153 is less than the thickness of the first P-well region 152. The second P-well region 153 has a higher impurity concentration than the first P-well region 152. A p-type contact region 154 is formed in the outermost part of the second P-well region 153.

An insulation film 155 is formed in the resistor region 150 on the surface of the epitaxial layer 62 and between the trench 151a and the insulator 151b of the DTI structure 151. One example of the insulation film 155 is a silicon oxide film. A first polysilicon resistor 156 and a second polysilicon resistor 157, which are spaced apart from each other, are formed on the insulation film 155. The first polysilicon resistor 156 and the second polysilicon resistor 157 are opposed to the first P-well region 152. The two side surfaces of the first polysilicon resistor 156 are covered by, for example, a side wall 156a including an insulative material such as silicon oxide or silicon nitride, and the two side surfaces of the second polysilicon resistor 157 are covered by the side wall 157a in the same manner as the first polysilicon resistor 156. In the present embodiment, the first polysilicon resistor 156 has high resistance, that is, the concentration of the impurity added to polysilicon is low, and the second polysilicon resistor 157 has low resistance, that is, the concentration of the impurity added to polysilicon is high. The type and number of the polysilicon resistors formed in the resistor region 150 may be freely changed. For example, one of the first polysilicon resistor 156 and the second polysilicon resistor 157 may be omitted.

In the same manner as the MISFET 23a, the interlayer insulation film 74 and the passivation film 84 are stacked in this order on the epitaxial layer 62 in the resistor region 150. A ground electrode 158 is formed as a first metal on the first interlayer insulation film 75. A ground electrode is an electrode film including, for example, one or more metal species selected from a group of aluminum, copper, titanium, tungsten, and tantalum. The ground electrode 158 is electrically connected to the insulator 151b of the DTI structure 151 and the contact region 154 by contacts. Thus, the DTI structure 151, the second P-well region 153, and the first P-well region 152 have ground potential.

Figure 15:
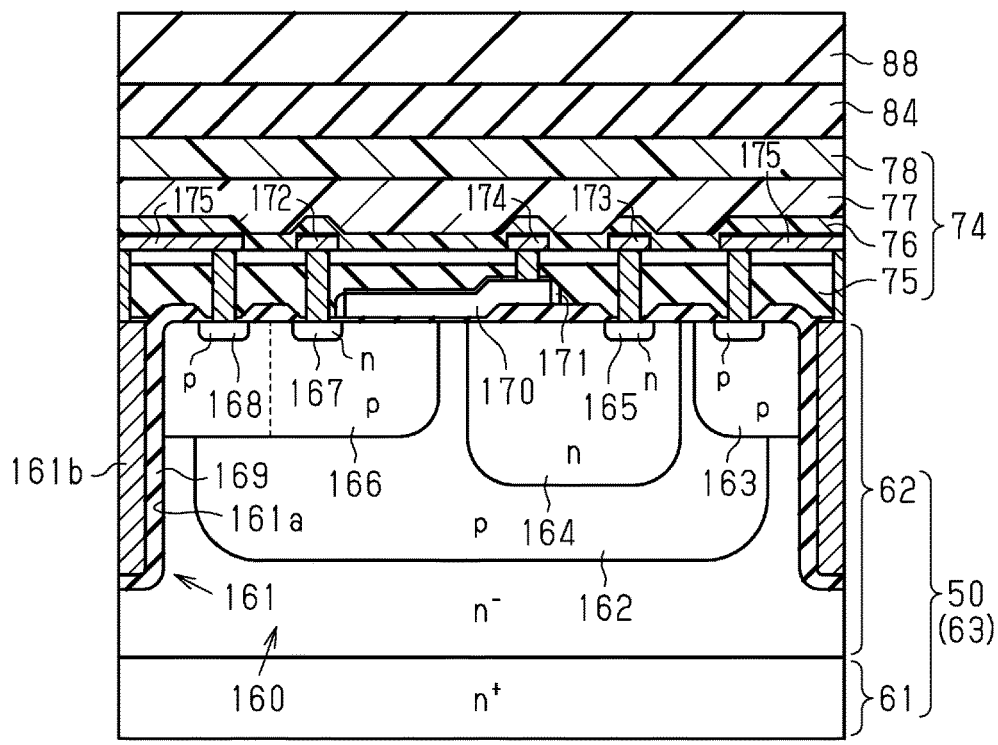
FIG. 15 is a schematic cross-sectional view showing the structure of a high-voltage N-channel MOSFET that forms part of the semiconductor element.

FIG. 15 shows a high-voltage N-channel including an NMOS region 160 that forms an N-channel MOSFET. A DTI structure 161, which serves as an element isolation structure that partitions the NMOS region 160 from other regions, is formed in the epitaxial layer 62 of the substrate 50. The DTI structure 161 has the same structure as the DTI structure 101 of the low-voltage CMOSFET (refer to FIG. 12). In the structure, an insulator 161b is embedded in a trench 161a. One example of the insulator 161b is polysilicon. The insulator 161b may be silicon oxide. The present embodiment illustrates an example in which the DTI structure 161 is formed as an element isolation structure. However, the element isolation structure may be of a pn connection-isolation type including a p-type diffusion region having a closed shape and partitioning the NMOS region 160.

A first P-well region 162, which is a p-type low-voltage well region, is formed in the NMOS region 160 spaced apart from the DTI structure 161. To space apart the DTI structure 161 and the first P-well region 162, a second P-well region 163, which is a p-type low-voltage well region, is formed in the outermost part of the epitaxial layer 62. The second P-well region 163 is formed to have a substantially closed shape next to the DTI structure 161. When the DTI structure 161 is formed in strips instead of having a substantially closed shaped, the second P-well region 163 is also formed in strips next to each DTI structure 161. The second P-well region 163 has a higher impurity concentration than the first P-well region 162.

The N-well region 164, which is an n-type well region, is formed in the outermost part of the epitaxial layer 62 in the NMOS region 160. The N-well region 164 is formed in the first P-well region 162. The thickness of the N-well region 164 is less than the thickness of the first P-well region 162. The N-well region 164 has a higher impurity concentration than the first P-well region 162. An n-type drain region 165 is formed in the outermost part of the N-well region 164. The drain region 165 has a higher impurity concentration than the N-well region 164.

A third P-well region 166, which is a p-type low-voltage well region, is formed in the outermost part of the epitaxial layer 62 in the NMOS region 160. The third P-well region 166 is spaced part from the N-well region 164. The third P-well region 166 is formed integrally with the second P-well region 163. The thickness of the third P-well region 166 is less than the thickness of the first P-well region 162 and the thickness of the N-well region 164. An n-type source region 167 and a p-type contact region 168 are formed in the outermost part of the third P-well region 166. The source region 167 and the contact region 168 are spaced apart from each other. The contact region 168 is formed in the third P-well region 166 at the region where the second P-well region 163 is integrally formed. Thus, the second P-well region 163 also serves as a contact region.

An insulation film 169 is formed in the NMOS region 160 on the surface of the epitaxial layer 62 and between the trench 161a and the insulator 161b of the DTI structure 161. One example of the insulation film 169 is a silicon oxide film. A gate electrode 170 is formed on the insulation film 169 opposed to and extended across the third P-well region 166, the first P-well region 162, and the N-well region 164. the gate electrode 170 is formed from, for example, polysilicon to which an impurity is added. The two side surfaces of the gate electrode 170 are covered by, for example, a side wall 171 including an insulative material such as silicon oxide or silicon nitride.

In the same manner as the MISFET 23a, the interlayer insulation film 74 and the passivation film 84 are stacked in this order on the epitaxial layer 62 in the NMOS region 160. A first source electrode 172, a first drain electrode 173, a first gate electrode 174, and a ground electrode 175 are formed as a first metal on the first interlayer insulation film 75. These electrodes are electrode films including, for example, one or more metal species selected from a group of aluminum, copper, titanium, tungsten, and tantalum.

The first source electrode 172 is electrically connected to the source region 167, the first drain electrode 173 is electrically connected to the drain region 165, and the first gate electrode 174 is electrically connected to the gate electrode 170. Further, the ground electrode 175 is electrically connected to the contact region 168 of the second P-well region 163 and the insulator 161b of the DTI structure 161 by contacts. Thus, the DTI structure 161, the second P-well region 163, and the first P-well region 162 have ground potential.

A second source electrode, a second drain electrode, and a second gate electrode (none shown) are formed as a second metal on the third interlayer insulation film 77. The second source electrode is electrically connected to the first source electrode 172, the second drain electrode is electrically connected to the first drain electrode 173, and the second gate electrode is electrically connected to the first gate electrode 174. These electrodes are formed from, for example, the same material as the electrodes forming the first metal (i.e., first source electrode 172).

Figure 16:
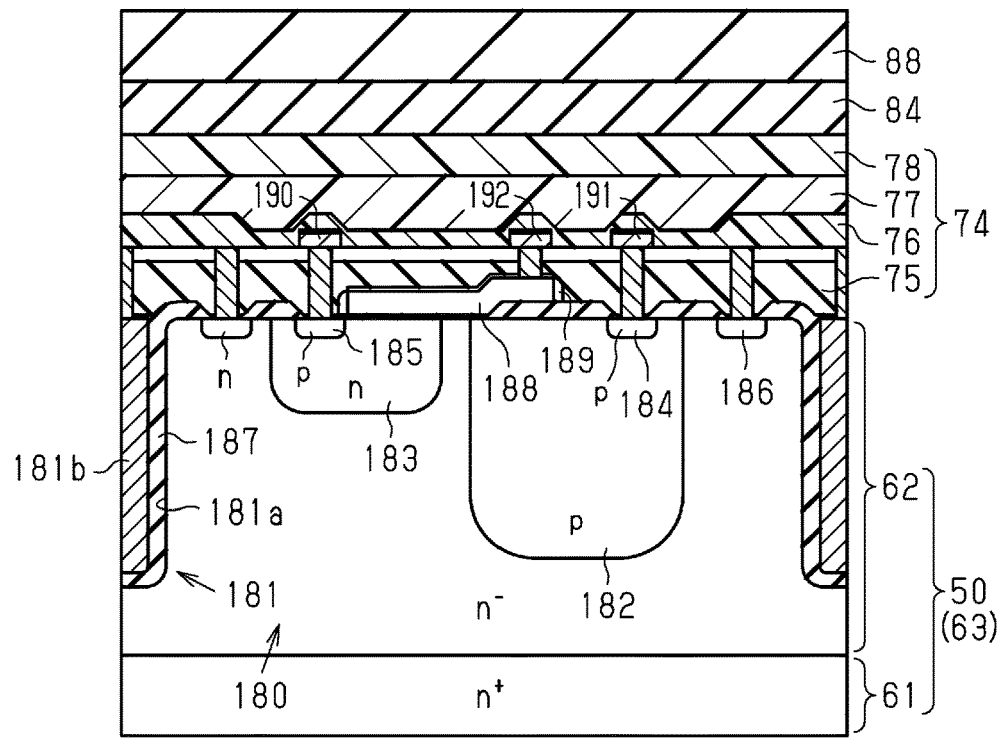
FIG. 16 is a schematic cross-sectional view showing the structure of a high-voltage P-channel MOSFET that forms part of the semiconductor element.

FIG. 16 shows a high-voltage P-channel MOSFET including a PMOS region 180 that forms a P-channel MOSFET. A DTI structure 181, which serves as an element isolation structure that partitions the PMOS region 180 from other regions, is formed in the epitaxial layer 62 of the substrate 50. The DTI structure 181 has the same structure as the DTI structure 101 of the low-voltage CMOSFET (refer to FIG. 12). In the structure, an insulator 181b is embedded in a trench 181a. One example of the insulator 181b is polysilicon. The insulator 181b may be silicon oxide. The present embodiment illustrates an example in which the DTI structure 181 is formed as an element isolation structure. However, the element isolation structure may be of a pn connection-isolation type including a p-type diffusion region having a closed shape and partitioning the PMOS region 180.

A P-well region 182, which is a p-type high-voltage well region, and an N-well region 183, which is an n-type well region, is formed in the outermost part of the epitaxial layer 62 in the PMOS region 180. The P-well region 182 and the N-well region 183 are spaced apart from the DTI structure 181. The P-well region 182 and the N-well region 183 are spaced apart from each other. The thickness of the N-well region 183 is less than the thickness of the first P-well region 182. A p-type drain region 184 is formed in the outermost part of the P-well region 182. A p-type source region 185 is formed in the outermost part of the N-well region 183.

An n-type contact region 186 is formed in the outermost part of the epitaxial layer 62 in the PMOS region 180. The contact region 186, which has a substantially closed shape, is formed between the P-well region 182 and the DTI structure 181 and spaced apart from the P-well region 182 and the DTI structure 181. Further, the contact region 186 is formed between the N-well region 183 and the DTI structure 181 and spaced apart from the N-well region 183 and the DTI structure 181.

An insulation film 187 is formed in the PMOS region 180 on the surface of the epitaxial layer 62 and between the trench 181a and the insulator 181b of the DTI structure 181. One example of the insulation film 187 is a silicon oxide film. Agate electrode 188 is formed on the insulation film 187 opposed to and extended across the N-well region 183, the epitaxial layer 62, and the P-well region 182. The gate electrode 188 is formed from, for example, polysilicon to which an impurity is added. The two side surfaces of the gate electrode 188 are covered by, for example, a side wall 189 including an insulative material such as silicon oxide or silicon nitride.

In the same manner as the MISFET 23a, the interlayer insulation film 74 and the passivation film 84 are stacked in this order on the epitaxial layer 62 in the PMOS region 180. A first source electrode 190, a first drain electrode 191, and a first gate electrode 192 are formed as a first metal on the first interlayer insulation film 75. These electrodes are electrode films including, for example, one or more metal species selected from a group of aluminum, copper, titanium, tungsten, and tantalum.

The first source electrode 190 is electrically connected to the source region 185 by a contact, the first drain electrode 191 is electrically connected to the drain region 184 by a contact, and the first gate electrode 192 is electrically connected to the gate electrode 188 by a contact.

A second source electrode, a second drain electrode, and a second gate electrode (none shown) are formed as a second metal on the third interlayer insulation film 77. The second source electrode is electrically connected to the first source electrode 190, the second drain electrode is electrically connected to the first drain electrode 191, and the second gate electrode is electrically connected to the first gate electrode 192. These electrodes are formed from, for example, the same material as the electrodes forming the first metal (i.e., first source electrode 190).

Figure 17:
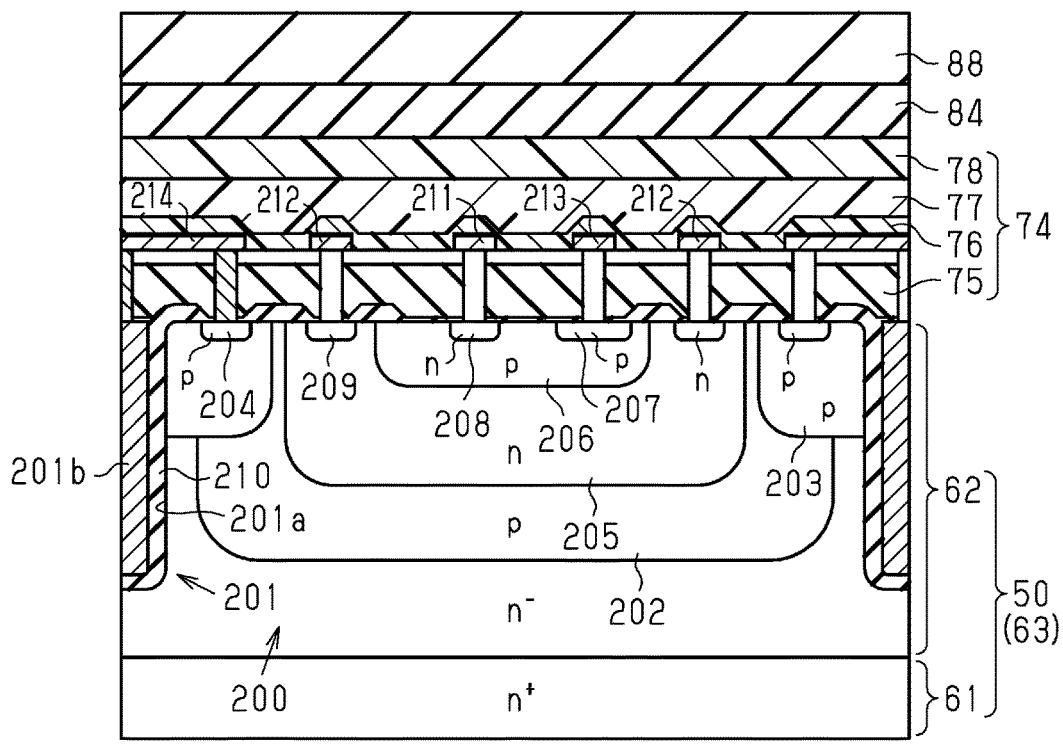
FIG. 17 is a schematic cross-sectional view showing the structure of an NPN capacitor that forms part of the semiconductor element.

FIG. 17 shows an NPN transistor including a transistor region 200 that forms a bipolar transistor. A DTI structure 201, which serves as an element isolation structure that partitions the transistor region 200 from other regions, is formed in the epitaxial layer 62 of the substrate 50. The DTI structure 201 has the same structure as the DTI structure 101 of the low-voltage CMOSFET (refer to FIG. 12). In the structure, an insulator 201b is embedded in a trench 201a. One example of the insulator 201b is polysilicon. The insulator 201b may be silicon oxide. The present embodiment illustrates an example in which the DTI structure 201 is formed as an element isolation structure. However, the element isolation structure may be of a pn connection-isolation type including a p-type diffusion region having a closed shape and partitioning the transistor region 200.

A first P-well region 202, which is a p-type low-voltage well region, is formed in the NMOS region 200 spaced apart from the DTI structure 201. To space apart the DTI structure 201 and the first P-well region 202, a second P-well region 203, which is a p-type low-voltage well region, is formed in the outermost part of the epitaxial layer 62. The second P-well region 203 is formed to have a substantially closed shape next to the DTI structure 201. When the DTI structure 201 is formed in strips instead of having a substantially closed shaped, the second P-well region 203 is also formed in strips next to each DTI structure 201. The second P-well region 203 has a higher impurity concentration than the first P-well region 202. A p-type contact region 204, which has a closed shape, is formed in the outermost part of the second P-well region 203. The contact region 204 has a higher impurity concentration than the second P-well region 203.

An N-well region 205, which is an n-type well region, is formed in the outermost part of the epitaxial layer 62 in the NMOS region 200. The N-well region 205 is formed in the first P-well region 202. The thickness of the N-well region 205 is less than the thickness of the first P-well region 202. The N-well region 205 has a higher impurity concentration than the first P-well region 202.

A p-type base region 206 is formed in the outermost part of the epitaxial layer 62 in the NMOS region 205. The N-well region 205 is formed to surround the base region 206. The thickness of the base region 206 is less than the thickness of the N-well region 205. A p-type base contact region 207 and an n-type emitter region 208 are formed in the outermost part of the base region 206. The base contact region 207 and the emitter region 208 are spaced apart from each other. The base contact region 207 and the emitter region 208 each have a higher impurity concentration than the N-well region 205. An n-type collector region 209 having a substantially closed shape is formed in the N-well region 205 outside the base region 206. The collector region 209 has a higher impurity concentration than the N-well region 205.

An insulation film 210 is formed in the transistor region 200 on the surface of the epitaxial layer 62 and between the trench 201a and the insulator 201b of the DTI structure 201. One example of the insulation film 210 is a silicon oxide film.

In the same manner as the MISFET 23a, the interlayer insulation film 74 and the passivation film 84 are stacked in this order on the epitaxial layer 62 in the transistor region 200. A first emitter electrode 211, a first collector electrode 212, a first base electrode 213, and a ground electrode 214 are formed as a first metal on the first interlayer insulation film 75. These electrodes are electrode films including, for example, one or more metal species selected from a group of aluminum, copper, titanium, tungsten, and tantalum.

The first emitter electrode 211 is electrically connected to the emitter region 208 by a contact, the first collector electrode 212 is electrically connected to the collector region 209 by a contact, and the first base electrode 213 is electrically connected to the base contact region 207 by a contact. The ground electrode 214 is electrically connected to the contact region 204 of the second P-well region 203 by a contact. The ground electrode 214 is electrically connected to the insulator 201b of the DTI structure 201 by contacts. Thus, the DTI structure 201, the second P-well region 203, and the first P-well region 202 have ground potential.

A second emitter electrode, a second collector electrode, and a second base electrode (none shown) are formed as a second metal on the third interlayer insulation film 77. The second emitter electrode is electrically connected to the first emitter electrode 211, the second collector electrode is electrically connected to the first collector electrode 212, and the second base electrode is electrically connected to the first base electrode 213. These electrodes are formed from, for example, the same material as the electrodes forming the first metal (i.e., first emitter electrode 211).

Method for Manufacturing Semiconductor Device

A method for manufacturing the semiconductor device 1 will now be described with reference to FIGS. 18 to 19F.

Figure 18:
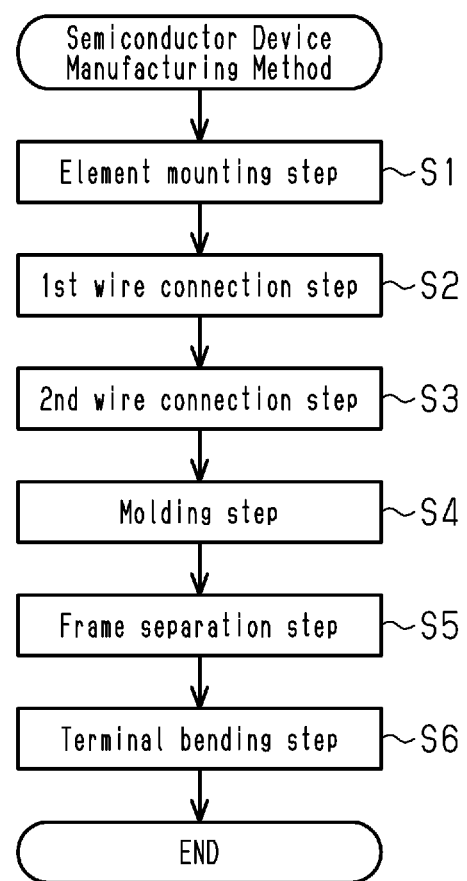
FIG. 18 is a flowchart illustrating a method for manufacturing the semiconductor device.

As shown in FIG. 18, the method for manufacturing the semiconductor device 1 includes an element mounting step (step S1), a first wire connection step (step S2), a second wire connection step (step S3), a molding step (step S4), a frame separation step (step S5), and a terminal bending step (step S6).

Figure 19A:
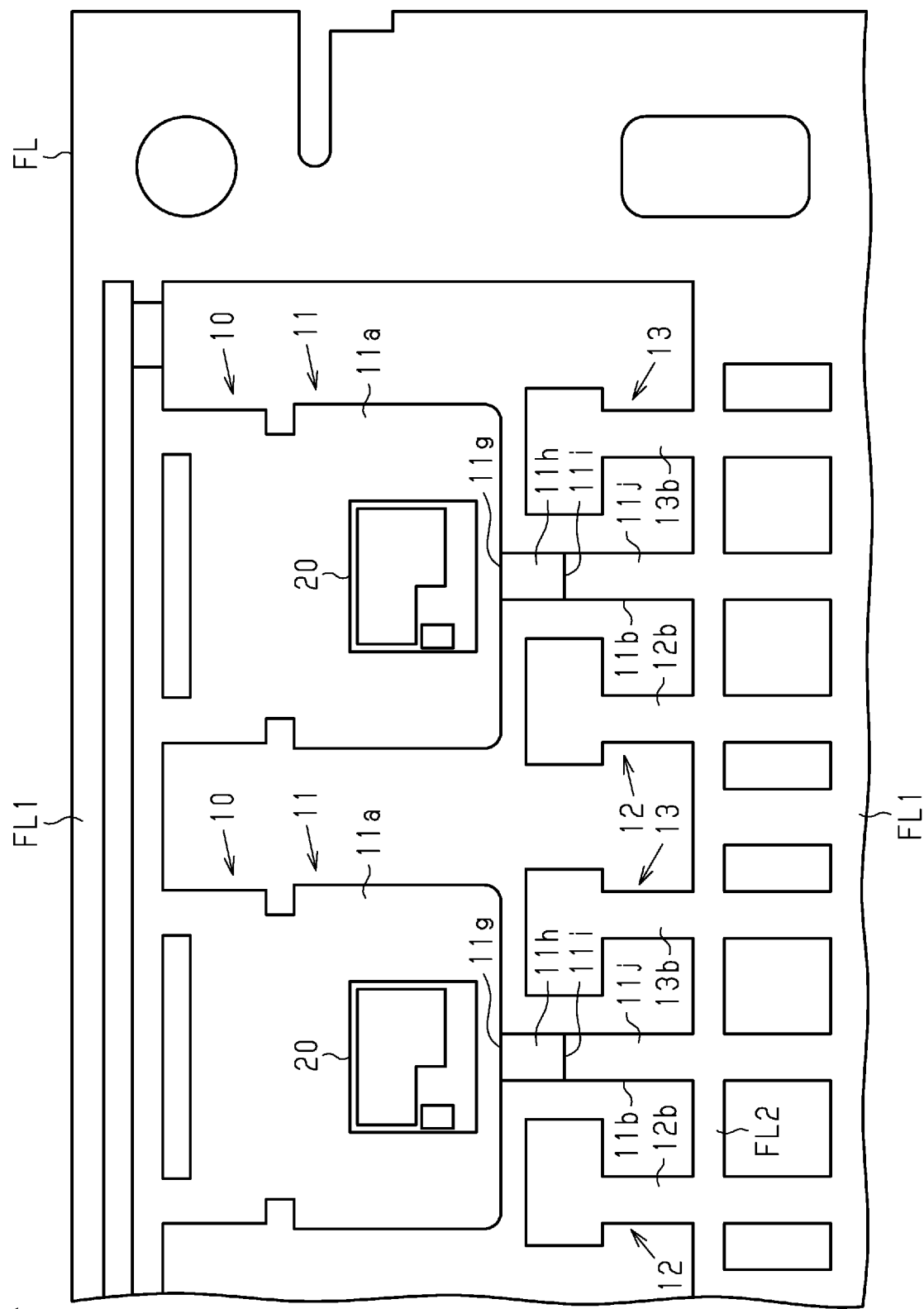
FIG. 19A is a diagram showing part of a manufacturing process of the semiconductor device.

In the element mounting step illustrated in FIG. 19A, a frame FL including the lead frame 10 is first prepared. The frame FL is formed by coupling each of the first lead frame 11, the second lead frame 12, and the third lead frame 13 to an outer frame portion FL1. Further, the first terminal 11b of the first lead frame 11 is coupled by a coupling portion FL2 (diver) to each of the second terminal 12b of the second lead frame 12 and the third terminal 13b of the third lead frame 13. In the frame FL, the first terminal 11b is in a state in which the first bent portion 1g, the inclined portion 11h, the second bent portion 11i, and the distal end portion 11j have already been formed. Further, in the frame FL, the second terminal 12b and the third terminal 13b are arranged so as to be arranged at the same position as the distal end portion 11j of the first terminal 11b. The frame FL undergoes nickel plating in advance.

Then, solder SD (not shown in FIG. 19A, refer to FIG. 3) is applied to each first island 11a of the frame FL. The semiconductor element 20 is mounted on each bulk of solder SD. In one example, a die bonder device (not shown) picks up the semiconductor element 20 and fixes the semiconductor element 20 to the solder SD on the first island 11a.

Figure 19B:
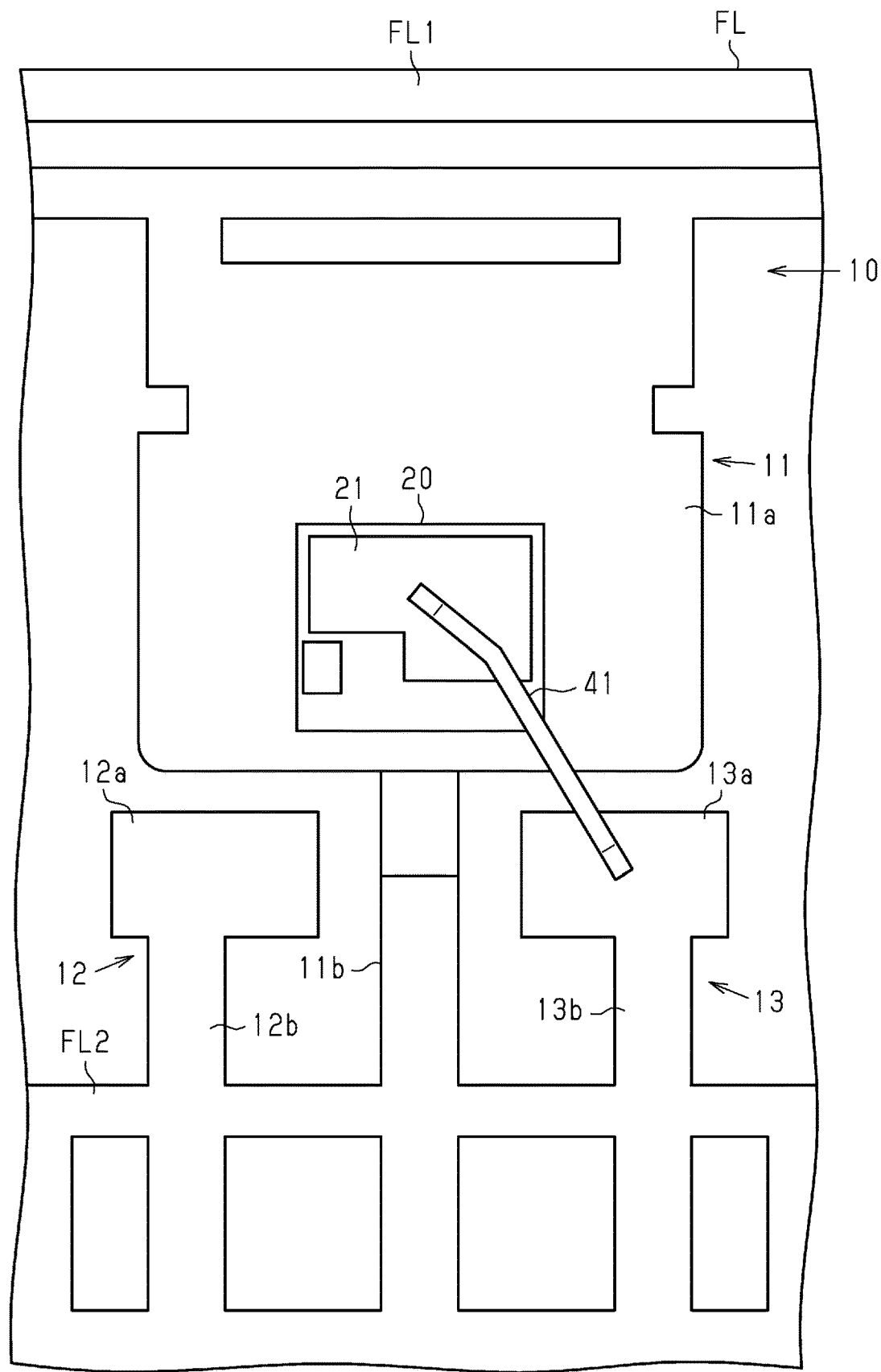
FIG. 19B is a diagram showing a step following FIG. 19A.

In the first wire connection step illustrated in FIG. 19B, wedge bonding is performed to connect the first wire 41 to the source pad 21 of the semiconductor element 20 and the third island 13a of the third lead frame 13. In detail, a wedge bonding device (not show) that performs wedge bonding first connects the first wire 41 to the source pad 21 (first bonding) and then to the third island 13a (second bonding).

As described with reference to FIGS. 7 and 8, the connection portion 41a of the first wire 41 for the source pad 21 includes the center of gravity position GC of the active region 29 in the semiconductor element 20. The wedge bonding device forms the connection portion 41a to extend toward the third island 13a of the third lead frame 13.

Figure 19C:
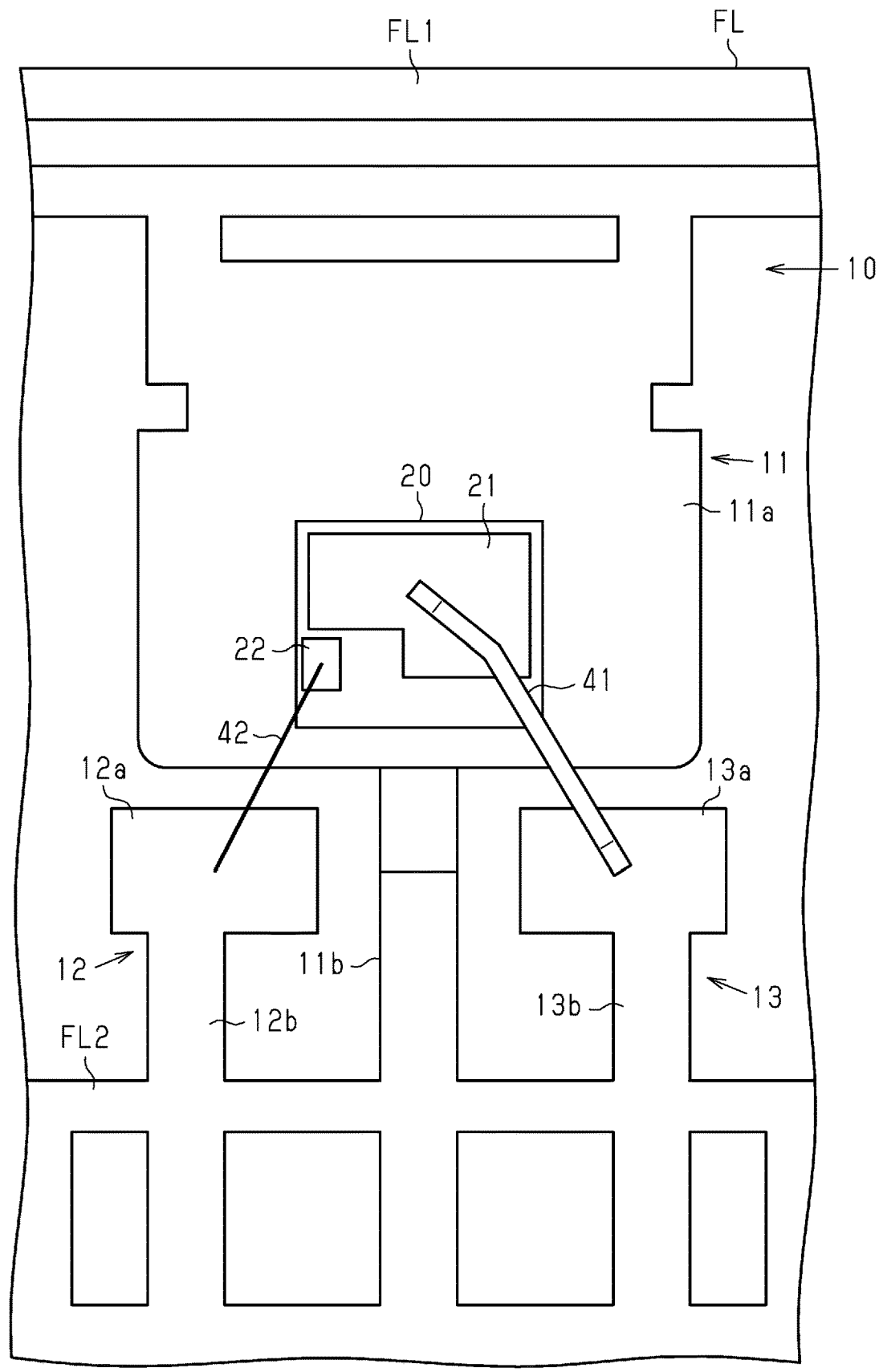
FIG. 19C is a diagram showing a step following FIG. 19B.

In the second wire connection step illustrated in FIG. 19C, wedge bonding is performed to connect the second wire 42 to the gate pad 22 of the semiconductor element 20 and the second island 12a of the second lead frame 12.

Figure 19D:
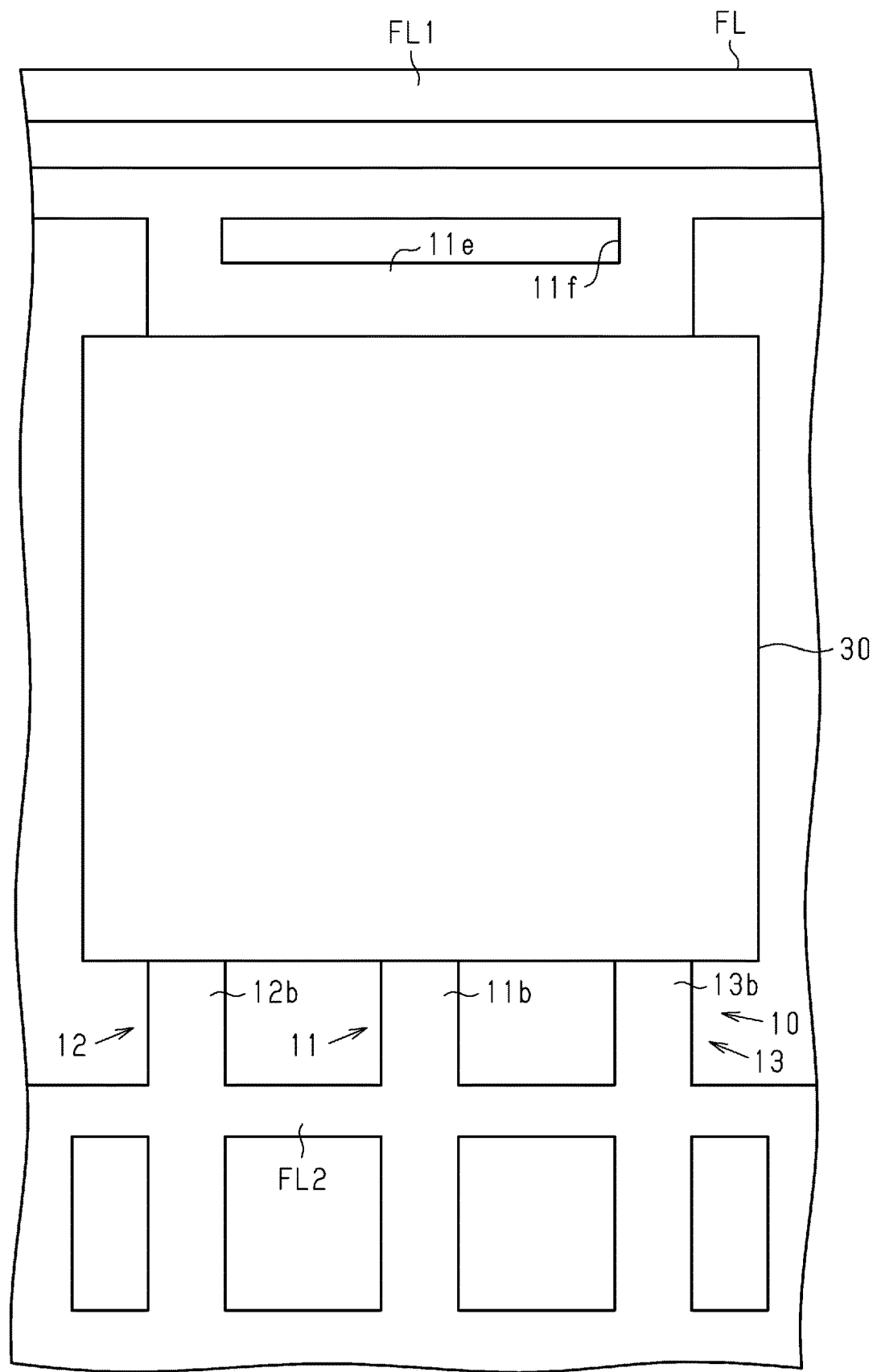
FIG. 19D is a diagram showing a step following FIG. 19C.

In the molding step illustrated in FIG. 19D, the encapsulation resin 30 is molded by, for example, a molding device. In one example, in a state in which an assembly manufactured in the second wire connection step is set in a cavity of a mold of the molding device, the cavity of the mold is filled with molten epoxy resin. This forms the encapsulation resin 30 that encapsulates the semiconductor element 20, the first wire 41, and the second wire 42 (refer to FIG. 19C).

Figure 19E:
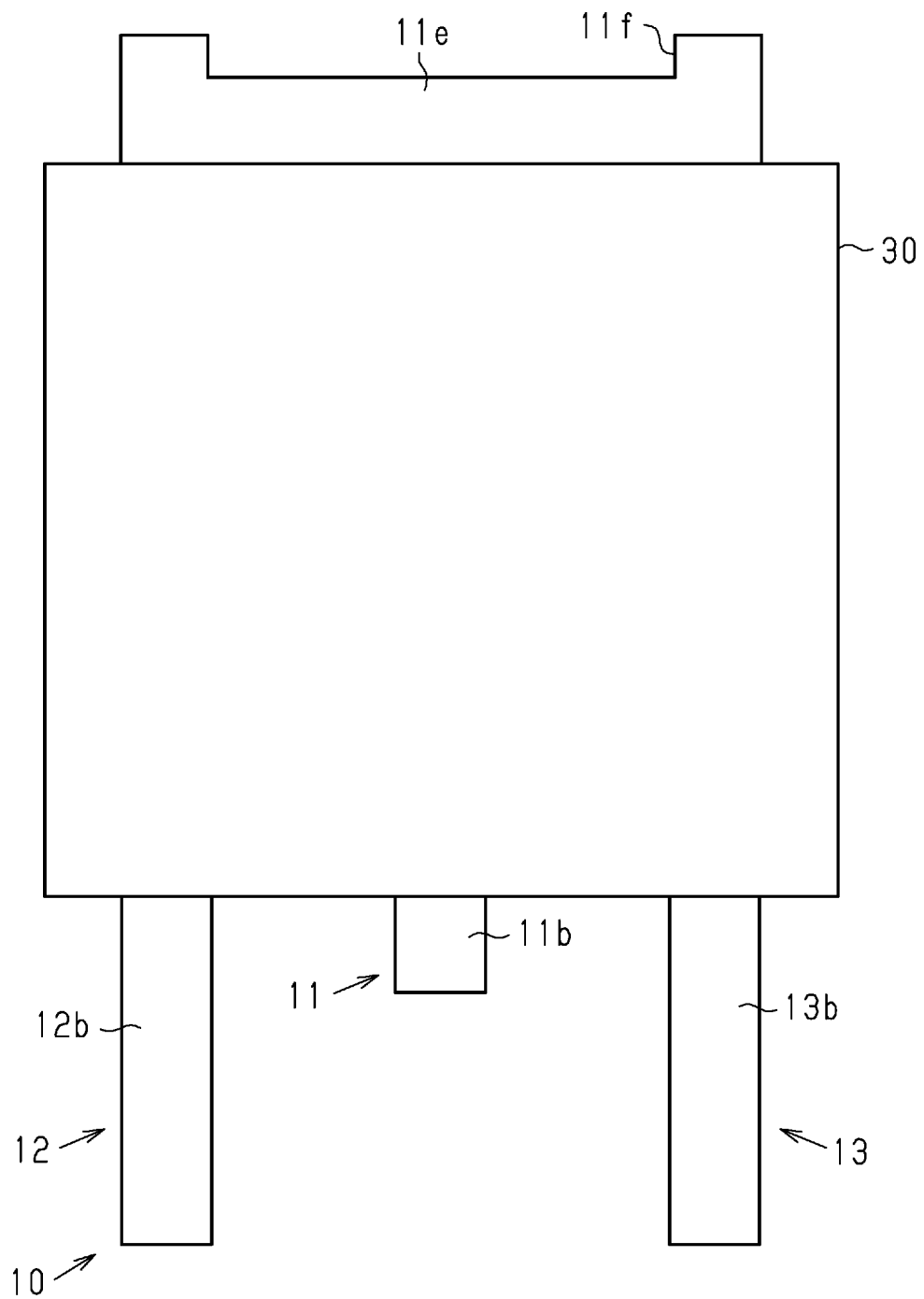
FIG. 19E is a diagram showing a step following FIG. 19D.

In the frame separation step illustrated in FIG. 19E, the lead frame 10 is separated from the frame FL (refer to FIG. 19D) by, for example, a pressing device. In detail, the first lead frame 11, the second lead frame 12, and the third lead frame 13 are cut from the outer frame portion FL1 (refer to FIG. 19D. Further, the coupling portion FL2 (refer to FIG. 19D), which connects the first terminal 11b of the first lead frame 11, the second terminal 12b of the second lead frame 12, and the third terminal 13b of the third lead frame 13, is cut.

Figure 19F:
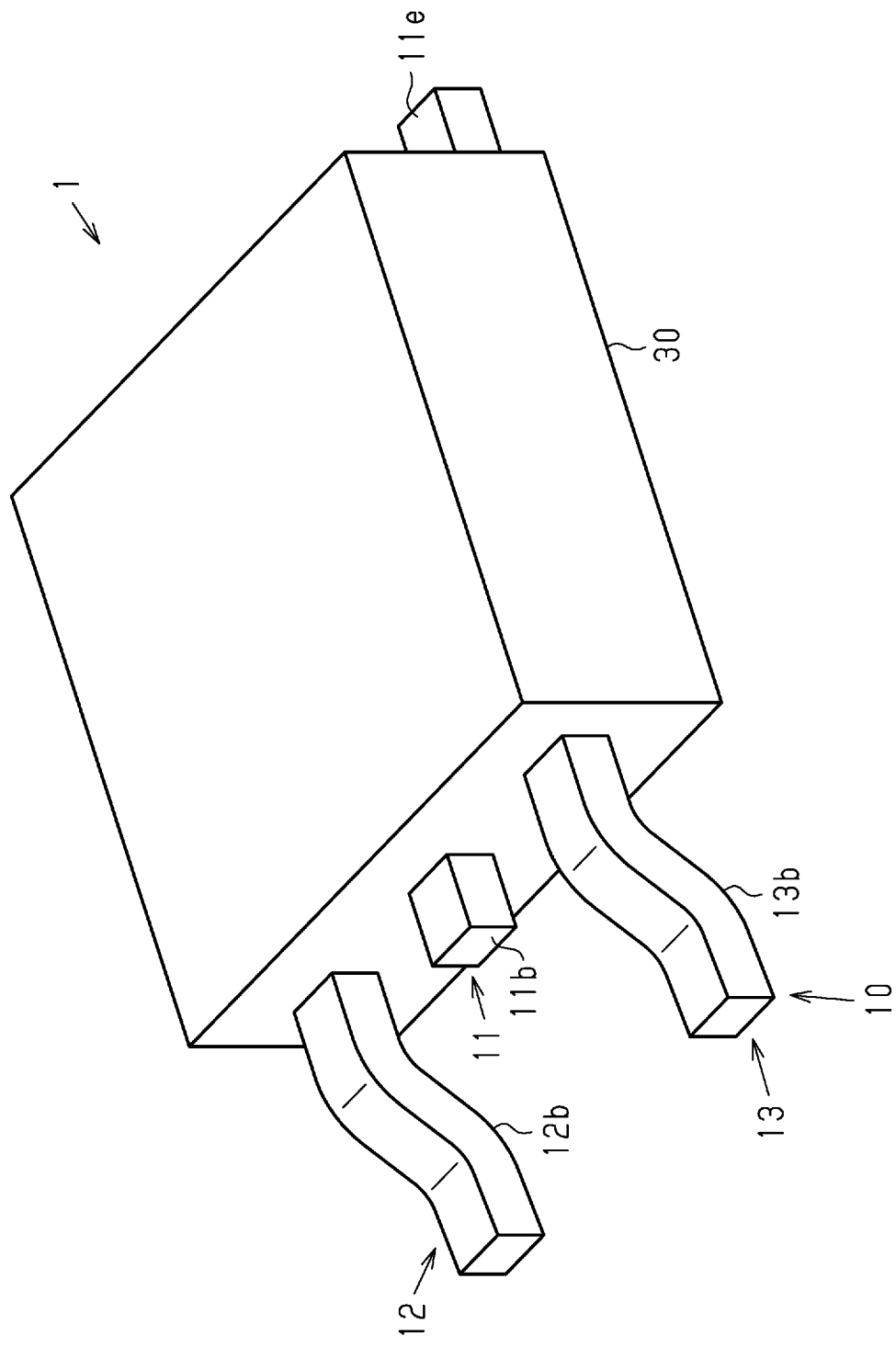
FIG. 19F is a diagram showing a step following FIG. 19E.

In the terminal bending step illustrated in FIG. 19F, for example, a pressing device bends portions of the second terminal 12b of the second lead frame 12 and the third terminal 13b of the third lead frame 13 projecting from the encapsulation resin 30. The semiconductor device 1 illustrated in FIG. 1 is obtained through the steps described above.

The present embodiment has the advantages described below.

(1-1) The region of the first wire 41 connected to the source pad 21, that is, the connection portion 41a of the first wire 41 includes the center of gravity position GC of the active region 29, which is the transistor formation region. This increases the active clamp capacity Eac in comparison with when the connection portion 41a of the first wire 41 is connected to the source pad 21 at a position that differs from the center of gravity position GC of the active region 29.

(1-2) The connection portion 41a of the first wire 41 extends toward the second island 12a of the second lead frame 12. Thus, although the middle portion of the first wire 41 connecting the semiconductor element 20 and the second island 12a is bent, the bent degree can be decreased. This increases the reliability of the semiconductor device 1.

(1-3) The plating layer 14 is formed on the surface of the first island 11a of the first lead frame 11. This decreases the wettability of solder SD when solder SD is applied to the first island 11a and limits spreading of solder SD on the surface of the first island 11a. Thus, the thickness of solder SD is not excessively reduced, and the semiconductor element 20 and the first island 11a can be properly connected.

(1-4) The first wire 41 includes aluminum, and the second lead frame 12 includes copper. The plating layer 14 is formed on the surface of the second island 12a of the second lead frame 12, which is connected to the first wire 41. This limits corrosion at the portion connecting the first wire 41 and the second island 12a.

(1-5) The second wire 42 includes aluminum, and the third lead frame 13 includes copper. The plating layer 14 is formed on the surface of the third island 13a of the third lead frame 13, which is connected to the second wire 42. This limits corrosion at the portion connecting the second wire 42 and the third island 13a.

(1-6) The temperature sensor 27 is located in a region outside the source pad 21 where heat is most concentrated in the active region 29 when the semiconductor device 1 is driven. This allows the temperature of the semiconductor device 1 to be detected with high accuracy.

(1-7) Typically, the coefficient of linear expansion of an encapsulation resin encapsulating an LSI that does not include a power transistor (hereafter, referred to as the comparison encapsulation resin) is 8 ppm/K to 10 ppm/K. The inventors of the present invention conducted, for example, a temperature cycle test on a semiconductor device using the comparison encapsulation resin. The temperature cycle test changed a temperature condition of −65° C. to 150° C. over approximately 1000 cycles. As a result, pitting corrosion occurred in a first wire connecting a source pad of a semiconductor element and a third island of a third lead frame. The first wire is similar to the first wire 41 of the semiconductor device 1.

The surface of the first wire is protected by a spontaneous oxidation film. However, the difference between the coefficient of linear expansion of the first wire and the coefficient of linear expansion of the encapsulation resin applies load to the first wire. This ruptures the spontaneous oxidation film, and the chlorine ions of the encapsulation resin are bonded with the first wire. It is understood that this is the reason causing pitting corrosion in the first wire.

In this regard, in the present embodiment, the coefficient of linear expansion of the material used for the encapsulation resin 30 is greater than 10 ppm/K. More specifically, the coefficient of linear expansion of the encapsulation resin 30 is 12 ppm/K. This decreases the difference between the coefficient of linear expansion of the first wire 41 and the coefficient of linear expansion of the encapsulation resin 30. Further, the load resulting from the temperature cycle test on the first wire 41 decreases. Thus, the spontaneous oxidation film of the first wire 41 is not ruptured, and pitting corrosion does not occur in the first wire 41.

In the present embodiment, the filler mixing ratio is increased to increase the coefficient of linear expansion of the encapsulation resin 30. However, when increasing the filler mixing ratio, the moldability of the encapsulation resin 30 becomes excessively low. Specifically, when the coefficient of linear expansion of the encapsulation resin 30 is greater than or equal to 15 ppm/K, the moldability of the encapsulation resin 30 becomes excessively low.

In this regard, the coefficient of linear expansion of the encapsulation resin 30 is less than 15 ppm/K. This limits decreases in the moldability of the encapsulation resin 30. In this manner, in the present embodiment, the occurrence of pitting corrosion in the first wire 41 is avoided, and decreases in the pitting corrosion of the encapsulation resin 30 are limited.

(1-8) In the MISFET 23a, the percentage of area occupied by the channel formation region 72 per unit area is less than 100%. In the MISFET 23a of the present embodiment, the percentage of the area occupied by the channel formation region 72 per unit area is approximately 50%. Thus, in comparison with when the percentage is 100%, the generation of heat is reduced in the active region 29. Accordingly, the active clamp capacity Eac can be increased.

(1-9) The source pad 21 of the MISFET 23a has a surface including ridges and valleys. This surface improves the adhesion between the source pad 21 and the encapsulation resin 30.

Second Embodiment

Figure 20:
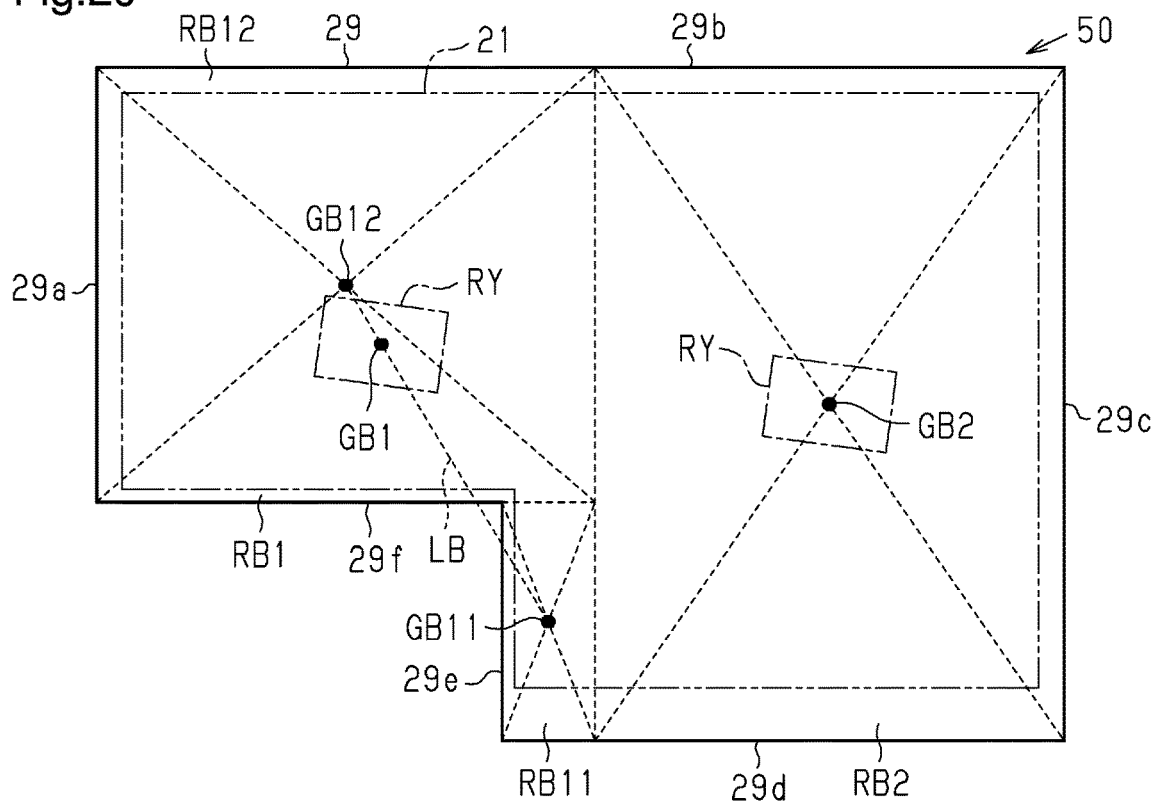
FIG. 20 is a schematic plan view showing an active region and a source pad of the semiconductor element in a semiconductor device according to a second embodiment.
Figure 21:
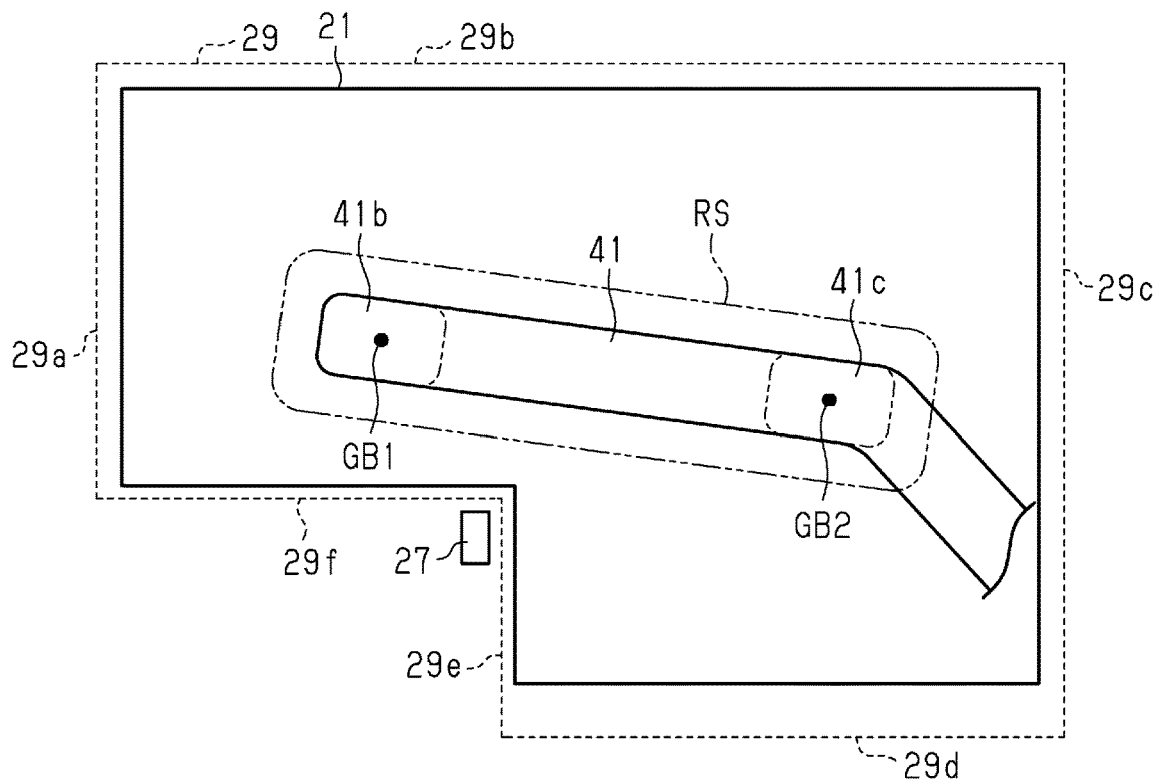
FIG. 21 is a schematic plan view showing the active region and the source pad of the semiconductor element.
Figure 22:
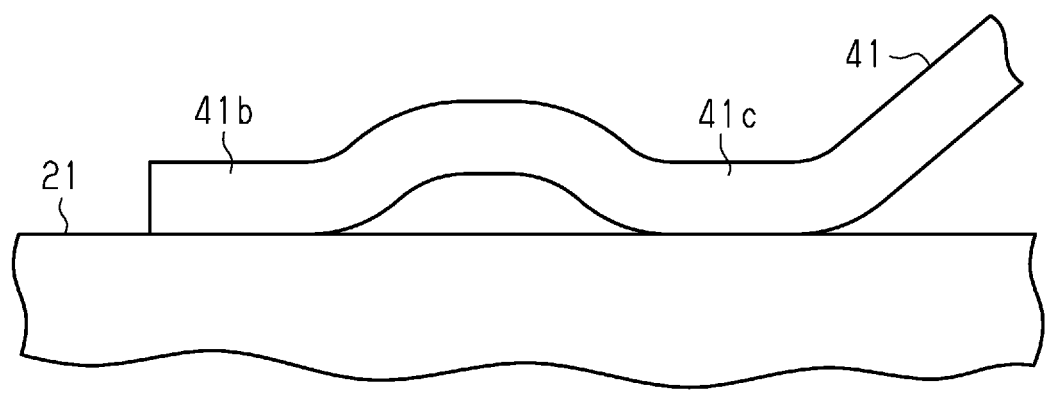
FIG. 22 is a side view of a first wire connected to the source pad of FIG. 21.

With reference to FIGS. 20 to 22, the semiconductor device 1 in accordance with a second embodiment will now be described. The semiconductor device 1 of the present embodiment differs from the semiconductor device 1 of the first embodiment in the structure connecting the first wire 41 to the source pad 21. In the description hereafter, same reference numerals are given to those components that are the same as the corresponding components in the semiconductor device 1 of the first embodiment. Such components will not be described in detail. FIGS. 20 and 21 are partially enlarged views of the substrate 50. In FIG. 20, the active region 29 is shown by solid lines, and the source pad 21 is shown by double-dashed lines. In FIG. 21, the active region 29 is shown by broken lines, and the source pad 21 is shown by solid lines.

The inventors of the present invention have studied the position where the first wire 41, which is connected to the semiconductor element 20, is connected to the source pad 21 with respect to the active region 29 of the semiconductor element 20 to improve the active clamp capacity Eac of the semiconductor device 1. The inventors of the present invention have found that when the first wire 41 is connected to the source pad 21 at two locations, the active clamp capacity Eac is improved by connecting the first wire 41 to the source pad 21 at positions corresponding to the center of gravity position of each of two divided regions having equal areas obtained by dividing the active region 29. Accordingly, as shown in FIG. 21, in the present embodiment, the first wire 41 is connected to the source pad 21 at two connecting positions. When the active region 29 is divided into two equal areas, the two connecting positions are the center of gravity positions GB1 and GB2 in the divided parts of the active region 29.

The center of gravity positions GB1 and GB2 of the active region 29 are obtained as follows.

As shown in FIG. 20, the source pad 21 is first divided into two divided regions (first region RB1 and second region RB2) having equal areas. As shown in FIG. 20, at least one of the first region RB1 and the second region RB2 may be a non-rectangular region. The first region RB1 shown in FIG. 20 is a region including a rectangular projection. The second region RB2 is a rectangular region.

Then, the center of gravity position GB1 of the first region RB1 and the center of gravity position GB2 of the second region RB2 are obtained. As shown in FIG. 20, the second region RB2 is rectangular. Thus, the center of gravity position GB2 of the second region RB2 is the intersection point of the diagonals of the second region RB2. The first region RB1 is not rectangular. Thus, the first region RB1 is further divided into a first divided region RB11 and a second divided region RB12. In detail, the part of the first region RB1 corresponding to the rectangular projection is referred to as the first divided region RB11, and the remaining part of (rectangular part) of the first region RB1 is referred to as the second divided region RB12. Then, the center of gravity position GB11 of the first divided region RB11 and the center of gravity position GB12 of the second divided region RB12 are obtained. The center of gravity position GB11 of the first divided region RB11 is the intersection point of the diagonals of the first divided region RB11. The center of gravity position GB12 of the second divided region RB12 is the intersection point of the diagonals of the second divided region RB12. Then, the area SB1 of the first divided region RB11 and the area SB2 of the second divided region RB12 are obtained. In a line segment LB connecting the center of gravity position GB11 and the center of gravity position GB12, the center of gravity position GB1 of the first region RB1 is obtained from the relationship of the distance DB1 between the center of gravity position GB11 and the center of gravity position GB1, the distance DB2 between the center of gravity position GB12 and the center of gravity position GB1, the area SB1 of the first divided region RB11, and the area SB2 of the second divided region RB12. More specifically, the ratio of the distance DB2 to the distance DB1 (DB2/DB1) and the inverse proportion of the ratio of the area SB2 of the second divided region RB12 to the area SB1 of the first divided region RB11 (SB1/SB2) are equal (DB2/DB1=SB1/SB2). Thus, at least one of the distances DB1 and DB2 is obtained to obtain the center of gravity position GB1 of the first region RB1. Further, as shown in FIG. 20, the source pad 21 is arranged to cover the center of gravity positions GB1 and GB2 (center of gravity position GB1 of first region RB1 and center of gravity position GB2 of second region RB2) in the divided active region 29.

Two regions RY shown by the single-dashed lines in FIG. 20 indicate a tool head (hereinafter, referred to as the wedge RY) used when ultrasonic-bonding the first wire 41 to the source pad 21 with a wedge bonding device (not shown). The wedge bonding device moves the wedge RY to position the wedge RX above the center of gravity position GB1 of the first region RB1 in the active region 29 and connects the first wire 41 to the source pad 21. This connects and superimposes the end of the first wire 41, which is passed through the wedge RY, with the center of gravity position GB1 of the first region RB1, as shown in FIG. 21. More specifically, a first connection portion 41b (connection region) where the first wire 41 is connected to the source pad 21 includes the center of gravity position GB1 of the first region RB1. In the present embodiment, the center position of the first connection portion 41b coincides with the center of gravity position GB1 of the first region RB1. Then, the wedge bonding device separates the wedge RY from the source pad 21 to separate the first wire 41 from the source pad 21 (refer to FIG. 22). Further, the wedge bonding device moves the wedge RY to position the wedge RY above the center of gravity position GB2 of the second region RB2 in the active region 29 and connects the first wire 41 to the source pad 21 (refer to FIG. 22). This connects and superimposes the first wire 41, which is passed through the wedge RY, with the center of gravity position GB2 of the second region RB2, as shown in FIG. 21. More specifically, a second connection portion 41c (connection region) where the first wire 41 is connected to the source pad 21 includes the center of gravity position GB2 of the second region RB2. In the present embodiment, the center position of the second connection portion 41c coincides with the center of gravity position GB2 of the second region RB2. Further, as shown in FIG. 22, the portion of the first wire 41 between the first connection portion 41b and the second connection portion 41c is spaced apart upward from the source pad 21.

As shown in FIG. 21, in the first wire 41, the first connection portion 41b and the second connection portion 41c, which are connected to the source pad 21, each extend in a direction that differs from the horizontal direction X and the vertical direction Y in a plan view of the semiconductor device 1. In detail, the first connection portion 41b and the second connection portion 41c each extend from the semiconductor element 20 toward the second island 12a (refer to FIG. 2). The direction in which the first connection portion 41b extends and the direction in which the second connection portion 41c extends can each be freely changed. In one example, the direction in which the first connection portion 41b extends may differ from the direction in which the second connection portion 41c extends.

As shown in FIG. 21, region RS, which is indicated by the double-dashed lined surrounding the first connection portion 41b and the second connection portion 41c of the first wire 41, is set taking into consideration variation in the wire diameter of the first wire 41 and variation in the position where the first wire 41 is connected to the source pad 21 by the wedge bonding device. Thus, the first connection portion 41b and the second connection portion 41c of the first wire 41 is always located inside region RS. In the present embodiment, region RS includes the vicinity of the intersection point of the fifth side 29e and the sixth side 29f of the active region 29. In the present embodiment, the temperature sensor 27 is arranged adjacent to region RS in a plan view of the semiconductor device 1.

In addition to the advantages of the first embodiment, the present embodiment has the advantage described below.

(2-1) The first wire 41 is connected to the center of gravity positions GB1 and GB2 of the corresponding first region RB1 and second region RB2, which are obtained by dividing the active region 29 into two divided regions having equal areas. This reduces the concentration of heat in the active region 29 when the semiconductor device 1 is driven and increases the active clamp capacity Eac.

Third Embodiment

Figure 23:
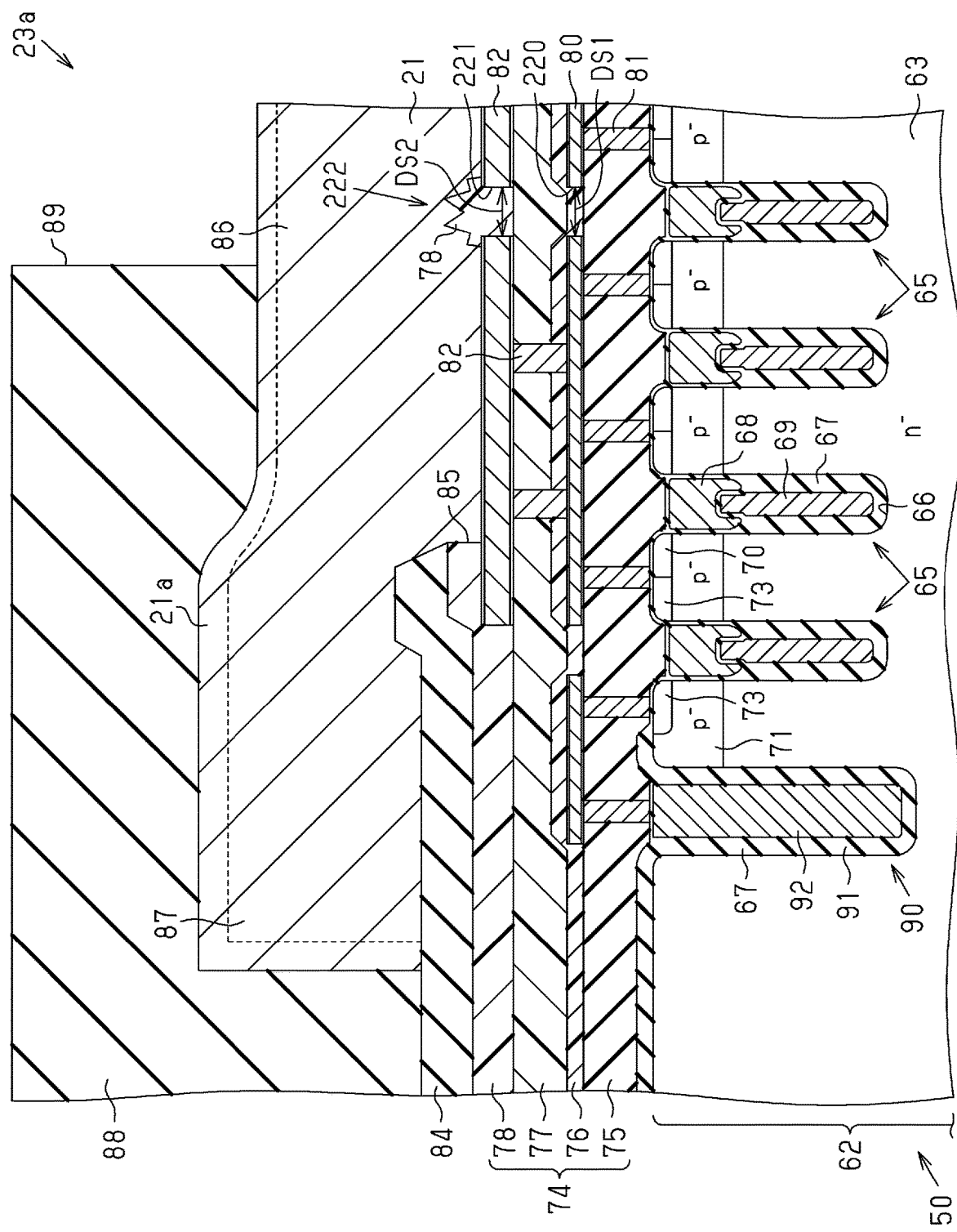
FIG. 23 is a schematic cross-sectional view showing the structure of part of a MISFET of a semiconductor element in a semiconductor device according to the third embodiment.

With reference to FIG. 23, the semiconductor device 1 in accordance with a third embodiment will now be described. The semiconductor device 1 of the present embodiment differs from the semiconductor device 1 of the first embodiment in the structure of part of the MISFET 23a. In the description hereafter, same reference numerals are given to those components that are the same as the corresponding components in the semiconductor device 1 of the first embodiment. Such components will not be described in detail. The description hereafter will focus on differences from the MISFET 23a of the first embodiment.

As shown in FIG. 23, the first source electrode 80, which corresponds to the first metal layer, includes one or more first slits 220 in at least a portion opposing the source pad 21. The first slits 220 extend through the first source electrode 80 in a direction in which the trench gate structures 65 extend (toward other side of plane of drawing). The first slits 220 of the present embodiment are opposed to the trench gate structures 65.

The second source electrode 82, which corresponds to the second metal layer, includes one or more second slits 221 in at least a portion opposing the source pad 21. The second slits 221 extend through the second source electrode 82 in a direction in which the trench gate structures 65 extend.

The second slits 221 are arranged to oppose at least the first slits 220. The second slits 221 each have a width DS2 and the first slits 220 each have a width DS1 that can be freely changed. In the present embodiment, the width DS2 of the second slit 221 is equal to the width DS1 of the first slit 220. Further, in the present embodiment, the second slit 221 is entirely opposed to the first slit 220.

The second interlayer insulation film 76 is embedded in the first slits 220. The fourth interlayer insulation film 78 is embedded in the second slits 221. The fourth interlayer insulation film 78 extends beyond the second slit 221 and covers the second source electrode 82 around the second slit 221. In this manner, the portion of the semiconductor element 20 where the first slits 220 and the second slits 221 are arranged include the support posts 222 formed by the first interlayer insulation film 75 to the fourth interlayer insulation film 78. The support posts 222 are formed by sequentially laminating the first interlayer insulation film 75, the second interlayer insulation film 76, the third interlayer insulation film 77, and the fourth interlayer insulation film 78. The upper ends of the support posts 222 are covered by the source pad 21. Thus, the support posts 222 support the source pad 21.

Preferably, such a structure including the first slits 220 and the second slits 221 is arranged in at least the periphery of the source pad 21. In the present embodiment, the structure including the first slits 220 and the second slits 221 is arranged entirely on the source pad 21. In detail, the MISFET 23a is formed by combining multiple sets of structures including the first slit 220 and the second slit 221. One example of a structure including the first slit 220 and the second slit 221 is a structure including the first slit 220 and the second slit 221 at positions corresponding to three trench gate structures 65 and one of three trench gate structures 65. The MISFET 23a is formed by combining structures including the first slits 220 and the second slits 221.

The source pad 21 of the present embodiment is formed by copper (Cu). Preferably, the source pad 21 has a thickness of approximately 4 µm or greater. Further, preferably, the thickness of the source pad 21 is approximately 20 µm or less. The thickness of the source pad 21 in the present embodiment is approximately 8 µm. The source pad 21 can be formed by growing copper plating. A connection layer 21a including nickel (Ni) plating is formed on the surface of the copper forming the source pad 21. The connection layer 21a of the present embodiment is formed by a nickel palladium (NiPd) plating. The source pad 21 may be an aluminum alloy (e.g., AlCu).

Operation

The operation of the present embodiment will now be described.

For example, in a case where a semiconductor device is connected to an inductive load and energy needs to be released from the inductive load when a switching element (MISFET) of the semiconductor device is turned off, the active clamp capacity Eac is a known index indicating the absorbable amount of the energy stored in the inductive load.

When the energy applied to the semiconductor device exceeds a predetermined value, the semiconductor device may fail to function due to a rise in temperature. In this manner, the active clamp capacity Eac is mainly determined by failure of the semiconductor device caused by heat. Thus, for example, when energy is applied to the semiconductor device and the temperature becomes high locally and transiently in a portion of the substrate, a failure may easily occur at that portion, thereby obstructing the absorption of energy. This hinders increases in the active clamp capacity Eac.

With regard to such a problem, the power electrode pad (source pad) of the semiconductor device may be changed to copper, which has superior heat dissipation characteristics, and the thickness of the source pad may be increased to absorb the transient energy of the semiconductor device. This allows the active clamp capacity Eac to be increased.

However, when heat is applied to the source pad during manufacturing of the semiconductor device, a source formed from copper extends more easily than a source pad formed from aluminum. Thus, the interlayer insulation film formed in the source pad, particularly, in the periphery of the source pad, is pressed against the epitaxial layer. As a result, in the outer region of the source pad, for example, a passivation crack may occur in which the first metal extends out of the passivation film.

Accordingly, in the present embodiment, the first slits 220 are formed in the first source electrode 80, and the second slits 221 are formed in the second source electrode 82. Thus, even if the first source electrode 80 is deformed, the first slits 220 interrupt the deformation, and even if the second source electrode 82 is deformed, the second slits 221 interrupt the deformation. This reduces the deformation amount of the first source electrode 80 and the second source electrode 82.

In addition, the support posts 222, which support the source pad 21, are formed to connect the first slits 220 and the second slits 221. Thus, the support posts 222 provide support acting against the source pad 21. This limits deformation of the first source electrode 80 and the second source electrode 82. Accordingly, the occurrence of passivation cracks is limited.

In addition to the operation and advantages described above, the present embodiment has the advantages described below.

(3-1) When the source pad 21 is formed from, for example, aluminum, the source pad 21 is formed through sputtering. Thus, it is difficult for the source pad 21 to have sufficient thickness. As a result, it is difficult to increase the heat capacity of the source pad 21, and heat dissipation may be insufficient when heat is instantaneously applied to the semiconductor device. Thus, there is room for improvement for sufficiently increasing the active clamp capacity Eac.

In this regard, the source pad 21 is formed by growing copper plating in the present embodiment. This allows the thickness of the source pad 21 to be greater than the thickness the source pad 21 that is formed from aluminum. Accordingly, the heat capacity of the source pad 21 can be increased, and the active clamp capacity Eac can be increased. In addition, since the thickness of the source pad 21 can be increased, the impact transmitted to the interlayer insulation film 74 is limited when connecting the first wire 41 to the source pad 21.

(3-2) Nickel plating is formed on the surface of the copper of the source pad 21. The first wire 41 is formed from aluminum. This limits corrosion at the portion connecting the source pad 21 and the first wire 41.

Fourth Embodiment

With reference to FIGS. 24 to 27K, the semiconductor device 1 in accordance with a fourth embodiment will now be described. The semiconductor device 1 of the present embodiment differs from the semiconductor device 1 of the first embodiment in the structure of the MISFET 23a. In the description hereafter, same reference numerals are given to those components that are the same as the corresponding components in the semiconductor device 1 of the first embodiment. Such components will not be described in detail. In the MISFET 23a of the present embodiment, the channel formation region 72 is different. Thus, to facilitate illustration, in FIGS. 27J and 27K, the interlayer insulation film 74, the first source electrode 80, the second source electrode 82, and the source pad 21 are shown schematically. In the present embodiment, a structure including the first source electrode 80, the second source electrode 82, and the source pad 21 is referred to as the source metal 230.

The MISFET 23a of the present embodiment includes functional element formation regions 231 that differ from one another in the percentage of the area occupied by the channel formation region 72 per unit area. In the present embodiment, the active region 29 of the MISFET 23a is formed by the functional element formation regions 231. The functional element formation regions 231 include first functional element formation regions 232, in which the percentage of the area occupied by the channel formation region 72 per unit area is relatively small, and second functional element formation regions 233, in which the percentage of the area occupied by the channel formation region 72 per unit area is relatively large. Further, the functional element formation regions 231 of the present embodiment include third functional element formation regions 234, in which the percentage of the area occupied by the channel formation region 72 per unit area is larger than the first functional element formation regions 232 and smaller than the second functional element formation regions 233.

In the first functional element formation regions 232, the percentage of the area occupied by the channel formation region 72 per unit area is smaller than the second functional element formation regions 233 and the third functional element formation regions 234, and the amount of generated heat is thus relatively small. In the first functional element formation regions 232, the ON resistance of the relatively small channel formation region 72 is larger than that of the second functional element formation regions 233 and the third functional element formation regions 234.

In contrast, in the second functional element formation regions 233 and the third functional element formation regions 234, the percentage of the area occupied by the channel formation region 72 per unit area is greater than that of the first functional element formation regions 232, and the amount of generated heat is thus relatively large. Further, in the second functional element formation regions 233 and the third functional element formation regions 234, the channel formation region 72 has a relatively large area and the ON resistance is thus smaller than that of the first functional element formation regions 232.

The relationship of the amount of generated heat in the first to third functional element formation regions 232 to 234 is the amount of generated heat in the first functional element formation regions 232<the amount of generated heat in the third functional element formation regions 234<the amount of generated heat in the second functional element formation regions 233. The relationship of the ON resistance in the first to third functional element formation regions 232 to 234 is the ON resistance of the second functional element formation regions 233<the ON resistance of the third functional element formation regions 234<the ON resistance of the first functional element formation regions 232. Further, the relationship of the active clamp capacity Eac of the first to third functional element formation regions 232 to 234 is the active clamp capacity Eac of the second functional element formation regions 233<the active clamp capacity Eac of the third functional element formation regions 234<the active clamp capacity Eac of the first functional element formation regions 232.

In the semiconductor device 1 (MISFET 23a) of the present embodiment, the first functional element formation regions 232, the second functional element formation regions 233, and the third functional element formation regions 234 are laid out so that temperature increases are limited in the entire semiconductor device 1 (semiconductor element 20) and so that the semiconductor device 1 is superior in the active clamp capacity Eac and the ON resistance. In the semiconductor device 1, the first functional element formation regions 232 are particularly arranged at portions in the source pad 21 where the temperature easily increases, and the second functional element formation regions 233 and the third functional element formation regions 234 are arranged at other portions. This achieves the above object.

Examples of regions in the source pad 21 where the temperature tends to increase and thus needs to be limited include an inner region spaced apart inward by a predetermined distance from the periphery of the source pad 21, a region having a periphery surrounded by the channel formation regions 72 (functional element formation regions 231), a region that is not connected to the first wire 41 in a plan view, and a region selectively combining these regions. The dissipation of heat is difficult in these regions, and heat has a tendency of remaining in these regions. In particular, in the inner region of the source pad 21, the temperature easily increases, and the temperature has a tendency of becoming relatively higher than other portions.

In the present embodiment, the first functional element formation regions 232 are arranged in the inner region of the active region 29, and the second functional element formation regions 233 and the third functional element formation regions 234 are arranged in the outer region of the active region 29. Thus, the percentage of the area occupied by the channel formation region 72 per unit area gradually increases from the inner side toward the outer side of the active region 29.

Further, in the active region 29, the location where the first wire 41 is connected to the source pad 21 is where heat is dissipated through the source pad 21 to the first wire 41. Thus, the temperature of the active region 29 easily decreases. In this regard, the location where the first wire 41 is connected to the source pad 21 is where the second functional element formation regions 233, which have the most amount of generated heat, are located.

Figures 24, 25:
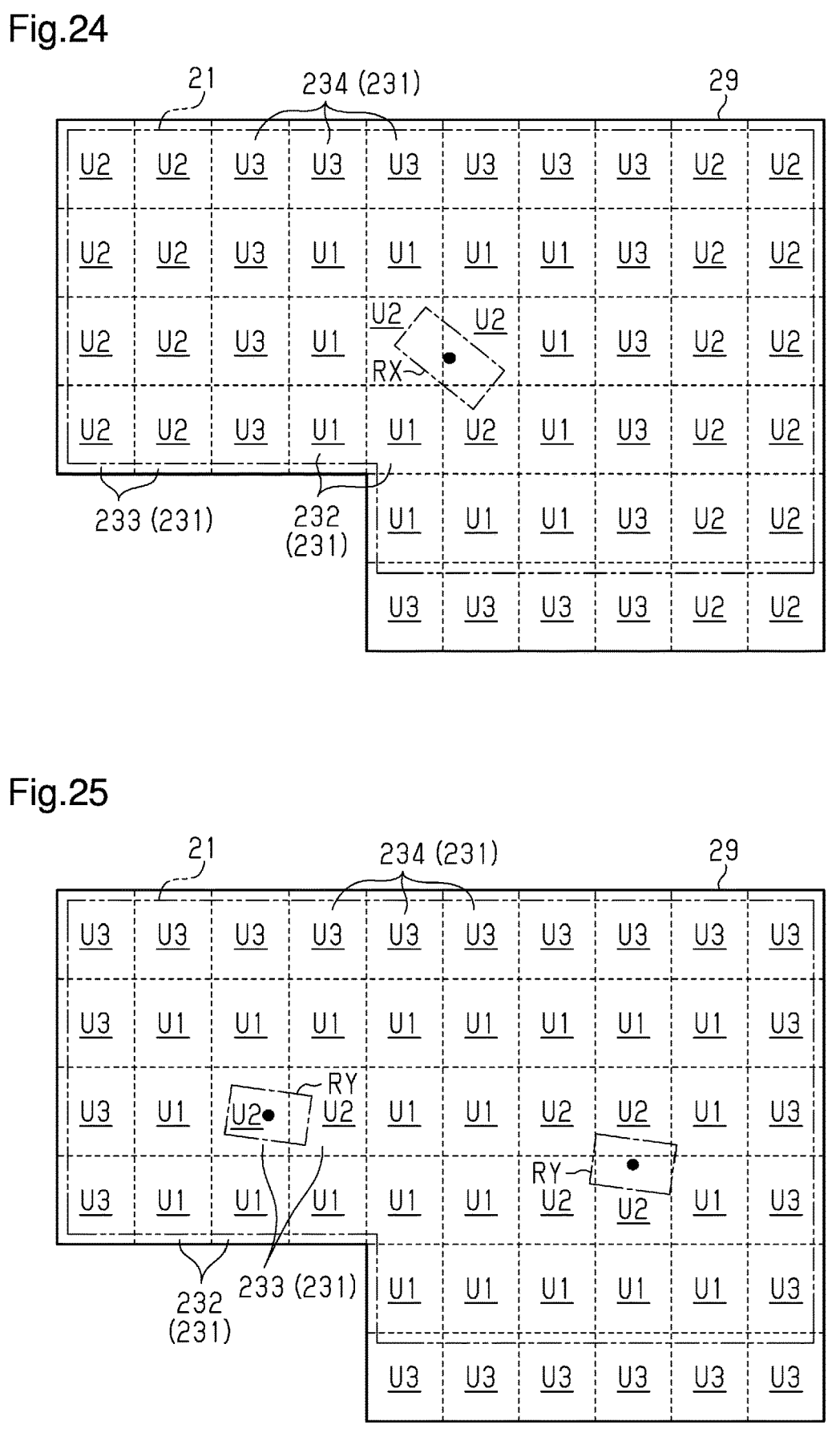

The layout of the functional element formation regions 231 will now be described in detail. FIGS. 24 and 25 show examples of the arrangement of the functional element formation regions 231, and the number and shape of regions dividing the active region 29 may be freely changed.

As shown in FIGS. 24 and 25, the functional element formation regions 231 include first functional element formation region units U1 including the plurality of the first functional element formation regions 232 (four in the present embodiment), second functional element formation region units U2 including the plurality of the second functional element formation regions 233 (four in the present embodiment), and the third functional element formation region units U3 including the third functional element formation regions 234.

In the present embodiment, the first to third functional element formation region units U1 to U3, which have substantially the same area and are rectangular in a plan view, are arranged in a matrix (regularly arranged in vertical direction and horizontal direction) in the active region 29 in accordance with a predetermined layout. In other words, the first to third functional element formation region units U1 to U3 are arranged in rectangular regions forming a matrix in the active region 29 in accordance with the predetermined layout.

In detail, the first to third functional element formation region units U1 to U3 are, for example, obtained by simulating the generated heat in each region of the active region 29 when the semiconductor device 1 is driven and arranged in accordance with the amount of generated heat obtained for each region. For example, the second functional element formation region units U2 are arranged in regions where the amount of generated heat is less than or equal to a first threshold value, the first functional element formation region units U1 are arranged in regions where the amount of generated heat is greater than or equal to a second threshold value, which is greater than the first threshold value, and the third functional element formation region units U3 are arranged in the regions where the amount of generated heat is greater than the first threshold value and less than the second threshold value.

FIG. 24 shows a layout of the first to third functional element formation region units U1 to U3 in the active region 29 when the first wire 41 is connected to the source pad 21 at one location.

As shown in FIG. 24, the first functional element formation region units U1 are arranged in regions where the generation of heat has to be limited. The first functional element formation region units U1 are arranged in an inner region of the active region 29. The third functional element formation region units U3 are arranged in regions adjacent to the first functional element formation region units U1. Among regions adjacent to the third functional element formation region units U3, the second functional element formation region units U2 are arranged in regions in the sides opposite to the first functional element formation region units U1.

Further, in the active region 29, the second functional element formation region units U2 are arranged in regions where the first wire 41 is connected to the source pad 21 (region indicated by single-dashed lines). The first functional element formation region units U1 are arranged in regions around these second functional element formation region units U2. The third functional element formation region units U3 are arranged in regions around these first functional element formation region units U1.

FIG. 25 shows a layout of the first to third functional element formation region units U1 to U3 in the active region 29 when the first wire 41 is connected to the source pad 21 at two locations.

As shown in FIG. 25, the first functional element formation region units U1 are arranged in regions where the generation of heat has to be limited. The first functional element formation region units U1 are arranged in an inner region of the active region 29. In one example, in the active region 29, the first functional element formation region units U1 are arranged in inner regions between the regions of the two locations where the first wire 41 is connected to the source pad 21 (regions indicated by single-dashed lines). The third functional element formation region units U3 are arranged in regions adjacent to the first functional element formation region units U1.

Further, in the active region 29, the second functional element formation region units U2 are arranged in the regions of the two locations where the first wire 41 is connected to the source pad 21 (region where wedge RY is arranged). The first functional element formation region units U1 are arranged in regions around these second functional element formation region units U2. The first functional element formation region units U1 are arranged in regions around these second functional element formation region units U2. The third functional element formation region units U3 are arranged in regions around these first functional element formation region units U1.

The outer region of the active region 29 are not limited to the layout of the second functional element formation region units U2 and the third functional element formation region units U3 shown in FIGS. 24 and 25, and the outer region may include only either one of the second functional element formation region units U2 and the third functional element formation region units U3.

The planar structure of the first to third functional element formation region units U1 to U3 will now be described with reference to FIGS. 26A to 26C.

Figure 26A:
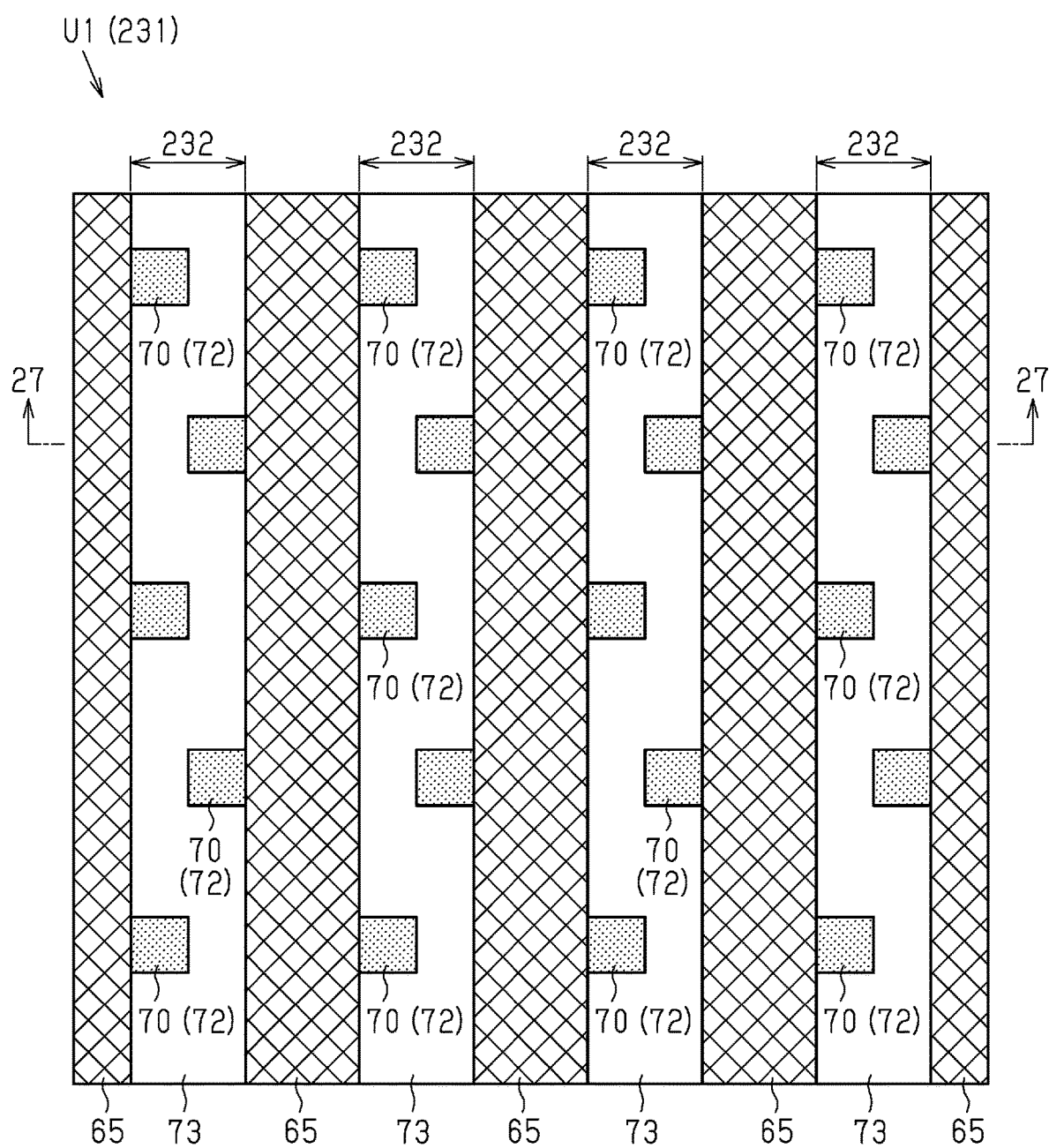
FIG. 26A is a schematic plan view showing an epitaxial layer of the semiconductor element.
Figure 26B:
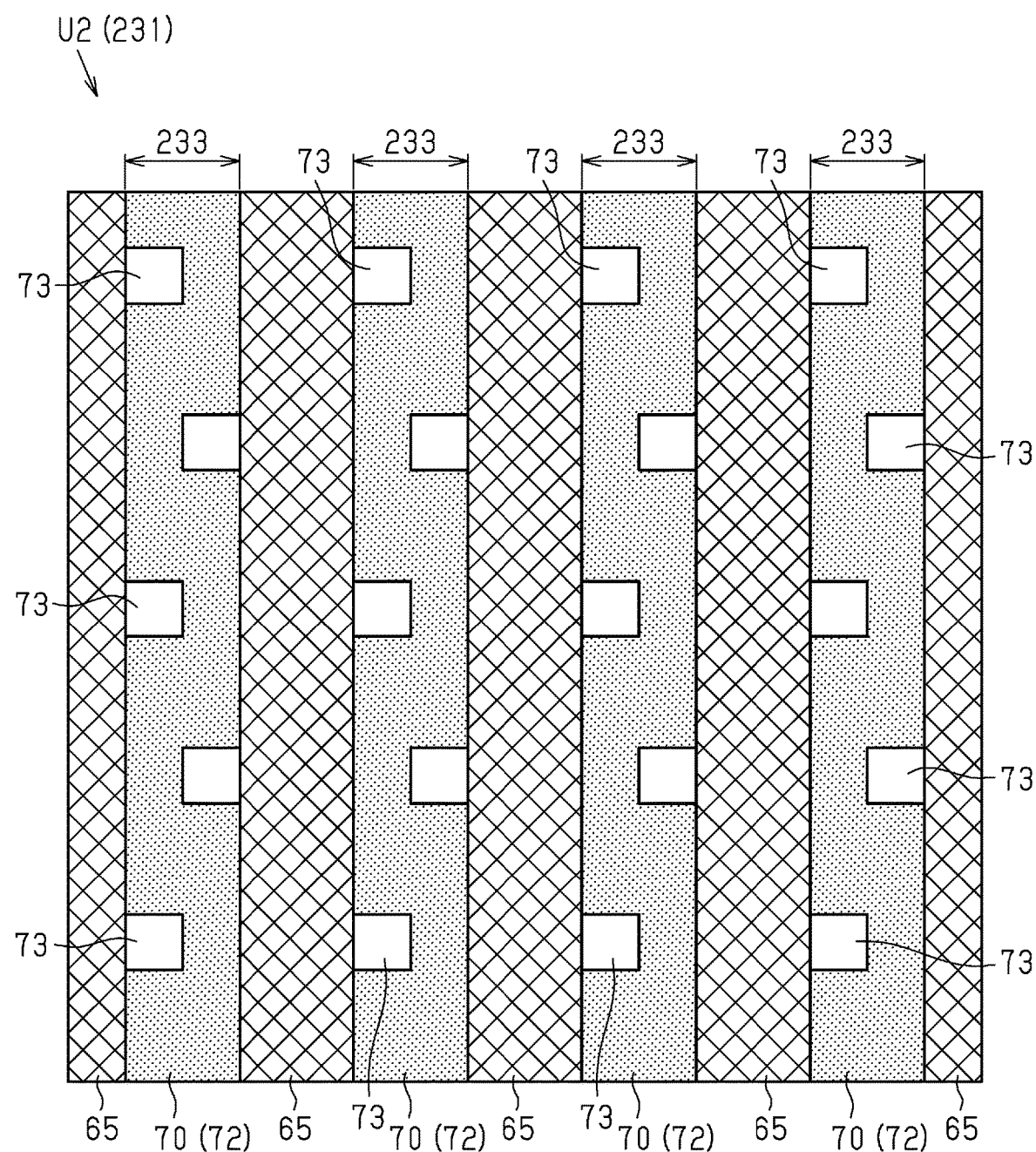
FIG. 26B is a schematic plan view showing the epitaxial layer of the semiconductor element.
Figure 26C:
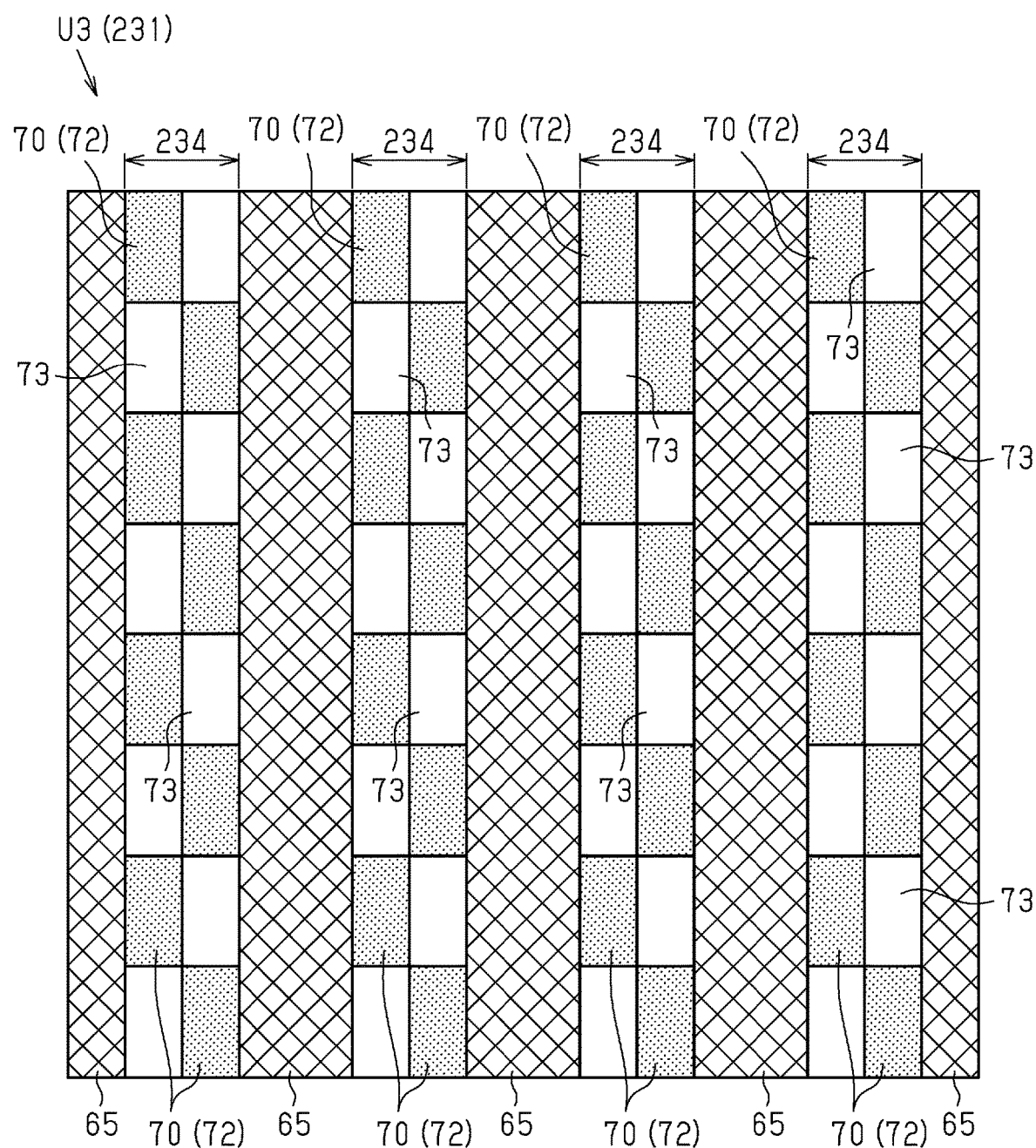
FIG. 26C is a schematic plan view showing the epitaxial layer of the semiconductor element.

As shown in FIGS. 26A to 26C, the first to third functional element formation region units U1 to U3 undergo adjustment of the percentage of the area occupied by the channel formation region 72 per unit area to change the layout of the first to third functional element formation regions 232 to 234.

The first functional element formation region units U1 shown in FIG. 26A include the functional element formation regions 231 of which the percentage of the area occupied by the channel formation region 72 per unit area is approximately 25%. The second functional element formation region units U2 shown in FIG. 26B include the functional element formation regions 231 of which the percentage of the area occupied by the channel formation region 72 per unit area is approximately 75%. The third functional element formation region units U3 shown in FIG. 26C include the functional element formation regions 231 of which the percentage of the area occupied by the channel formation region 72 per unit area is approximately 50%.

As shown in FIGS. 26A to 26C, in the present embodiment, the channel formation regions 72 form a staggered or zigzagged layout in the first to third functional element formation regions 232 to 234.

As shown in FIG. 26A, in each first functional element formation region 232 of the first functional element formation region unit U1, the channel formation regions 72 are laid out in a zigzagged manner in the longitudinal direction of the trench gate structures 65. In each trench gate structure 65, the channel formation regions 72 are laid out, in the longitudinal direction of the trench gate structures 65, spaced apart from one another and alternately arranged on one side of each trench gate structure 65 and the other side of the trench gate structure 65. The channel formation regions 72 are arranged on only one side or the other side in the horizontal direction intersecting the trench gate structure 65. With this configuration, in the first functional element formation region unit U1, the percentage of the area occupied by the channel formation regions 72 per unit area is approximately 25%. In the first functional element formation region unit U1, the channel formation region 72 is arranged on one side or the other side of the trench gate structure 65 and spaced apart from the other channel formation regions 72. This effectively disperses the sources of heat generation.

Further, the channel formation regions 72 arranged on one side of the trench gate structure 65 are not opposed to the channel formation region 72 arranged on the other side. Accordingly, in the horizontal direction intersecting the trench gate structures 65, the sources of heat generation are not opposed to each other at opposite sides of each trench gate structure 65. This hinders the transmission of heat generated on one channel formation region 72 to another channel formation region 72 and effectively reduces the occurrence of heat interference. In this manner, the first functional element formation region units U1 effectively limit temperature increases.

As shown in FIG. 26B, each second functional element formation region 233 of the second functional element formation region units U2 is formed by replacing the source region 70 shown in FIG. 26A with the body contact region 73. In detail, the channel formation regions 72 extend in the longitudinal direction of the trench gate structures 65. In the horizontal direction intersecting the trench gate structures 65, the channel formation regions 72 on the side of one trench gate structure 65 are formed integrally with the channel formation regions 72 formed on the side of another trench gate structure 65. This forms the zigzagged channel formation regions 72 in each second functional element formation region 233. With such a configuration, in the second functional element formation region units U2, the percentage of the area occupied by the channel formation regions 72 per unit area is approximately 75%.

As shown in FIG. 26C, each third functional element formation region 234 of the third functional element formation region unit U3 is obtained by extending the length of the channel formation region 72 shown in FIG. 26A by approximately two times in the longitudinal direction of the trench gate structures 65. With such a configuration, in the third functional element formation region units U3, the percentage of the area occupied by the channel formation region 72 per unit area is approximately 50%. In the present embodiment, the cross-sectional structures of the first to third functional element formation region units U3 is substantially the same as the cross-sectional structure of the MISFET 23a shown in FIG. 9.

Method for Manufacturing MISFET

One example of a method for manufacturing the MISFET 23a will now be described with reference to FIGS. 27A to 27K. FIGS. 27A to 27K are cross-sectional views corresponding to line 27-27 in FIG. 26A.

Figure 27A:
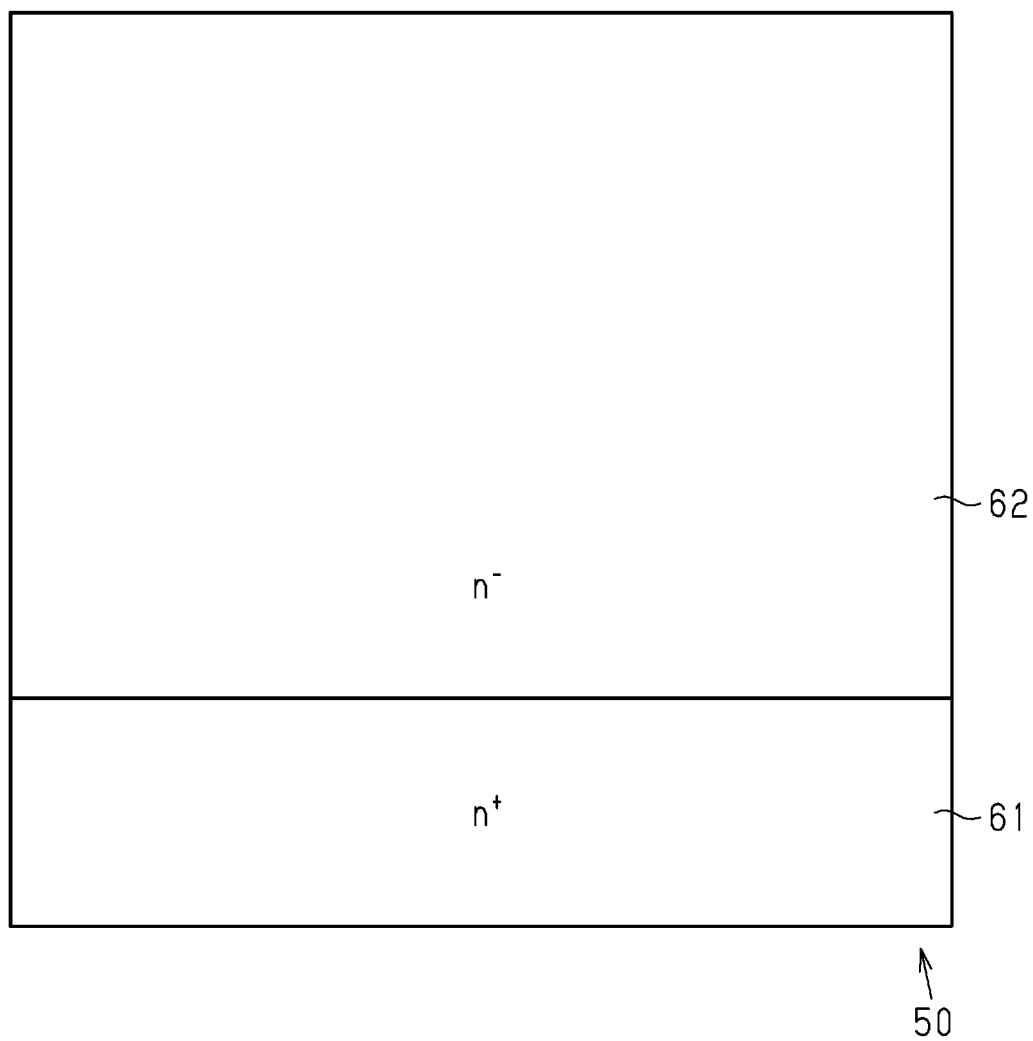
FIG. 27A is a diagram showing part of a manufacturing process of a MISFET of the semiconductor element.

First, as shown in FIG. 27A, the semiconductor substrate 61 and a wafer of the substrate 50, which includes the epitaxial layer 62 formed on the semiconductor substrate 61, are prepared.

Figure 27B:
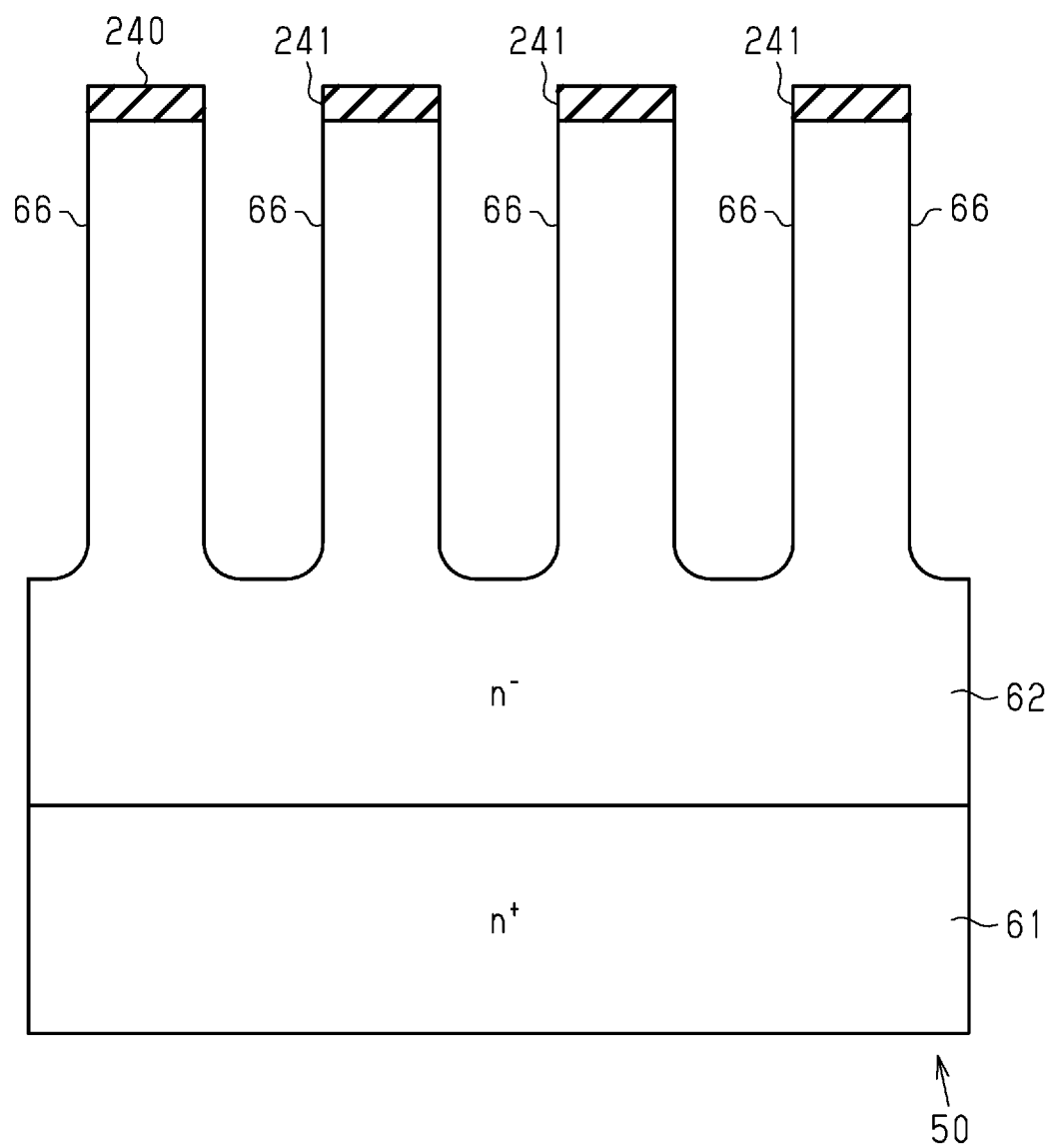
FIG. 27B is a diagram showing a step following FIG. 27A.

Then, as shown in FIG. 27B, a hard mask 240, which includes openings 241 at regions where the trenches 66 are to be selectively formed, is formed on the epitaxial layer 62. Then, etching is performed through the hard mask 240 to selectively remove the outermost part of the epitaxial layer 62. This forms the trenches 66. After the trenches 66 are formed, the hard mask 240 is removed.

Figure 27C:
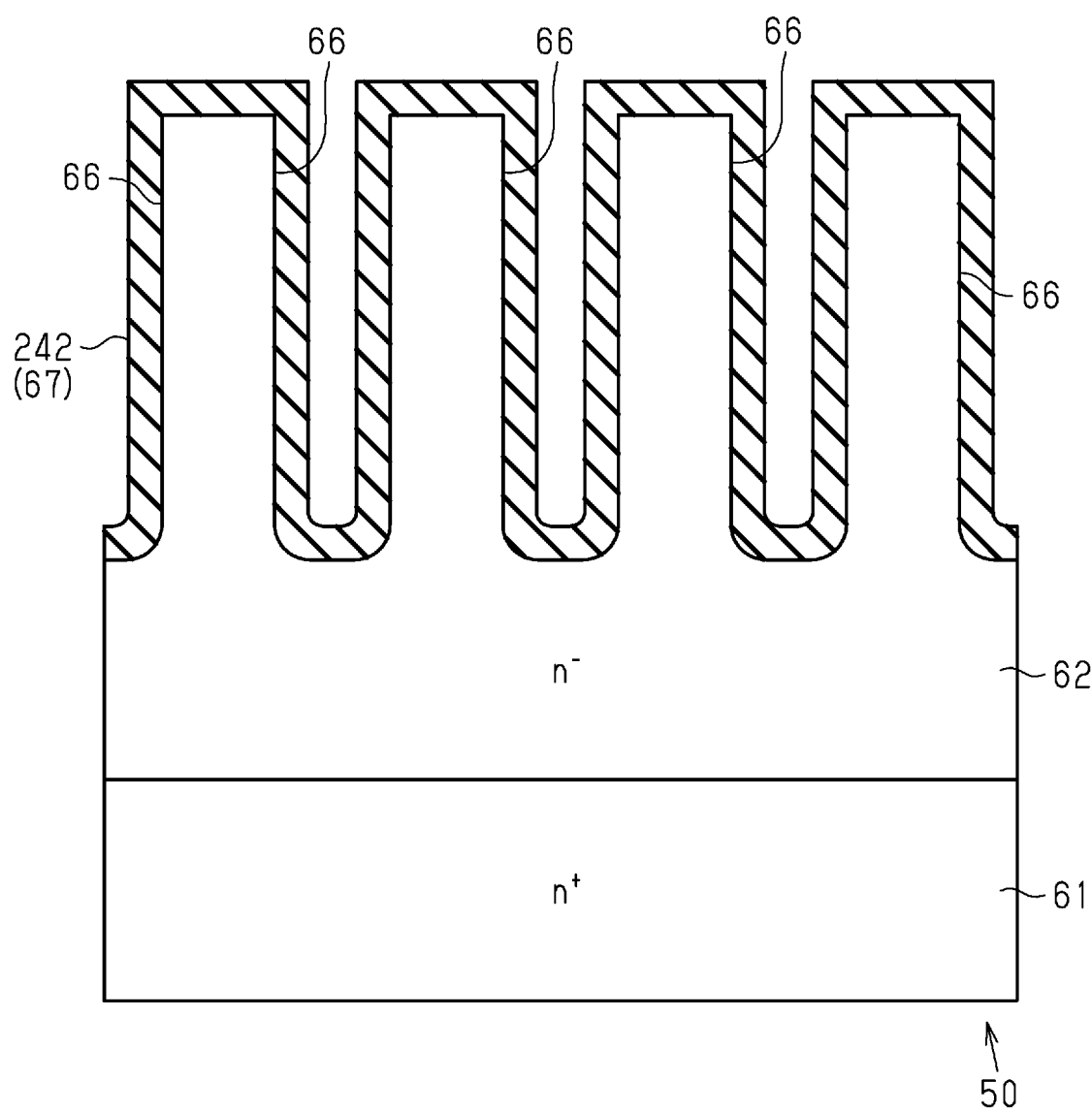
FIG. 27C is a diagram showing a step following FIG. 27B.

As shown in FIG. 27C, by performing, for example, a thermal oxidation process, a thermal oxidation film 242 of silicon oxide is formed on the wall surfaces in the trenches 66.

Figure 27D:
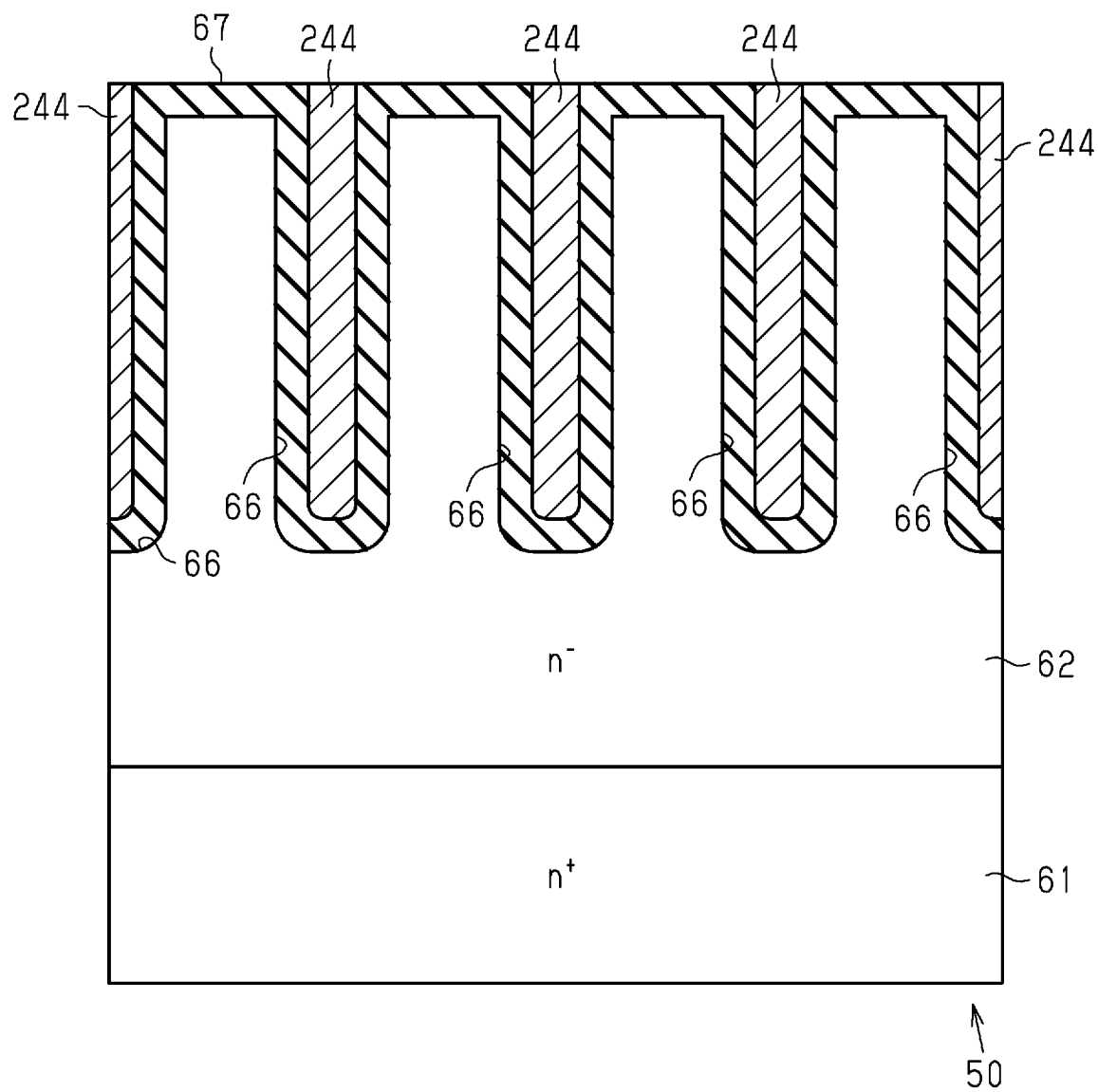
FIG. 27D is a diagram showing a step following FIG. 27C.

As shown in FIG. 27D, a polysilicon film 244, which serves as a conductor, is deposited on the epitaxial layer 62. The polysilicon film 244 fills the trenches 66 and covers the surface of the epitaxial layer 62. Afterwards, n-type impurities are implanted in the polysilicon film 244 and dispersed through a heat process (drive-in). Examples of n-type impurities include phosphorus (P), arsenic (As), and the like.

Figure 27E:
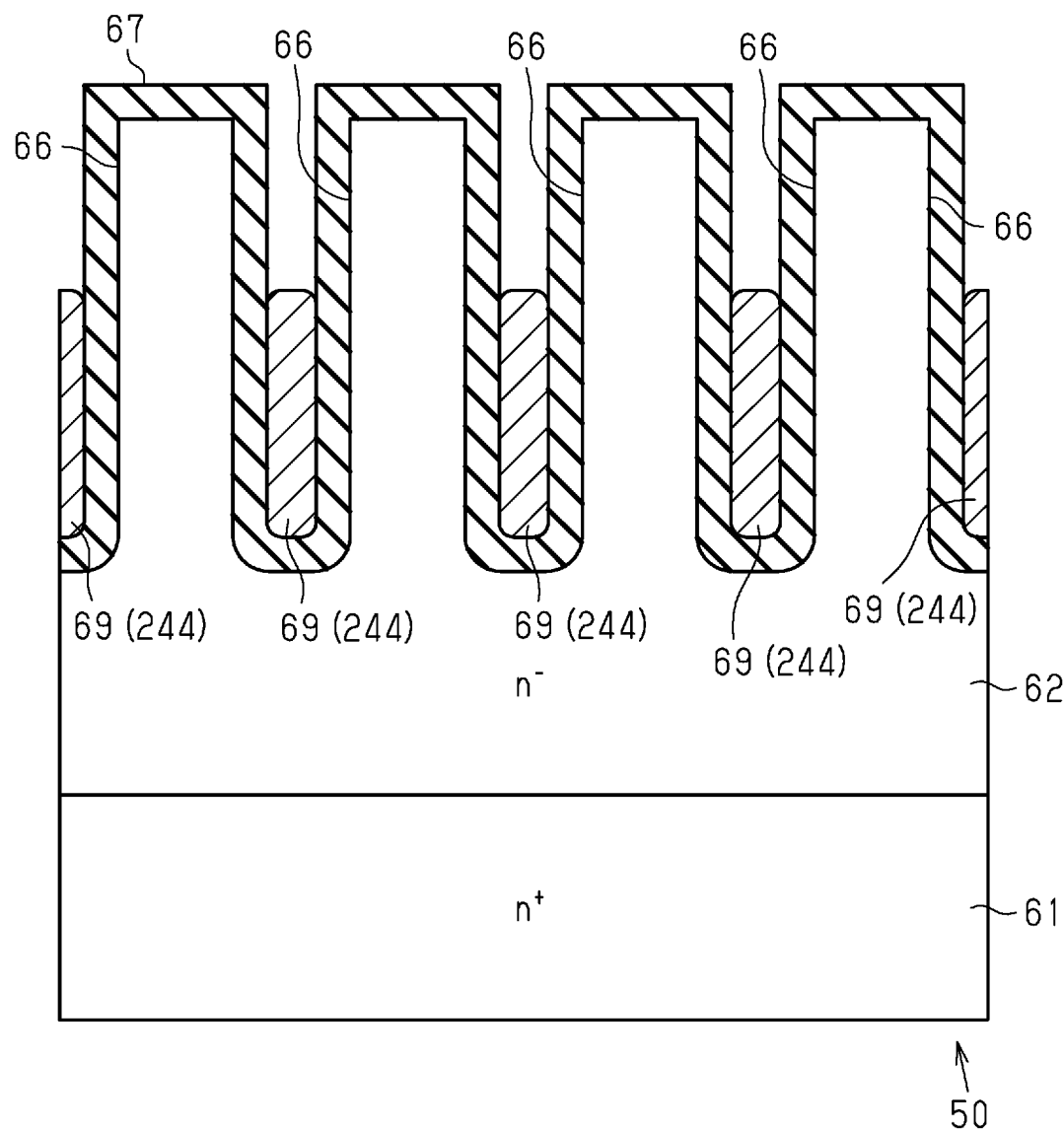
FIG. 27E is a diagram showing a step following FIG. 27D.

Then, as shown in FIG. 27E, the polysilicon film 244 is etched. The etching of the polysilicon film 244 is continued until the etched surface reaches an intermediate part of each trench 66 in a depth direction. This forms the embedded electrode 69 with the remaining polysilicon film 244 in the trenches 66.

Figure 27F:
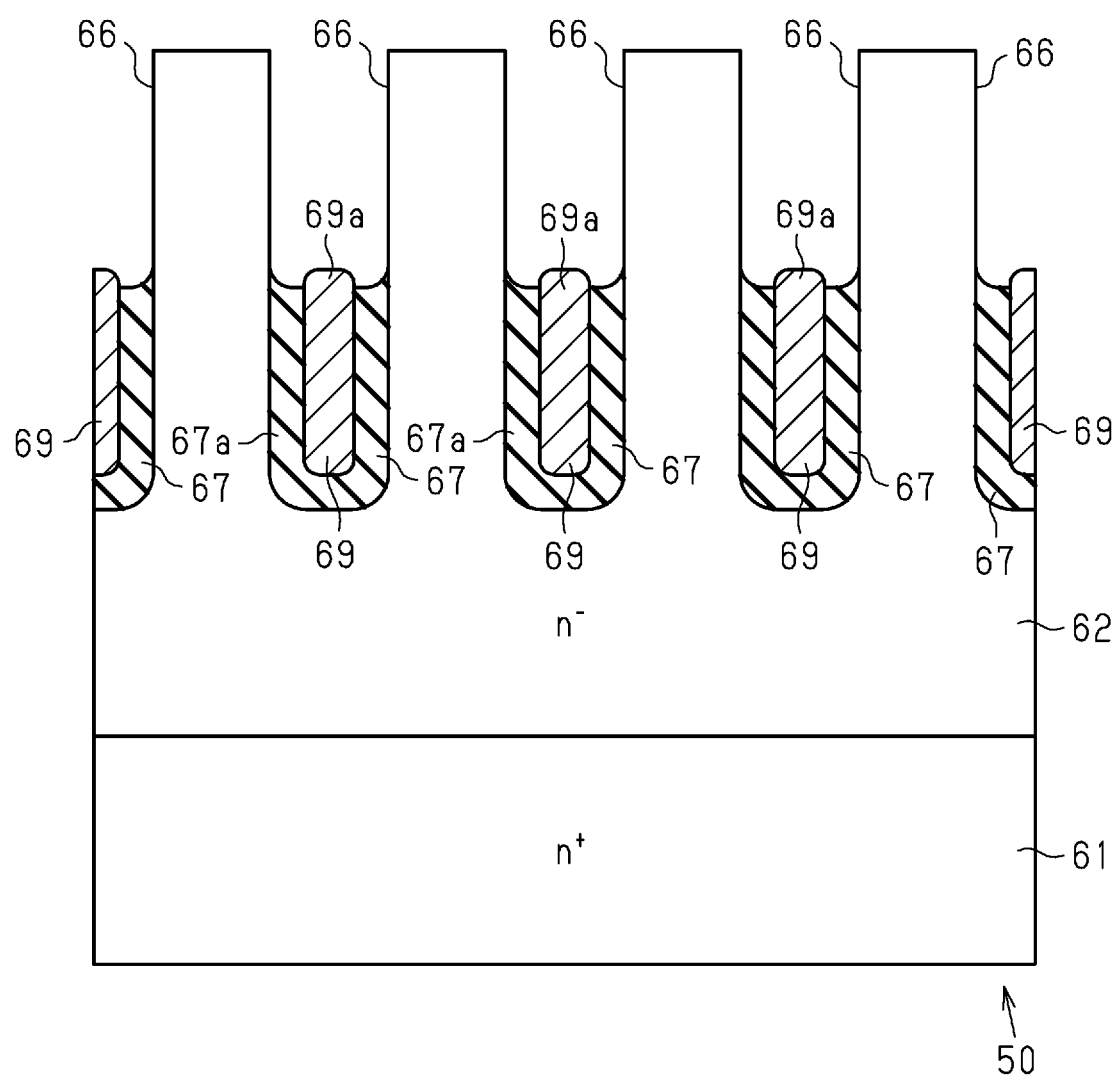
FIG. 27F is a diagram showing a step following FIG. 27E.

Then, as shown in FIG. 27F, the thick gate insulation film 67 located between the opening of each trench 66 and the upper end 69a of the embedded electrode 69 is etched. The thick gate insulation film 67 is removed so as to be left on part of the wall surface in each trench 66. Part of the upper end 69a of the embedded electrode 69 is exposed from the thick gate insulation film 67. In this case, the etching that is performed may be wet etching.

Figure 27G:
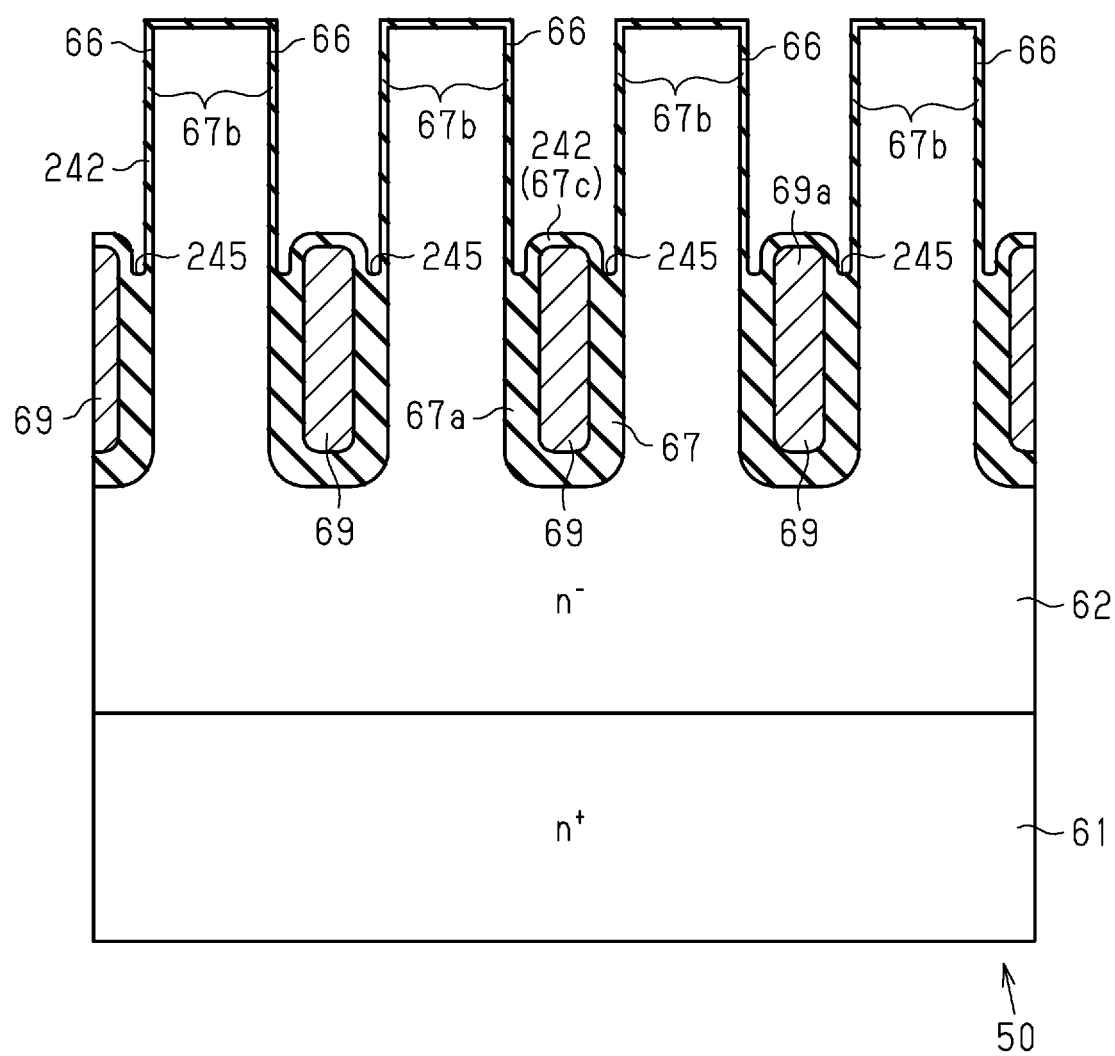
FIG. 27G is a diagram showing a step following FIG. 27F.

As shown in FIG. 27G, a thermal oxidation process is formed on the substrate 50 to form the thermal oxidation film 242 on the exposed side surfaces of the trenches 66 and the surface of the substrate 50. At the same time, the part of the upper end 69a exposed from the embedded electrode 69 is also oxidized to form the thermal oxidation film 242. The rate of oxidation is higher at the upper end 69a of the embedded electrode 69 than the exposed surface in the trench 66 because of the polysilicon including impurities. This forms a relatively thick thermal oxidation film 242. In this step, the thick film portion 67a of the gate insulation film 67 and the thin film portion 67b form a recess 245 between the upper end 69a of the embedded electrode 69 and the side surface of the trench 66.

Figure 27H:
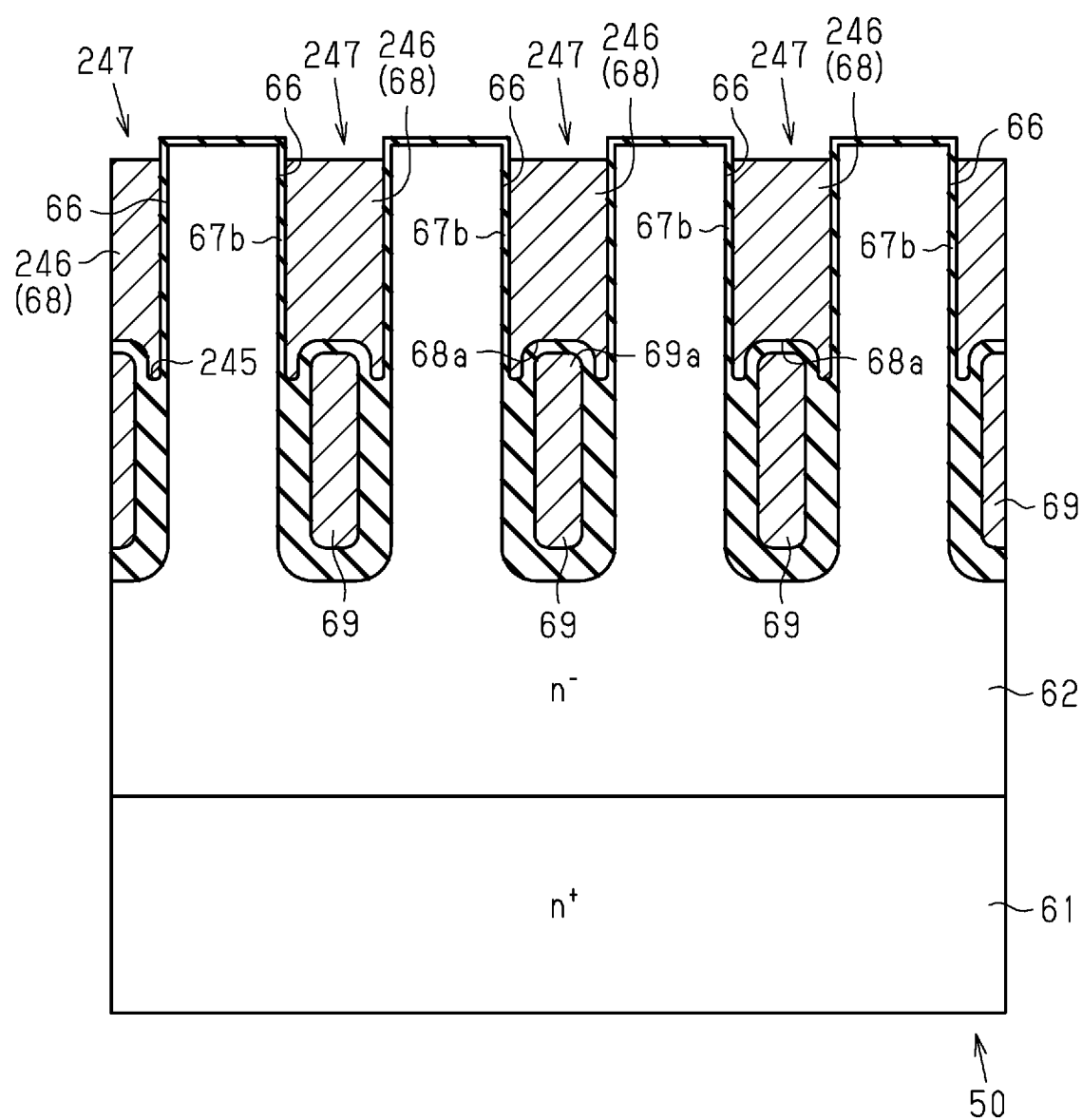
FIG. 27H is a diagram showing a step following FIG. 27G.

Then, as shown in FIG. 27H, a polysilicon film 246, which serves as a conductor, is deposited on the substrate 50. The polysilicon film 246 fills the trenches 66 and covers the surface of the substrate 50. The polysilicon film 246 enters the recess 245 in each trench 66 and forms a downwardly extending projection with the upper end 69a of the embedded electrode 69 in the trench 66 to form the recess 68a that opens toward the embedded electrode 69. Afterwards, n-type impurities are implanted in the polysilicon film 246 and dispersed through a heat process (drive-in). Then, the polysilicon film 246 is etched.

The etching of the polysilicon film 246 is continued until the etched surface is located slightly inward from the substrate 50 in the trench 66. This forms the gate electrode 68 with the remaining polysilicon film 246 in each trench 66. A recess 247 is formed above the gate electrode 68.

Figure 27I:
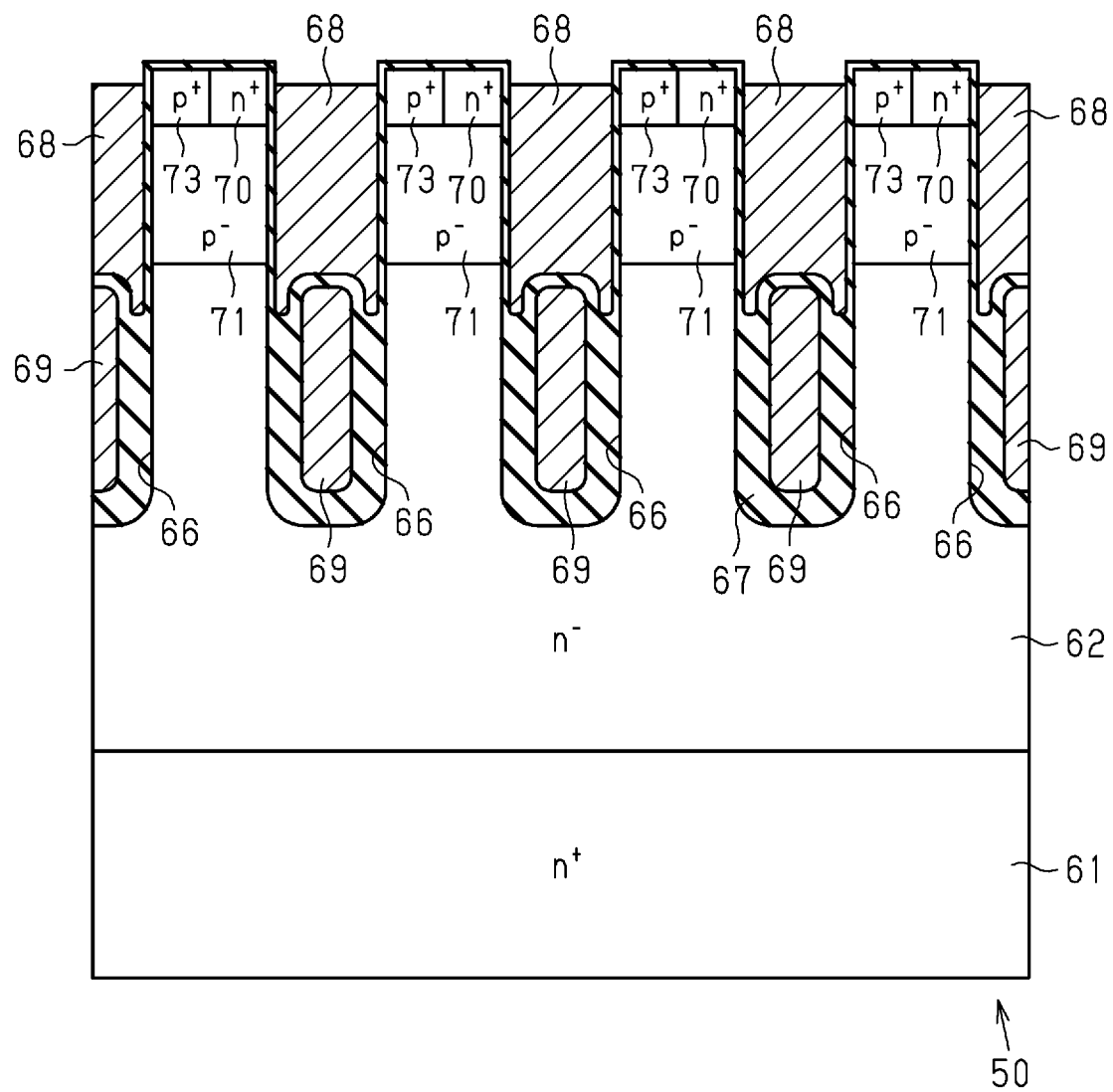
FIG. 27I is a diagram showing a step following FIG. 27H.
Figure 27J:
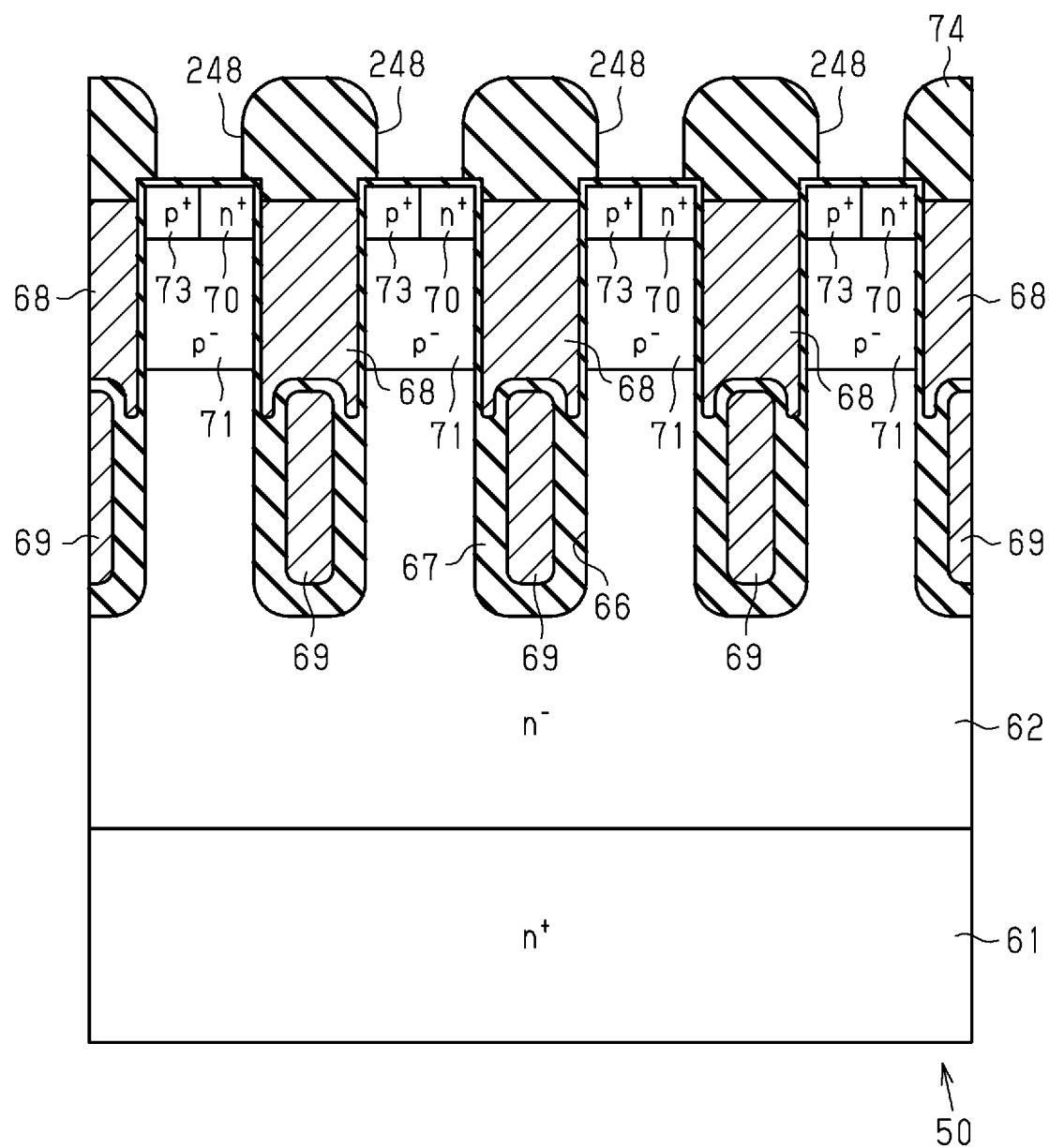
FIG. 27J is a diagram showing a step following FIG. 27I.

As shown in FIG. 27I, an ion implantation mask (not shown) selectively opened at regions where the body regions 71 are formed is applied to the substrate 50. Then, p-type impurities are implanted through the ion implantation mask in the outermost part of the epitaxial layer 62. This forms the body regions 71 in the outermost part of the epitaxial layer 62. After the body regions 71 are formed, the ion implantation mask is removed. Then, n-type impurities and p-type impurities are implanted in the substrate 50. Afterwards, the implanted n-type impurities are dispersed through a heat process (drive-in). This forms the n+ type source regions 70 and the p+ type body contact regions 73. Then, as shown in FIG. 27J, by performing, for example, a CVD process, a silicon nitride film and a silicon oxide film are sequentially deposited. This forms the interlayer insulation film 74.

The source regions 70 are formed by implanting n-type impurities through the ion implantation mask selectively opened at regions where the source regions 70 are to be formed. This selectively forms the source regions 70 that have a relatively small percentage in the area occupied per unit area and the source regions 70 that have a relatively large percentage in the area occupied per unit area in a plan view. That is, the first functional element formation regions 232 (first functional element formation region units U1), the second functional element formation regions 233 (second functional element formation region units U2), and the third functional element formation regions 234 (third functional element formation region units U3) are formed.

Further, the body contact regions 73 are formed by implanting p-type impurities through the ion implantation mask selectively opened at regions where the body contact regions 73 are to be formed.

Figure 27K:
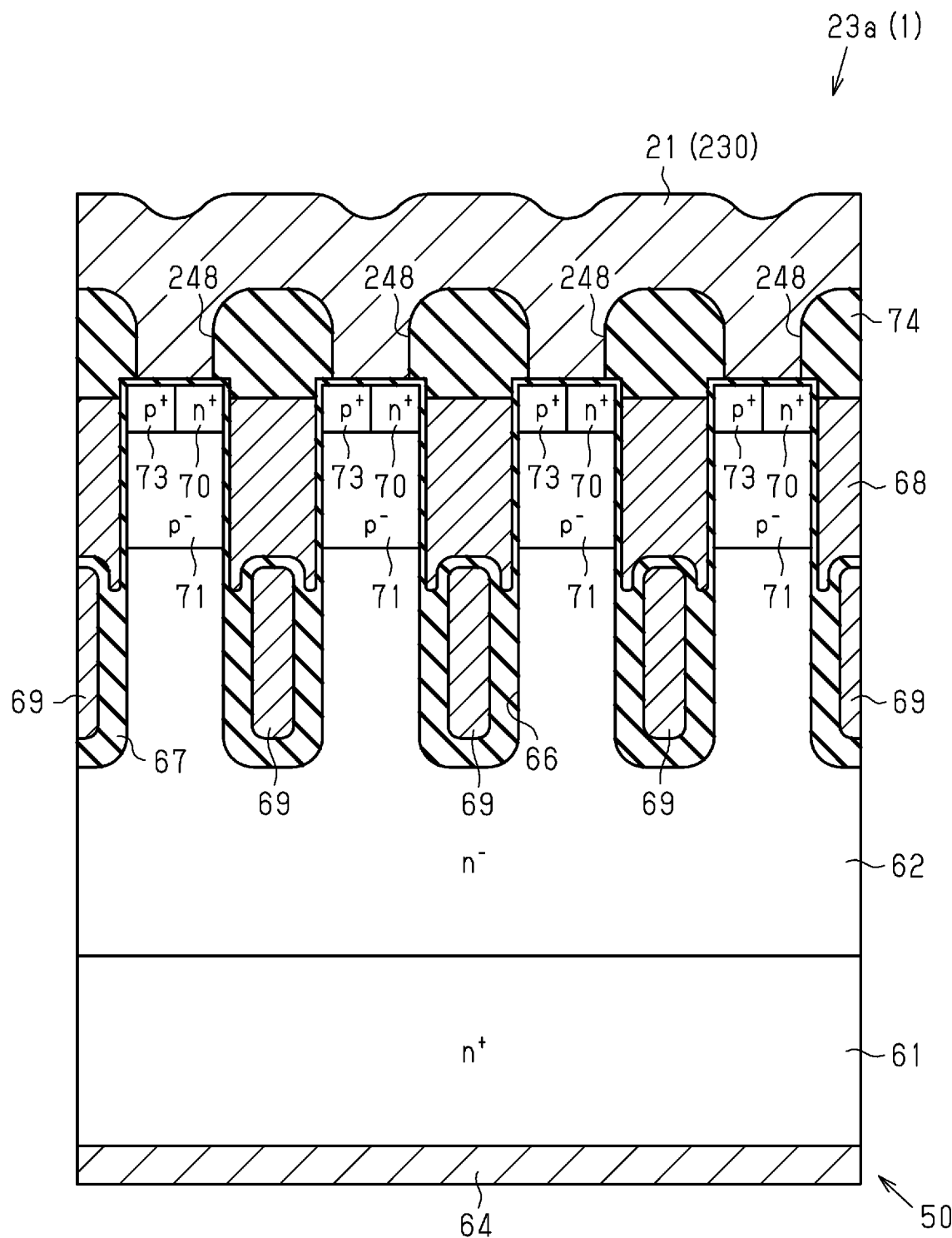
FIG. 27K is a diagram showing a step following FIG. 27J.

Then, reactive ion etching (RIE) is performed to selectively etch the interlayer insulation film 74 and form the contact holes 248. Further, as shown in FIG. 27K, after embedding the contacts 81 and 83 (not shown in FIG. 27K) in the contact holes 248, an electrode film (not shown) is formed covering the regions on the substrate 50. The electrode film is patterned to form the source pad 21 (source metal 230) and the gate pad 22 (refer to FIG. 5). Further, an electrode film (not shown) is formed to cover the semiconductor substrate 61 of the substrate 50. The electrode film is patterned to form the drain electrode 64. The semiconductor device 1 (MISFET 23a) is obtained through the steps described above.

The present embodiment has the advantages described below.

(4-1) The first functional element formation region units U1 that generate a small amount of heat and have a large active clamp capacity Eac are formed in the active region 29 where the generation of heat has to be limited. This limits increases in the temperature of the active region 29 and avoids situations in which the temperature becomes high locally and transiently in regions in the active region 29 where the generation of heat has to be limited. Further, since the first functional element formation region units U1 are arranged in the active region 29, the active clamp capacity Eac can easily be increased as compared to a structure in which the active region 29 includes the second functional element formation region units U2 and the third functional element formation region units U3.

(4-2) The second functional element formation region units U2 or the third functional element formation region units U3, in which the percentage of the area occupied by the channel formation region 72 per unit area is greater than the first functional element formation region units U1, is arranged in a region other than regions where the generation of heat has to be limited in the active region 29, for example, in an outer region of the active region 29. As a result, the channel formation regions 72 have a larger area than the first functional element formation region units U1, and a current path having a large area is obtained. Thus, even when the first functional element formation region units U1 are used together, a reduction in the current path relative to the entire active region 29 is limited. Thus, by using regions other than regions where the generation of heat needs to be limited in the active region 29, an increase in the ON resistance of the semiconductor element 20 can be limited.

(4-3) In the active region 29, the second functional element formation region units U2, which generate a small amount of heat and have a small active clamp capacity Eac, are arranged in regions corresponding to locations where the first wire 41 is connected to the source pad 21. This transfers the heat of the active region 29 through the source pad 21 to the first wire 41. Thus, an increase in temperature is limited in the active region 29 at a region corresponding to a location where the first wire 41 is connected to the source pad 21. As a result, by using the second functional element formation region units U2, which generate a large amount of heat, an increase in the ON resistance of the semiconductor element 20 is limited.

(4-4) The active region 29 includes the first functional element formation region units U1, the second functional element formation region units U2, and the third functional element formation region units U3. This facilitates adjustment of the ON resistance and active clamp capacity Eac of the semiconductor element 20 in comparison with when the active region 29 includes, for example, two types of functional element formation region units.

Further, in part of the active region 29, the third functional element formation region units U3 are arranged between the first functional element formation region units U1 and the second functional element formation region units U2. This limits sudden changes in the ON resistance and active clamp capacity Eac.

Modified Examples

The description related with the above embodiments exemplifies, without any intention to limit, applicable forms of a semiconductor device according to the present disclosure. The semiconductor device according to the present disclosure is applicable to, for example, modified examples of the above embodiments that are described below and combinations of at least two of the modified examples that do not contradict each other.

Combinations of Embodiments

The second embodiment may be combined with the third embodiment. More specifically, the structure of the interlayer insulation film 74, the first source electrode 80, and the second source electrode 82 immediately below the source pad 21 of the semiconductor device 1 in accordance with the second embodiment can be replaced by the structure of the interlayer insulation film 74, the first source electrode 80, and the second source electrode 82 in accordance with the third embodiment.

The third embodiment may be combined with the fourth embodiment. More specifically, the active region 29 of the semiconductor device 1 in accordance with the third embodiment may be replaced by a structure including the functional element formation regions 231 that differ in the percentage of the area occupied by the channel formation region 72 per unit area.

Addition of Heat Dissipation Member

Figure 28A:
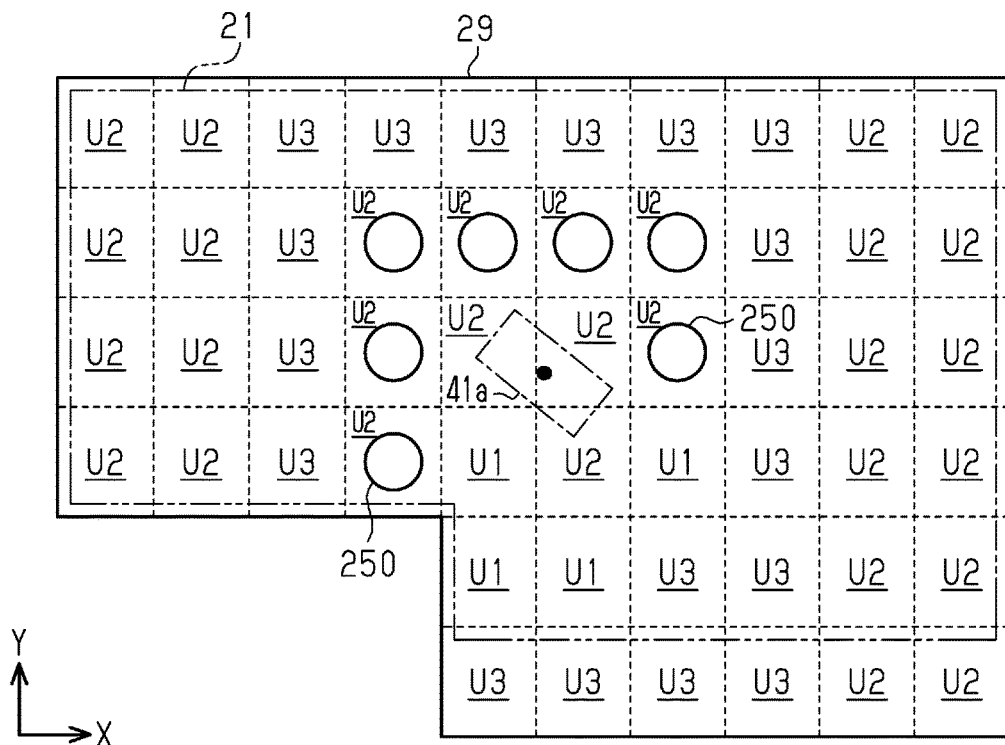
FIG. 28A is a schematic plan view showing an active region and a source pad of a semiconductor element in a semiconductor device according to a modified example.
Figure 28B:
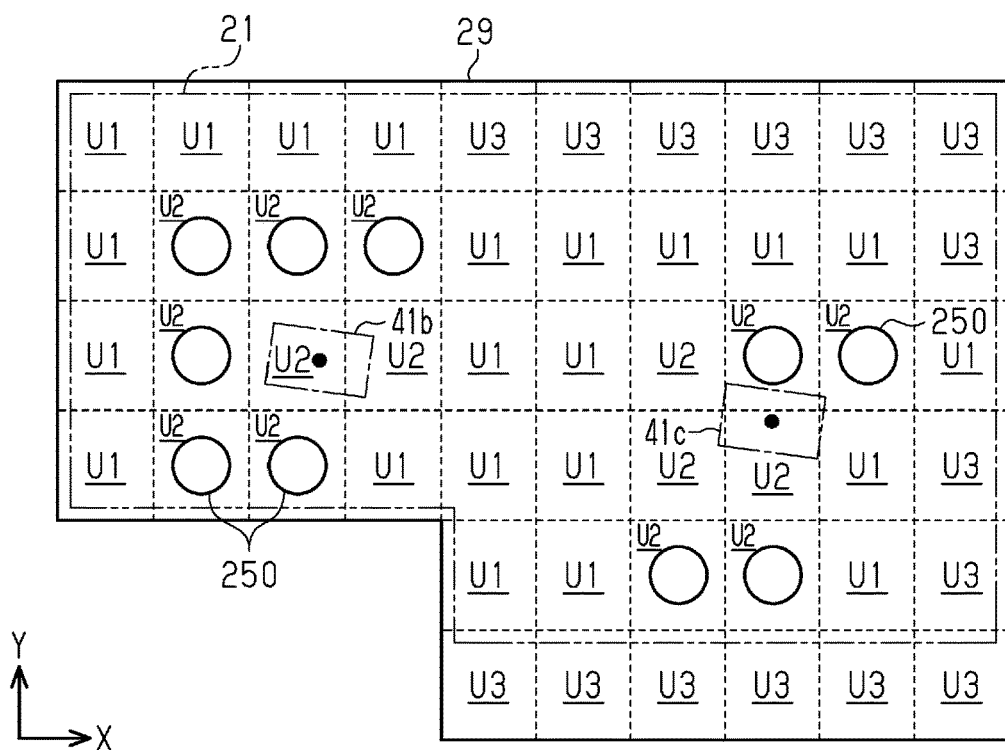
FIG. 28B is a schematic plan view showing the active region and the source pad of the semiconductor element.

To increase the active clamp capacity Eac, the heat dissipation of the semiconductor device 1 has to be increased. In each of the above embodiments, a heat dissipation member 250 can be connected to the source pad 21 to increase the heat dissipation of the semiconductor device 1. In one example, as shown in FIGS. 28A and 28B, multiple heat dissipation members 250 are connected to the source pad 21. FIG. 28A shows a layout of the heat dissipation members 250 when the first wire 41 is connected to the source pad 21 at one location, and FIG. 28B shows a layout of the heat dissipation members 250 when the first wire 41 is connected to the source pad 21 at two locations.

As shown in FIGS. 28A and 28B, the heat dissipation members 250 are connected to a region of the source pad 21 corresponding to where the generation of heat is to be limited in the active region 29. In detail, in FIG. 28A, the heat dissipation members 250 is connected to a region of the source pad 21 corresponding to the inner region of the active region 29. More specifically, the heat dissipation members 250 are laid out to surround part of the connection portion 41a of the first wire 41 (single-dashed lines). To avoid interference with the first wire 41, the heat dissipation members 250 are not laid out in the direction in which the first wire 41 extends.

In FIG. 28B, the first connection portion 41b and the second connection portion 41c (both shown by single-dashed lines) at the ends of the first wire 41 are surrounded by the heat dissipation members 250. To avoid interference with the first wire 41, the heat dissipation members 250 are not laid out in the direction in which the first wire 41 extends. The heat dissipation members 250 are connected to regions of the source pad 21 adjacent to the first wire 41 in the vertical direction Y in the inner region of the active region 29, that is, in the region between the first connection portion 41b and the second connection portion 41c of the first wire 41 in the active region 29.

Such heat dissipation members 250 are formed be connecting a wire to the source pad 21 through wedge bonding or ball bonding. Thus, the heat dissipation members 250 are shaped identically to the connection portions when a wire is connected. The heat dissipation member 250 is formed from, for example, copper or aluminum. Further, for example, the heat dissipation members 250 may be formed by connecting the first wire 41 to the source pad 21.

Figure 29:
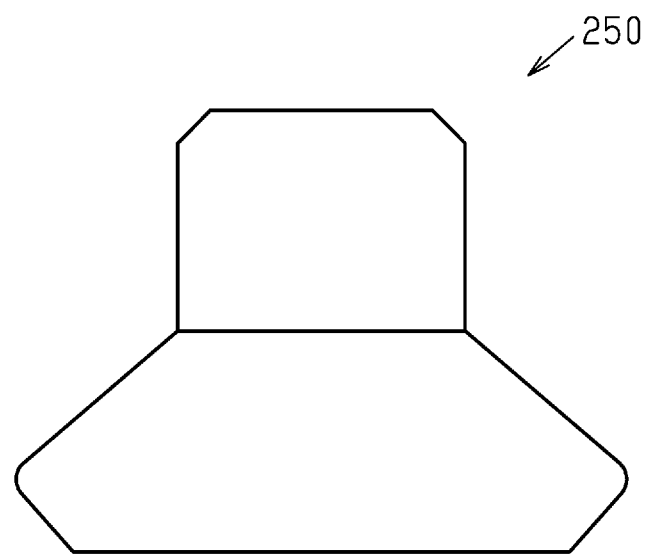
FIG. 29 is a side of a heat dissipation member arranged on the semiconductor element of FIGS. 28A and 28B.

FIG. 29 shows one example of the heat dissipation member 250. The heat dissipation member 250 shown in FIG. 29 shows a case where a wire is connected to the source pad 21 through ball bonding.

Further, FIGS. 28A and 28B show examples of the heat dissipation member 250. The layouts may be freely changed. For example, the heat dissipation members 250 can be connected to at least one of the regions of the source pad 21 corresponding to the regions where the third functional element formation region units U3 are laid out in the active region 29 shown in FIGS. 28A and 28B.

In the first to third embodiments, one or more heat dissipation members 250 may be connected onto the source pad 21. This increases heat dissipation of the semiconductor device 1 via the source pad 21. Thus, the active clamp capacity Eac can be increased.

Connection Position of Connection Member

In the first embodiment, as shown in FIG. 7, the first wire 41, which serves as the connection member, and the source pad 21 are connected to each other at a position on the line segment LA, which connects the center of gravity position GA1 of the first region RA1 and the center of gravity position GA2 of the second region RA2. The first wire 41 and the source pad 21 may be connected to each other at two locations, the center of gravity position GA1 of the first region RA1 and the center of gravity position GA2 of the second region RA2.

Shape and Center of Gravity Position of Active Region

In each of the above embodiments, the shape of the active region 29 can be freely changed. The active region 29 can be changed as described below in sections (A) to (C). The center of gravity position of the active region 29 will also be described in sections (A) to (C).

Figure 30A:
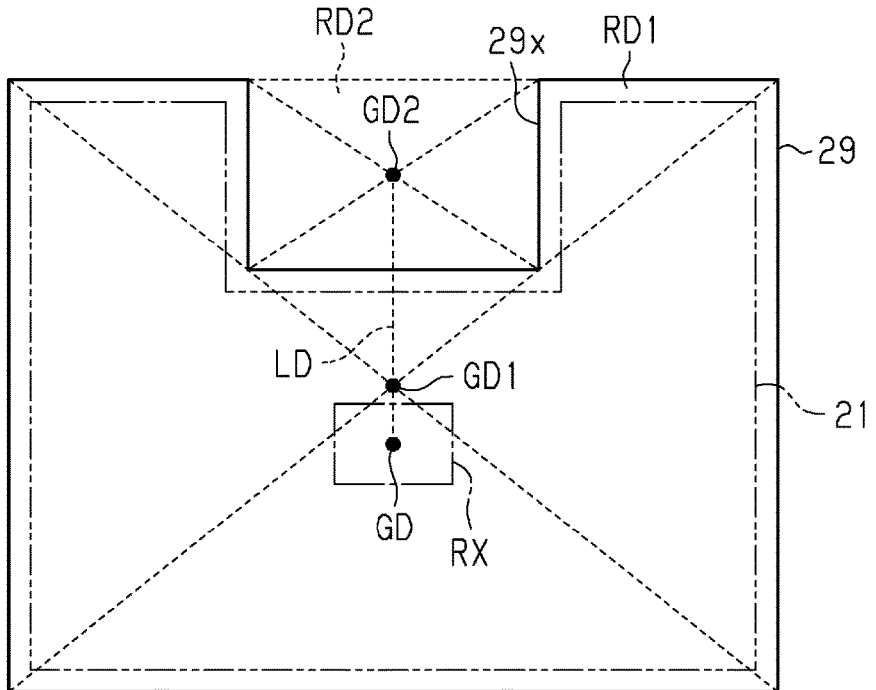
FIG. 30A is a schematic plan view showing an active region and a source pad of a semiconductor element in a semiconductor device according to a modified example.
Figure 30B:
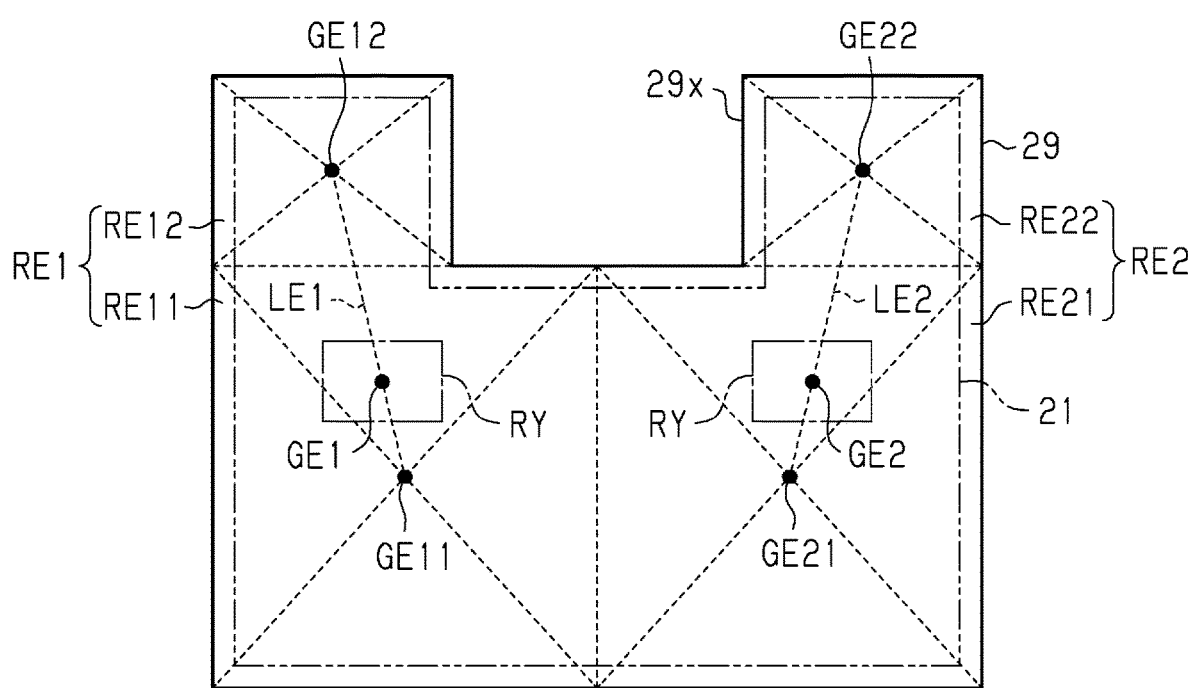
FIG. 30B is a schematic plan view showing the active region and the source pad of the semiconductor element.

(A) As shown in FIGS. 30A and 30B, the active region 29 has a recessed shape. FIG. 30A shows a case where the first wire 41 is connected to the source pad 21 at one location. As shown in 30A, the active region 29 is divided into a rectangular first region RD1, which extends over a recess 29x, and a second region RD2, which corresponds to the rectangular recess 29x. Then, a center of gravity position GD1 of the first region RD1 and a center of gravity position GD2 of the second region RD2 are obtained. As shown in FIG. 30A, the first region RD1 and the second region RD2 are rectangular. Thus, the center of gravity position GD1 of the first region RD1 is the intersection point of the diagonals of the first region RD1, and the center of gravity position GD2 of the second region RD2 is the intersection point of the diagonals of the second region RD2. Then, the area SD1 of the first region RD1 and the area SD2 of the second region RD2 are obtained. In a line segment LD connecting the center of gravity position GD1 and the center of gravity position GD2, a center of gravity position GD of the active region 29 is obtained from the relationship of the distance DD1 between the center of gravity position GD1 and the center of gravity position GD of the active region 29, the distance DD2 between the center of gravity position GD2 and the center of gravity position GD of the active region 29, the area SD1 of the first region RD1, and the area SD2 of the second region RD2. More specifically, the ratio of the distance DD2 to the distance DD1 (DD2/DD1) and the inverse proportion of the ratio of the area SD2 of the second region RD2 to the area SD1 of the first region RD1 (SD1/SD2) are equal (DD2/DD1=SD1/SD2). Accordingly, the center of gravity position GD of the active region 29 is obtained by obtaining at least one of the distances DD1 and DD2. Further, as shown in FIG. 30A, the source pad 21 is arranged over the center of gravity position GD of the active region 29.

Region RX shown by the single-dashed lines in FIG. 30A indicates a tool head (hereinafter, referred to as the wedge RX) used when ultrasonic-bonding the first wire 41 to the source pad 21 with a wedge bonding device (not shown). The wedge bonding device moves the wedge RX to position the wedge RX above the center of gravity position GD of the active region 29. The end of the first wire 41, which is passed through the wedge RX, is connected and superimposed with the center of gravity position GD of the active region 29. More specifically, the region where the first wire 41 contacts the source pad 21 includes the center of gravity position GD of the active region 29. In FIG. 30A, the center position of the region (wedge RX) where the first wire 41 contacts the source pad 21 coincides with the center of gravity position GD of the active region 29. In this modified example, the region (wedge RX) where the first wire 41 contacts the source pad 21 only needs to include the center of gravity position GD of the active region 29, and the center position of the region (wedge RX) where the first wire 41 contacts the source pad 21 may differ from the center of gravity position GD of the active region 29.

Figure 31A:
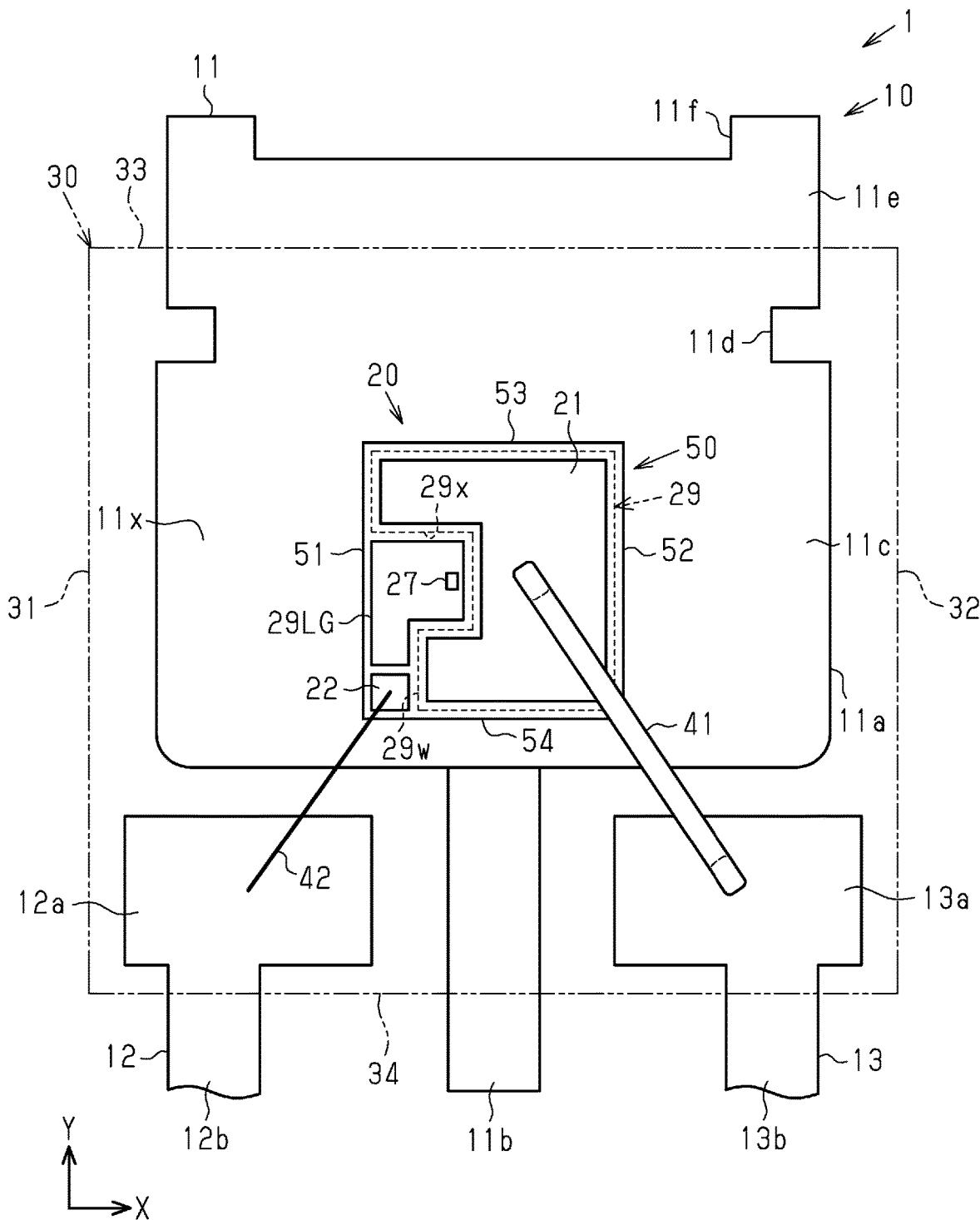
FIG. 31A is a schematic plan view showing the internal structure of a semiconductor device including the semiconductor element of FIG. 30A.

FIG. 31A shows one example of the semiconductor device 1 using the active region 29 of FIG. 30A and the region (wedge RX) where the first wire 41 contacts the source pad 21. As shown in FIG. 31A, in comparison with the active region 29 of FIG. 30A, part of the active region 29 is cut out to form the gate pad 22. However, the center position of the region (wedge RX) where the first wire 41 contacts the source pad 21 coincides with the center of gravity position GD of the active region 29 in the same manner. Further, as shown in FIG. 31A, the recess 29x of the active region 29 is formed to be recessed in the horizontal direction X. The control circuitry region 29LG is formed over a cutout portion 29w, which is where the gate pad 22 is formed, and the recess 29x in the active region 29. Further, the temperature sensor 27 is arranged at a position located in the recess 29x at a middle part in the vertical direction Y and adjacent to a bottom surface 29xa of the recess 29x in the horizontal direction X. As shown in FIG. 31A, the temperature sensor 27 is arranged at a position separated from the first wire 41 in a plan view, that is, a position located closer to the gate pad 22 than the first wire 41 in the horizontal direction X.

FIG. 30B shows a case where the first wire 41 is connected to the source pad 21 at two locations. As shown in FIG. 30B, the active region 29 is divided into two regions (first region RE1 and second region RE2) having equal areas. As shown in FIG. 30B, the first region RE1 and the second region RE2 are substantially L-shaped. Then, a center of gravity position GE1 of the first region RE1 and a center of gravity position GE2 of the second region RE2 are obtained. The first region RE1 is divided into two rectangular regions, namely, a first divided region RE11 and a second divided region RE12. Then, a center of gravity position GE11 of the first divided region RE11 and a center of gravity position GE12 of the second divided region RE12 are obtained. The first divided region RE11 is rectangular. Thus, the intersection point of the diagonals of the first divided region RE11 is the center of gravity position GE11 of the first divided region RE11. The second divided region RE12 is rectangular. Thus, the intersection point of the diagonals of the second divided region RE12 is the center of gravity position GE12 of the second divided region RE12. Then, the area SE1 of the first divided region RE11 and the area SE2 of the second divided region RE12 are obtained. In a line segment LE1 connecting the center of gravity position GE11 and the center of gravity position GE12, the center of gravity position GE1 of the first region RE1 is obtained from the relationship of the distance DE1 between the center of gravity position GE11 and the center of gravity position GE1, the distance DE2 between the center of gravity position GE12 and the center of gravity position GE1, the area SE1 of the first divided region RE11, and the area SE2 of the second divided region RE12. More specifically, the ratio of the distance DE2 to the distance DE1 (DE2/DE1) and the inverse proportion of the ratio of the area SE2 of the second divided region RE12 to the area SE1 of the first divided region RE11 (SE1/SE2) are equal (DE2/DE1=SE1/SE2). Thus, at least one of the distances DE1 and DE2 is obtained to obtain the center of gravity position GE1 of the first region RE1. With regard to the second region RE2, in the same manner as when the center of gravity position GE1 of the first region RE1 is obtained, in a line segment LE2 connecting a center of gravity position GE21 of a first divided region RE21 and a center of gravity position GE22 of a second divided region RE22, the center of gravity position GE2 is obtained from the area SE21 of the first divided region RE21 and the area SE22 of the second divided region RE22. Further, as shown in FIG. 30B, the source pad 21 is arranged to cover the center of gravity positions GE1 and GE2 (center of gravity position GE1 of first region RE1 and center of gravity position GE2 of second region RE2) in the divided active region 29.

Two regions RY shown by the single-dashed lines in FIG. 30B indicates a tool head (hereinafter, referred to as the wedge RY) used when ultrasonic-bonding the first wire 41 to the source pad 21 with a wedge bonding device (not shown). The wedge bonding device moves the wedge RY to position the wedge RY above the center of gravity position GE1 of the first region RE1 in the active region 29 and connects the first wire 41 to the source pad 21. This connects and superimposes the end of the first wire 41, which is passed through the wedge RY, with the center of gravity position GB1 of the first region RB1. More specifically, the first connection portion 41b of the first wire 41 connected to the source pad 21 includes the center of gravity position GE1 of the first region RE1. In FIG. 30B, the center position of the first connection portion 41b coincides with the center of gravity position GE1 of the first region RE1. Then, the wedge bonding device separates the wedge RY from the source pad 21 to separate the first wire 41 from the source pad 21. Further, the wedge bonding device moves the wedge RY to position the wedge RY above the center of gravity position GB2 of the second region RB2 in the active region 29 and connects the first wire 41 to the source pad 21. This connects and superimposes the first wire 41, which is passed through the wedge RY, with the center of gravity position GE2 of the second region RE2. More specifically, the second connection portion 41c of the first wire 41 connected to the source pad 21 includes the center of gravity position GE2 of the second region RE2. In FIG. 30B, the center position of the second connection portion 41c coincides with the center of gravity position GE2 of the second region RE2. In this modified example, the first connection portion 41b only needs to include the center of gravity position GE1 of the first region RE1, and the center position of the first connection portion 41b may differ from the center of gravity position GE1 of the first region RE1. Further, the second connection portion 41c only needs to include the center of gravity position GE2 of the second region RE2, and the center position of the second connection portion 41c may differ from the center of gravity position GE2 of the second region RE2.

Figure 31B:
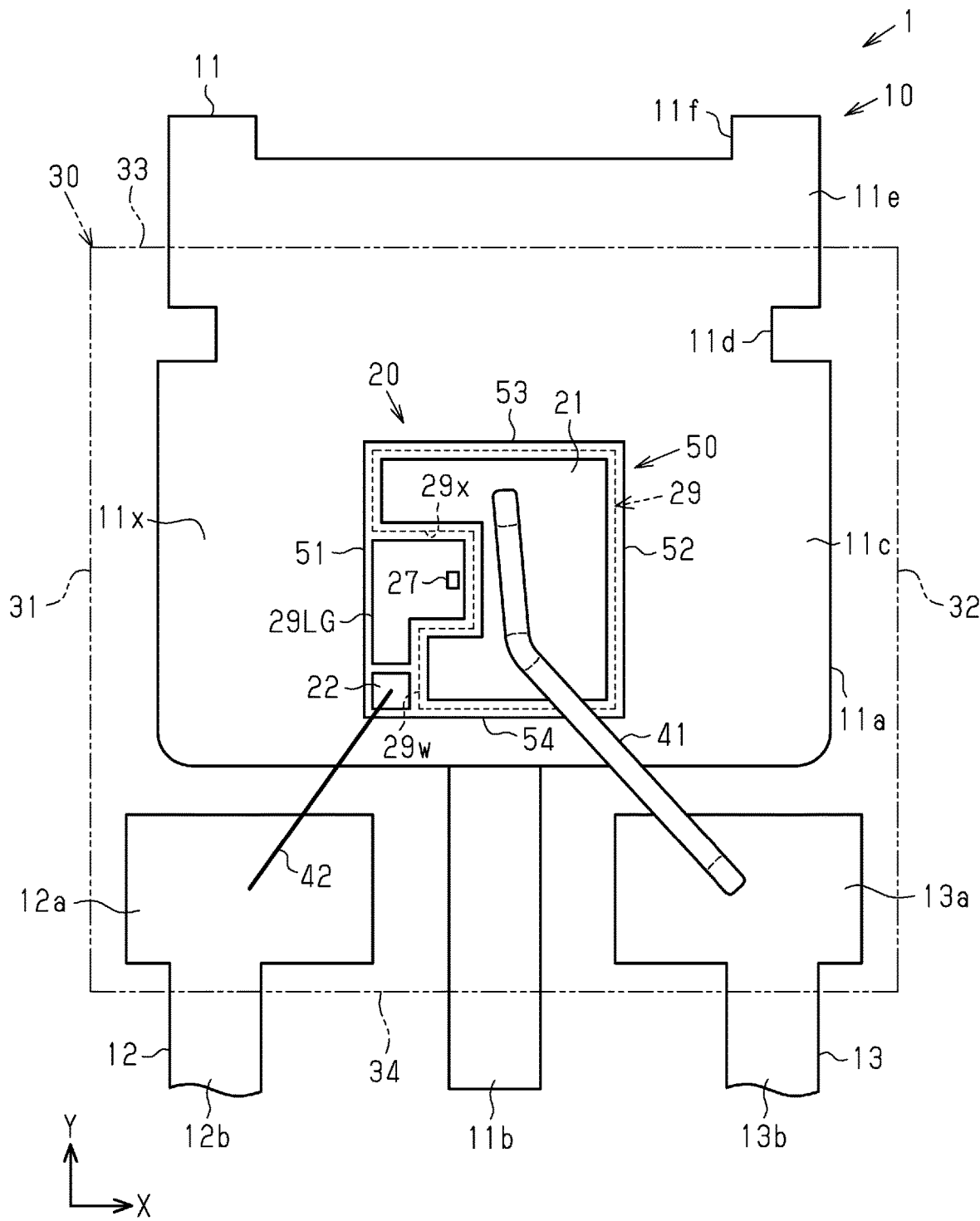
FIG. 31B is a schematic plan view showing the internal structure of a semiconductor device including the semiconductor element of FIG. 30B.

FIG. 31B shows one example of the semiconductor device 1 using the active region 29 of FIG. 30B and the region (wedge RX) where the first wire 41 contacts the source pad 21. The shape of the active region 29, the shape of the control circuitry region 29LG, and the position of the temperature sensor 27 are the same as FIG. 31A. As shown in FIG. 31B, the temperature sensor 27 is arranged at a position separated from the first wire 41 in a plan view, that is, a position located closer to the gate pad 22 than the first wire 41 in the horizontal direction X.

Figure 31C:
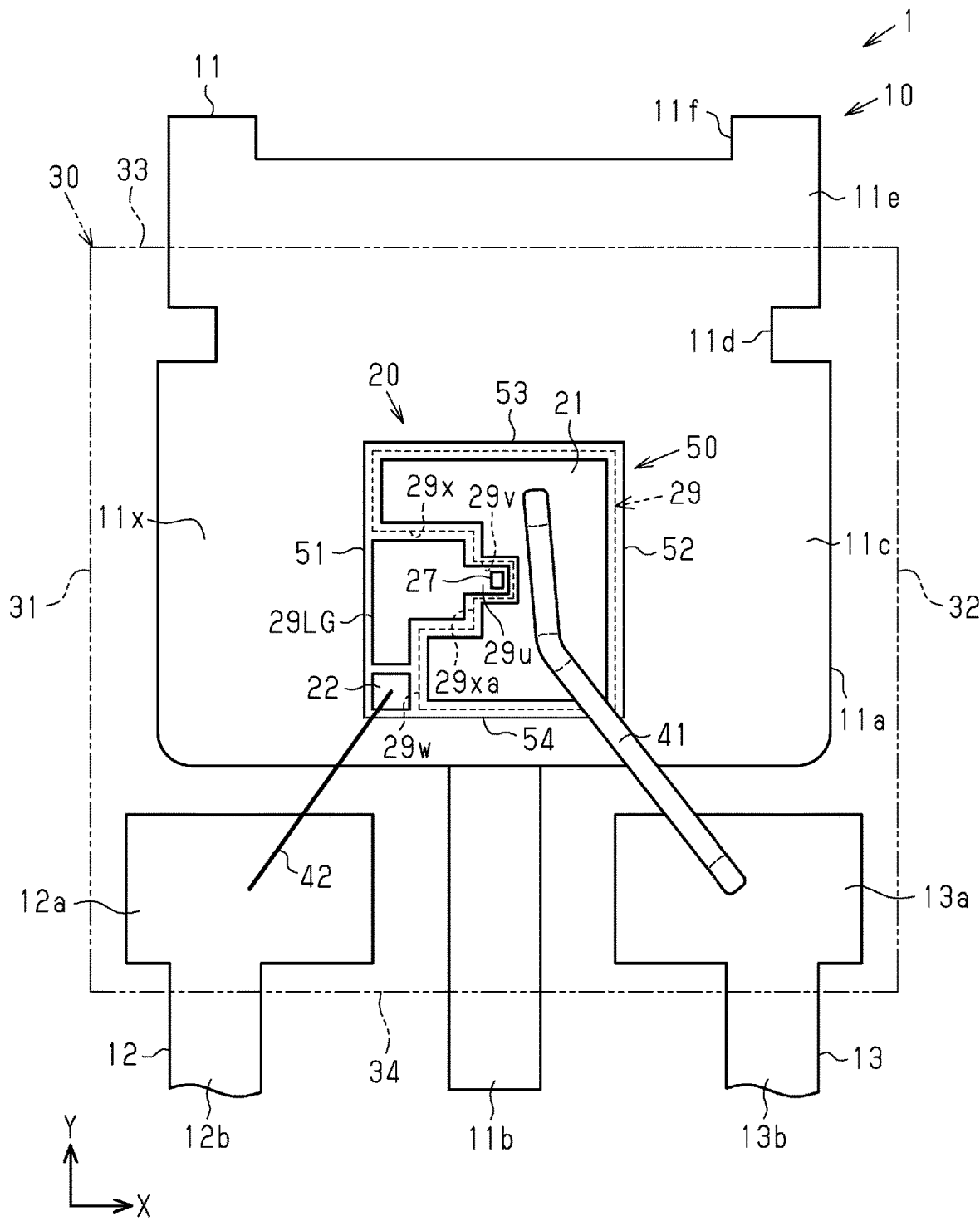
FIG. 31C is a schematic plan view showing the internal structure of a semiconductor device including the semiconductor element of FIG. 30B.

The position of the temperature sensor 27 is not limited to the positions shown in FIGS. 31A and 31B and may be freely changed. In one example, as shown in FIG. 31C, the temperature sensor 27 may be arranged close to a region where the temperature becomes the highest in the active region 29 when the semiconductor element 20 is driven. More specifically, the active region 29 shown in FIG. 31C includes a second recess 29v recessed from a central portion with respect to the vertical direction Y of the bottom surface 29xa of the recess 29x in the horizontal direction X. The control circuitry region 29LG includes a projection 29u that extends into the second recess 29v. The temperature sensor 27 is arranged on the distal end of the projection 29u. As shown in FIG. 31C, the temperature sensor 27 is arranged at a position separated from the first wire 41 in a plan view, that is, a position located closer to the gate pad 22 than the first wire 41 in the horizontal direction X.

Figure 32A:
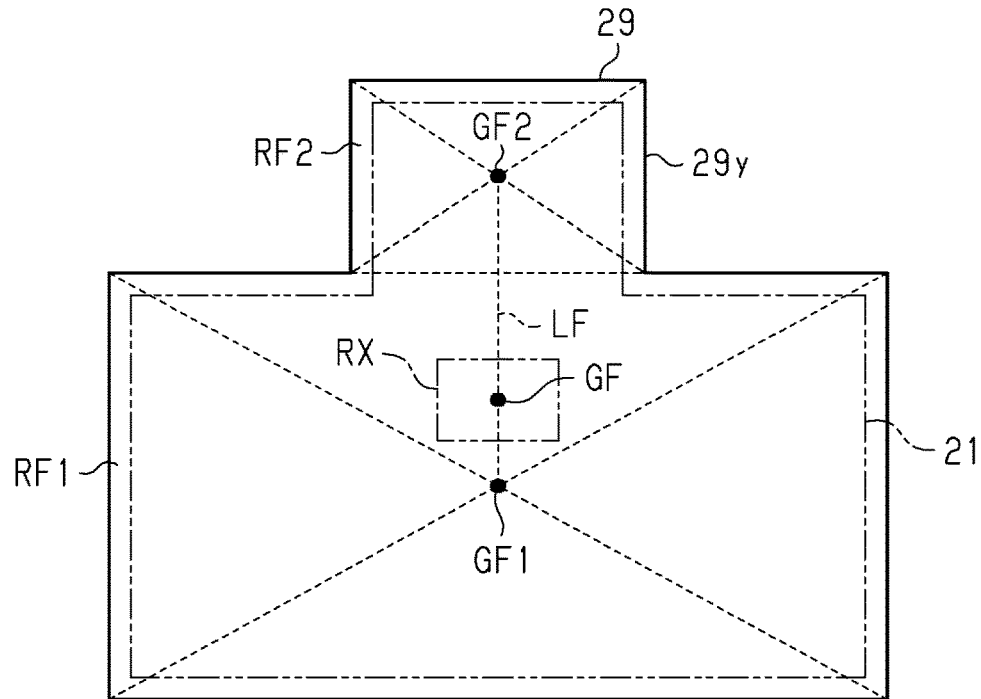
FIG. 32A is a schematic plan view showing an active region and a source pad of a semiconductor element in a semiconductor device according to a modified example.
Figure 32B:
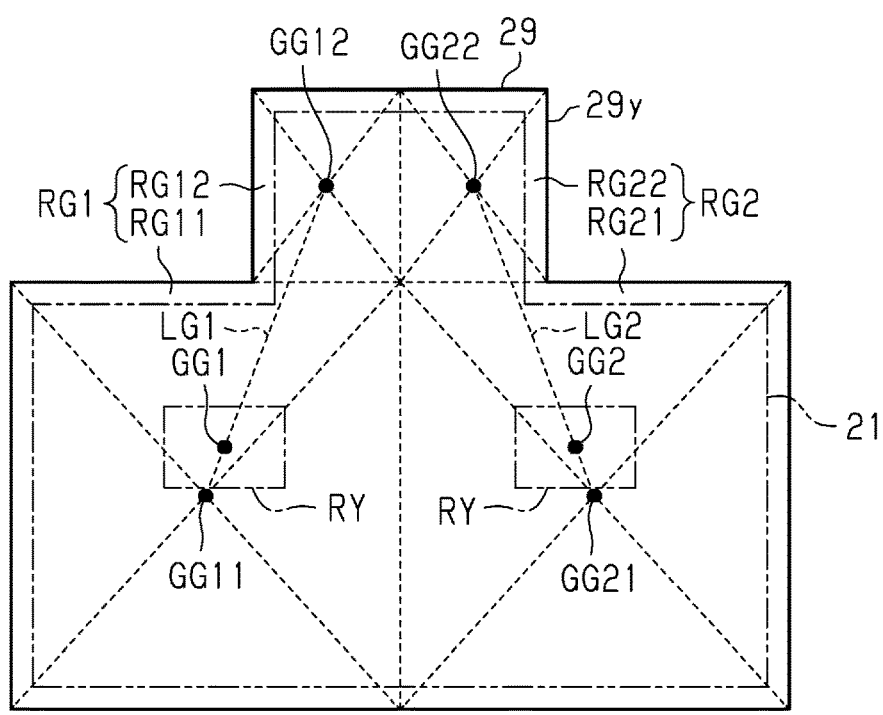
FIG. 32B is a schematic plan view showing the active region and the source pad of the semiconductor element.

(B) As shown in FIGS. 32A and 32B, the active region 29 has a projected shape. FIG. 32A shows a case where the first wire 41 is connected to the source pad 21 at one location. As shown in FIG. 32A, the active region 29 is divided into a rectangular first region RF1 that excludes a projection 29y and a second region RF2 that corresponds to the rectangular projection 29y. Then, a center of gravity position GF1 of the first region RF1 and a center of gravity position GF2 of the second region RF2 are obtained. As shown in FIG. 32A, the first region RF1 and the second region RF2 are rectangular. Thus, the center of gravity position GF1 of the first region RF1 is the intersection point of the diagonals of the first region RF1, and the center of gravity position GF2 of the second region RF2 is the intersection point of the second region RF2. Then, the area SF1 of the first region RF1 and the area SF2 of the second region RF2 are obtained. In a line segment LF connecting the center of gravity position GF1 and the center of gravity position GF2, a center of gravity position GF of the active region 29 is obtained from the relationship of the distance DF1 between the center of gravity position GF1 and the center of gravity position GF of the active region 29, the distance DF2 between the center of gravity position GF2 and the center of gravity position GF of the active region 29, the area SF1 of the first region RF1, and the area SF2 of the second region RF2. More specifically, the ratio of the distance DF2 to the distance DF1 (DF2/DF1) and the inverse proportion of the ratio of the area SF2 of the second region RF2 to the area SF1 of the first region RF1 (SF1/SF2) are equal (DF2/DF1=SF1/SF2). Accordingly, the center of gravity position GF of the active region 29 is obtained by obtaining at least one of the distances DF1 and DF2. Further, as shown in FIG. 32A, the source pad 21 is arranged over the center of gravity position GF of the active region 29.

Region RX shown by the single-dashed lines in FIG. 32A indicates a tool head (hereinafter, referred to as the wedge RX) used when ultrasonic-bonding the first wire 41 to the source pad 21 with a wedge bonding device (not shown). The wedge bonding device moves the wedge RX to position the wedge RX above the center of gravity position GF of the active region 29. The end of the first wire 41, which is passed through the wedge RX, is connected and superimposed with the center of gravity position GF of the active region 29. More specifically, the region where the first wire 41 contacts the source pad 21 includes the center of gravity position GF of the active region 29. In FIG. 32A, the center position of the region (wedge RX) where the first wire 41 contacts the source pad 21 coincides with the center of gravity position GF of the active region 29. In this modified example, the region (wedge RX) where the first wire 41 contacts the source pad 21 only needs to include the center of gravity position GF of the active region 29, and the center position of the region (wedge RX) where the first wire 41 contacts the source pad 21 may differ from the center of gravity position GF of the active region 29.

Figure 33A:
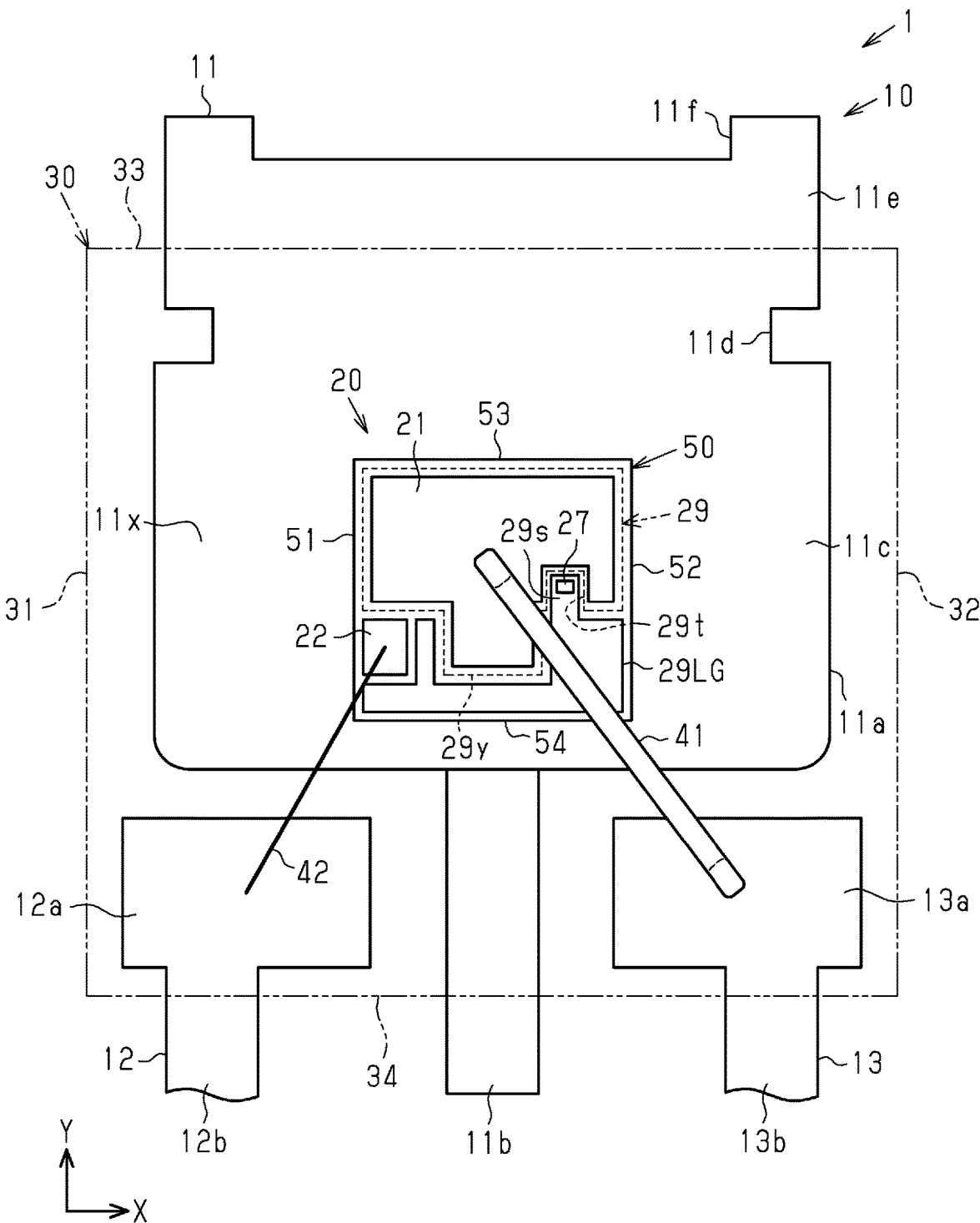
FIG. 33A is a schematic plan view showing the internal structure of a semiconductor device including the semiconductor element of FIG. 32A.

FIG. 33A shows one example of the semiconductor device 1 using the active region 29 of FIG. 32A and the region (wedge RX) where the first wire 41 contacts the source pad 21. In FIG. 33A, the semiconductor element 20 is arranged so that the projection 29y of the active region 29 is located at the side of the second lead frame 12 and the third lead frame 13 in the vertical direction Y As shown in FIG. 33A, in comparison with the active region 29 of FIG. 32A, part of the active region 29 is cut out for the arrangement of the temperature sensor 27. However, the center position of the region (wedge RX) where the first wire 41 contacts the source pad 21 coincides with the center of gravity position GD of the active region 29 in the same manner. Further, as shown in FIG. 33A, the region adjacent to the projection 29y at the side opposite to the gate pad 22 in the active region 29 includes a recess 29t recessed in the vertical direction Y The control circuitry region 29LG is arranged next to the active region 29 in the vertical direction Y and formed to surround the projection 29y of the active region 29 from the horizontal direction X and the vertical direction Y The control circuitry region 29LG includes a projection 29s that extends into the recess 29t of the active region 29. The temperature sensor 27 is arranged on the distal end of the projection 29s. As shown in FIG. 33A, the temperature sensor 27 is arranged at a position separated from the first wire 41 in a plan view, that is, a position located closer to the gate pad 22 than the first wire 41 in the horizontal direction X.

FIG. 32B shows a case where the first wire 41 is connected to the source pad 21 at two locations. As shown in FIG. 32B, the active region 29 is divided into two regions (first region RG1 and second region RG2) having equal areas. As shown in FIG. 32B, the first region RG1 and the second region RG2 are substantially L-shaped. Then, a center of gravity position GG1 of the first region RG1 and a center of gravity position GG2 of the second region RG2 are obtained. The first region RG1 is divided into two rectangular regions, namely, a first divided region RG11 and a second divided region RG12. Then, a center of gravity position GG11 of the first divided region RG11 and a center of gravity position GG12 of the second divided region RG12 are obtained. The first divided region RG11 is rectangular. Thus, the intersection point of the diagonals of the first divided region RG11 is the center of gravity position GG11 of the first divided region RG11. The second divided region RG12 is rectangular. Thus, the intersection point of the diagonals of the second divided region RG12 is the center of gravity position GG12 of the second divided region RG12. Then, the area SG1 of the first divided region RG11 and the area SG2 of the second divided region RG12 are obtained. In a line segment LG1 connecting the center of gravity position GG11 and the center of gravity position GG12, the center of gravity position GG1 of the first region RG1 is obtained from the distance DG1 between the center of gravity position GG11 and the center of gravity position GG1, the distance DG2 between the center of gravity position GG12 and the center of gravity position GG1, the area SG1 of the first divided region RG11, and the area SG2 of the second divided region RG12. More specifically, the ratio of the distance DG2 to the distance DG1 (DG2/DG1) and the inverse proportion of the ratio of the area SG2 of the second divided region RG12 to the area SG1 of the first divided region RG11 (SG1/SG2) are equal (DG2/DG1=SG1/SG2). Thus, at least one of the distances DG1 and DG2 is obtained to obtain the center of gravity position GG1 of the first region RG1. With regard to the second region RG2, in the same manner as when the center of gravity position GG1 of the first region RG1 is obtained, in a line segment LG2 connecting a center of gravity position GG21 of a first divided region RG21 and a center of gravity position GG22 of a second divided region RG22, the center of gravity position GG2 is obtained from the area SG21 of the first divided region RG21 and the area SG22 of the second divided region RG22. Further, as shown in FIG. 32B, the source pad 21 is arranged to cover the center of gravity positions GG1 and GG2 (center of gravity position GG1 of the first region RG1 and center of gravity position GG2 of the second region RG2) in the divided active region 29.

Two regions RY shown by the single-dashed lines in FIG. 32B indicate a tool head (hereinafter, referred to as the wedge RY) used when ultrasonic-bonding the first wire 41 to the source pad 21 with a wedge bonding device (not shown). The wedge bonding device moves the wedge RY to position the wedge RY above the center of gravity position GG1 of the first region RG1 in the active region 29 and connects the first wire 41 to the source pad 21. This connects and superimposes the end of the first wire 41, which is passed through the wedge RY, with the center of gravity position GG1 of the first region RG1. More specifically, the first connection portion 41b of the first wire 41 connected to the source pad 21 includes the center of gravity position GG1 of the first region RG1. In FIG. 32B, the center position of the first connection portion 41b coincides with the center of gravity position GG1 of the first region RG1. Then, the wedge bonding device separates the wedge RY from the source pad 21 to separate the first wire 41 from the source pad 21. Further, the wedge bonding device moves the wedge RY to position the wedge RY above the center of gravity position GG2 of the second region RG2 in the active region 29 and connects the first wire 41 to the source pad 21. This connects and superimposes the first wire 41, which is passed through the wedge RY, with the center of gravity position GG2 of the second region RG2. More specifically, the second connection portion 41c of the first wire 41 connected to the source pad 21 includes the center of gravity position GG2 of the second region RG2. In FIG. 32B, the center position of the second connection portion 41c coincides with the center of gravity position GG2 of the second region RG2. In this modified example, the first connection portion 41b only needs to include the center of gravity position GG1 of the first region RG1, and the center position of the first connection portion 41b may differ from the center of gravity position GG1 of the first region RG1. Further, the second connection portion 41c only needs to include the center of gravity position GG2 of the second region RG2, and the center position of the second connection portion 41c may differ from the center of gravity position GG2 of the second region RG2.

Figure 33B:
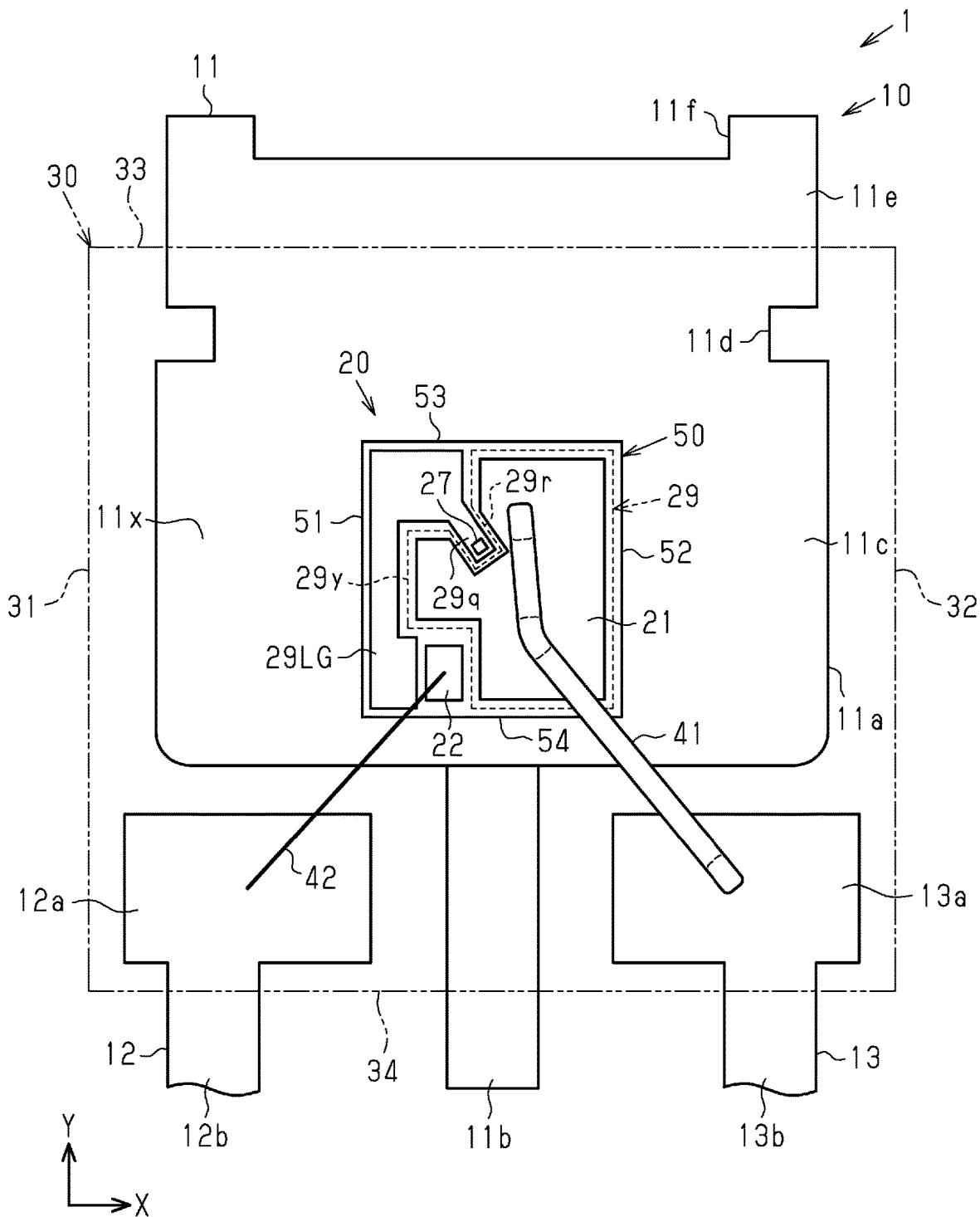
FIG. 33B is a schematic plan view showing the internal structure of a semiconductor device including the semiconductor element of FIG. 32B.

FIG. 33B shows one example of the semiconductor device 1 using the active region 29 of FIG. 32B and the region (wedge RX) where the first wire 41 contacts the source pad 21. In FIG. 33B, the semiconductor element 20 is arranged so that the projection 29y of the active region 29 extends in the horizontal direction X and the projection 29y is located at the side of the second lead frame 12 in the horizontal direction X. As shown in FIG. 33B, in comparison with the active region 29 of FIG. 32B, part of the active region 29 is cut out for the arrangement of the temperature sensor 27. However, the center position of the region (wedge RX) where the first wire 41 contacts the source pad 21 coincides with the center of gravity position GD of the active region 29 in the same manner. Further, as shown in FIG. 33B, the region adjacent to the projection 29y at the side opposite to the gate pad 22 in the active region 29 includes a recess 29r recessed in the vertical direction Y. The recess 29r is formed to be diagonally recessed toward the third lead frame 13. The control circuitry region 29LG is arranged next to the active region 29 in the horizontal direction X and formed to surround the projection 29y of the active region 29 from the horizontal direction X and the vertical direction Y The gate pad 22 is formed closer to the second lead frame 12 than the projection 29y of the active region 29 in the vertical direction Y and between the control circuitry region 29LG and the active region 29 in the horizontal direction X. The control circuitry region 29LG includes a projection 29q that extends into the recess 29r of the active region 29. The temperature sensor 27 is arranged on the distal end of the projection 29q. As shown in FIG. 33B, the temperature sensor 27 is arranged at a position separate from the first wire 41 in a plan view, that is, a position located between the first wire 41 and the gate pad 22 in the horizontal direction X.

Figure 34A:
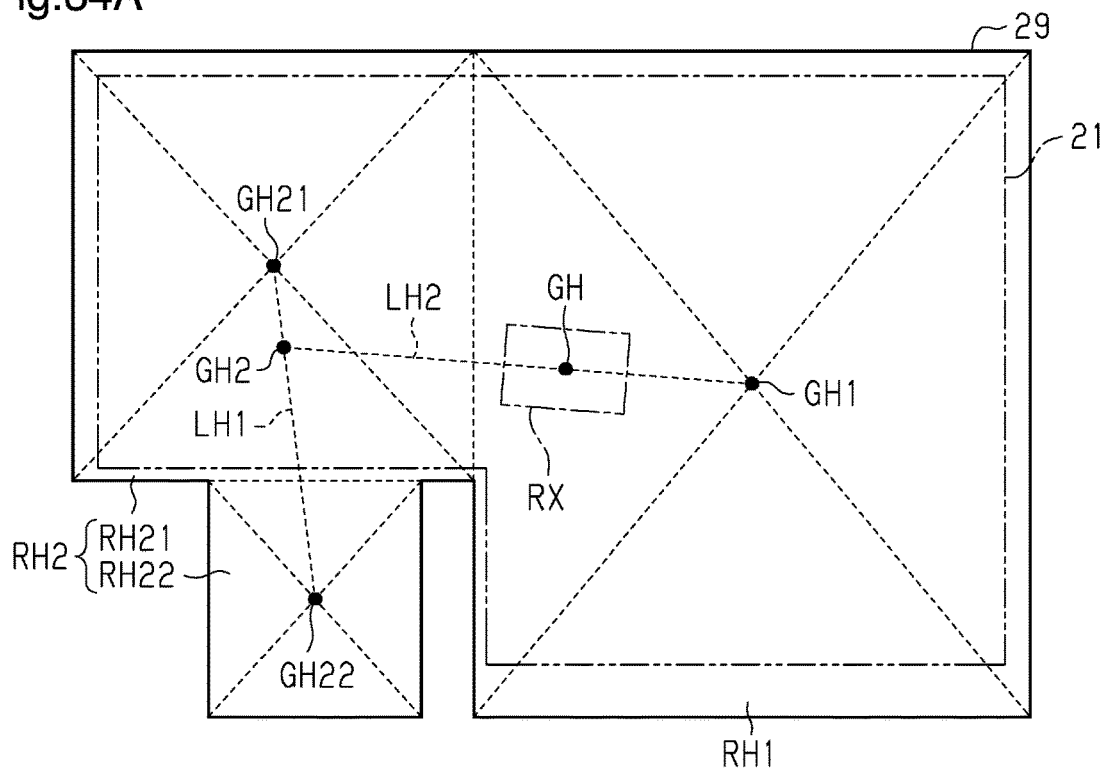
FIG. 34A is a schematic plan view showing an active region and a source pad of a semiconductor element in a semiconductor device according to a modified example.
Figure 34B:
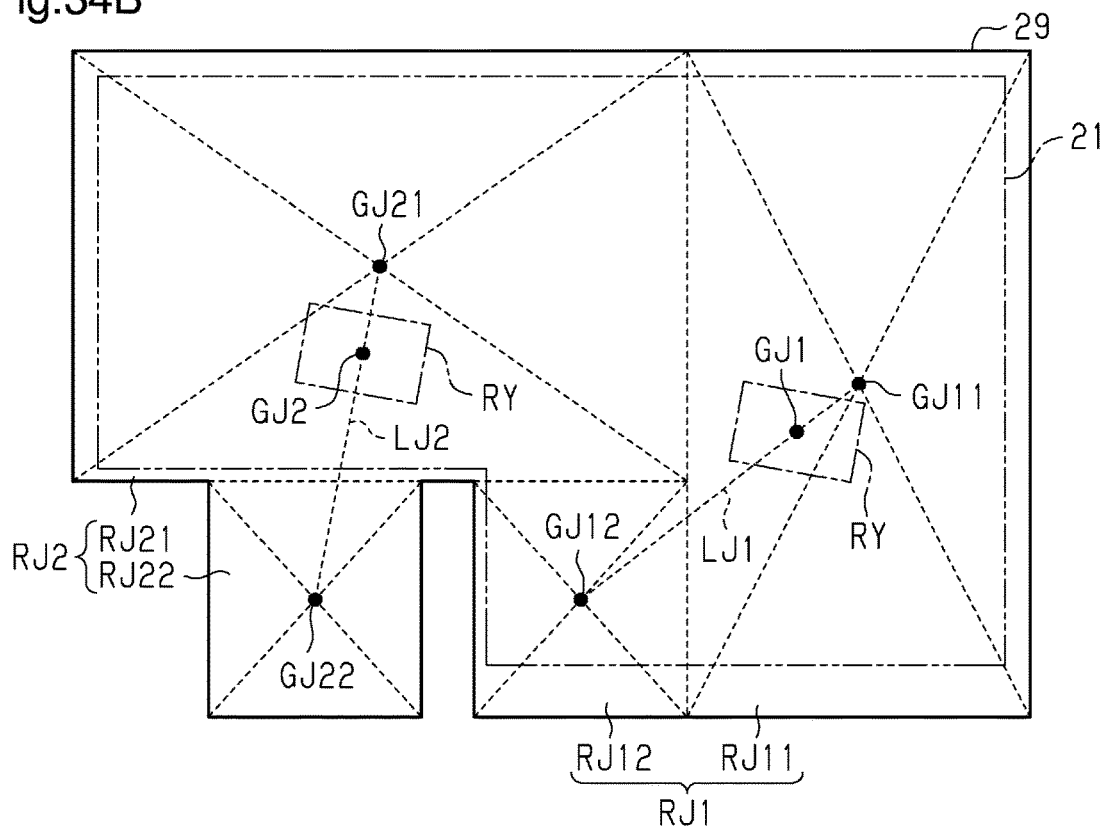
FIG. 34B is a schematic plan view showing the active region and the source pad of the semiconductor element.

(C) As shown in FIGS. 34A and 34B, the active region 29 has a shaped obtained by combining rectangles. FIG. 34A shows a case where the first wire 41 is connected to the source pad 21 at one location. As shown in FIG. 34A, the active region 29 includes a first region RH1 having a rectangular shape and a second region RH2 having a projected shape. Then, a center of gravity position GH1 of the first region RH1 and a center of gravity position GH2 of the second region RH2 are obtained. As shown in FIG. 34A, the first region RH1 is rectangular. Thus, the center of gravity position GH1 of the first region RH1 is the intersection point of the diagonals of the first region RH1. The second region RH2 has a projected shape. Thus, in the same manner as the active region 29 of FIG. 33A, the second region RH2 is divided into two rectangular regions, namely, a first divided region RH21 and a second divided region RH22. Then, a center of gravity position GH21 of the first divided region RH21 and a center of gravity position GH22 of the second divided region RH22 are obtained. The first divided region RH21 is rectangular. Thus, the intersection point of the diagonals of the first divided region RH21 is the center of gravity position GH21 of the first divided region RH21. The second divided region RH22 is rectangular. Thus, the intersection point of the diagonals of the second divided region RH22 is the center of gravity position GH22 of the second divided region RH22. Then, the area SH21 of the first divided region RH21 and the area SH22 of the second divided region RH22 are obtained. In a line segment LH1 connecting the center of gravity position GH21 and the center of gravity position GH22, the center of gravity position GH2 of the second region RH2 is obtained from the relationship of the distance DH21 between the center of gravity position GH21 and the center of gravity position GH2, the distance DH22 between the center of gravity position GH22 and the center of gravity position GH2, the area SH21 of the first divided region RH21, and the area SH22 of the second divided region RH22. More specifically, the ratio of the distance DH22 to the distance DH21 (DH22/DH21) and the inverse proportion of the ratio of the area SH22 of the second divided region RH22 to the area SH21 of the first divided region RH21 (SH21/SH22) are equal (DH22/DH21=SH21/SH22). Thus, at least one of the distances DH21 and DH22 is obtained to obtain the center of gravity position GH2 of the second region RH2.

In a line segment LH2 connecting the center of gravity position GH1 of the first region RH1 and the center of gravity position GH2 of the second region RH2, a center of gravity position GH of the active region 29 is obtained from the relationship of the distance DH1 between the center of gravity position GH1 and the center of gravity position GH of the active region 29, the distance DH2 between the center of gravity position GH2 and the center of gravity position GH of the active region 29, the area SH1 of the first region RH1, and the area SH2 of the second region RH2. More specifically, the ratio of the distance DH2 to the distance DH1 (DH1/DH2) and the inverse proportion of the ratio of the area SH2 of the second region RH2 to the area SH1 of the first region RH1 (SH1/SH2) are equal (DH2/DH1=SH1/SH2). Accordingly, the center of gravity position GH of the active region 29 is obtained by obtaining at least one of the distances DH1 and DH2.

Region RX shown by the single-dashed lines in FIG. 34A indicates a tool head (hereinafter, referred to as the wedge RX) used when ultrasonic-bonding the first wire 41 to the source pad 21 with a wedge bonding device (not shown). The wedge bonding device moves the wedge RX to position the wedge RX above the center of gravity position GD of the active region 29. The end of the first wire 41, which is passed through the wedge RX, is connected and superimposed with the center of gravity position GH of the active region 29. More specifically, the region where the first wire 41 contacts the source pad 21 includes the center of gravity position GH of the active region 29. In FIG. 34A, the center position of the region (wedge RX) where the first wire 41 contacts the source pad 21 coincides with the center of gravity position GH of the active region 29. In this modified example, the region (wedge RX) where the first wire 41 contacts the source pad 21 only needs to include the center of gravity position GH of the active region 29, and the center position of the region (wedge RX) where the first wire 41 contacts the source pad 21 may differ from the center of gravity position GH of the active region 29.

Figure 35A:
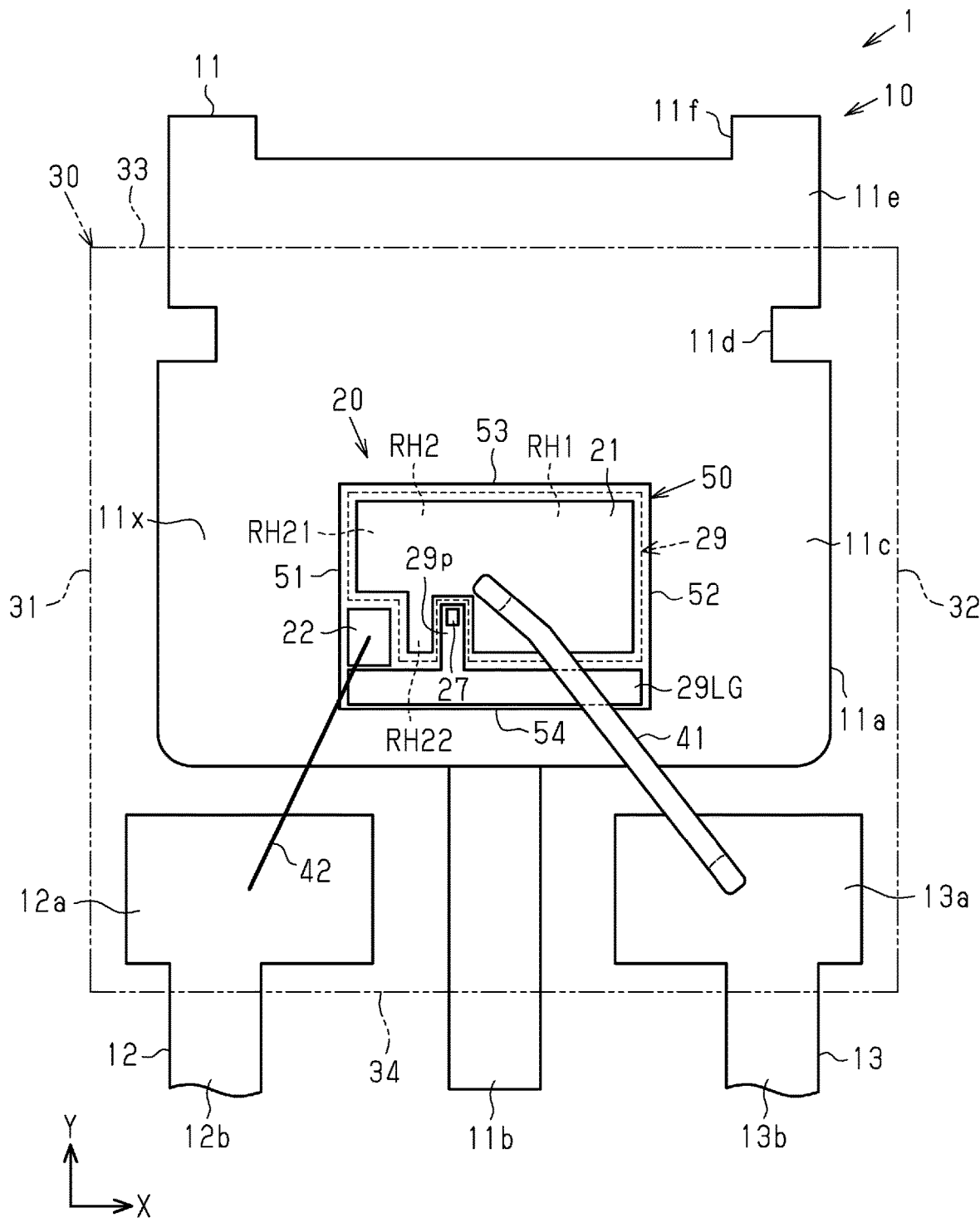
FIG. 35A is a schematic plan view showing the internal structure of a semiconductor device including the semiconductor element of FIG. 34A.

FIG. 35A shows one example of the semiconductor device 1 using the active region 29 of FIG. 34B and the region (wedge RX) where the first wire 41 contacts the source pad 21. In FIG. 35A, the semiconductor element 20 is arranged so that the first region RH1 and the second region RH2 are arranged next to each other in the horizontal direction X in the active region 29 and so that the second divided region RH22 of the second region RH2 is arranged at the side of the second lead frame 12. As shown in FIG. 35A, the gate pad 22 is formed adjacent to the second divided region RH22 and at the side of the second divided region RH22 opposite to the first region RH1. The control circuitry region 29LG is arranged next to the active region 29 in the vertical direction Y and includes a projection 29p that extends into the gap between the second divided region RH22 of the active region 29 and the first region RH1 in the horizontal direction X. The temperature sensor 27 is arranged on the distal end of the projection 29p. As shown in FIG. 35A, the temperature sensor 27 is arranged at a position separated from the first wire 41 in a plan view, that is, a position located closer to the second lead frame 12 than the first wire 41 in the vertical direction Y.

FIG. 34B shows a case where the first wire 41 is connected to the source pad 21 at two locations. As shown in FIG. 34B, the active region 29 is divided into two regions (first region RJ1 and second region RJ2) having equal areas. As shown in FIG. 34B, the first region RJ1 is substantially L-shaped, and the second region RJ2 has a projected shape. Then, a center of gravity position GJ1 of the first region RJ1 and a center of gravity position GJ2 of the second region RJ2 are obtained. The first region RJ1 is divided into two rectangular regions, namely, a first divided region RJ11 and a second divided region RJ12. Then, a center of gravity position GJ11 of the first divided region RJ11 and a center of gravity position GJ12 of the second divided region RJ12 are obtained. The first divided region RJ11 is rectangular. Thus, the intersection point of the diagonals of the first divided region RJ11 is the center of gravity position GJ11 of the first divided region RJ11. The second divided region RJ12 is rectangular. Thus, an intersection point of the diagonals of the second divided region RJ12 is the center of gravity position GJ12 of the divided region RJ12. Then, the area SJ11 of the first divided region RJ11 and the area SJ12 of the second divided region RJ12. In a line segment LJ1 connecting the center of gravity position GJ11 and the center of gravity position GJ12, the center of gravity position GJ1 of the first region RJ1 is obtained from the relationship of the distance DJ11 between the center of gravity position GJ11 and the center of gravity position GJ1, the distance DJ12 between the center of gravity position GJ12 and the center of gravity position GJ1, the area SJ11 of the first divided region RJ11, and the area SJ12 of the second divided region RJ12. More specifically, the ratio of the distance DJ12 to the distance DJ11 (DJ12/DJ11) and the inverse proportion of the ratio of the area SJ12 of the second divided region RJ12 to the area SJ11 of the first divided region RJ11 (SJ11/SJ12) are equal (DJ12/DJ11=SJ11/SJ12). Thus, at least one of the distances DJ11 and DJ12 is obtained to obtain the center of gravity position GJ1 of the first region RJ1.

The second region RJ2 is divided into two rectangular regions, namely, a first divided region RJ21 and a second divided region RJ22. Then, a center of gravity position GJ21 of the first divided region RJ21 and a center of gravity position GJ22 of the second divided region RJ22 are obtained. The first divided region RJ21 is rectangular. Thus, the intersection point of the diagonals of the first divided region RJ21 is the center of gravity position GJ21 of the first divided region RJ21. The second divided region RJ22 is rectangular. Thus, the intersection point of the diagonals of the second divided region RJ22 is the center of gravity position GJ22 of the second divided region RJ22. Then, the area SJ21 of the first divided region RJ21 and the area SJ22 of the second divided region RJ22 are obtained. In a line segment LJ2 connecting the center of gravity position GJ21 and the center of gravity position GJ22, the center of gravity position GJ2 of the second region RJ2 is obtained from the relationship of the distance DJ21 between the center of gravity position GJ21 and the center of gravity position GJ2, the distance DJ22 between the center of gravity position GJ22 and the center of gravity position GJ2, the area SJ21 of the first divided region RJ21, and the area SJ22 of the second divided region RJ22. More specifically, the ratio of the distance DJ22 to the distance DJ21 (DJ22/DJ21) and the inverse proportion of the ratio of the area SJ22 of the second divided region RJ22 to the area SJ21 of the first divided region RJ21 (SJ21/SJ22) are equal (DJ22/DJ21=SJ21/SJ22). Thus, at least one of the distances DJ21 and DJ22 is obtained to obtain the center of gravity position GJ2 of the second region RJ2.

Two regions RY shown by the single-dashed lines in FIG. 34B indicates a tool head (hereinafter, referred to as the wedge RY) used when ultrasonic-bonding the first wire 41 to the source pad 21 with a wedge bonding device (not shown). The wedge bonding device moves the wedge RY to position the wedge RY above the center of gravity position GJ1 of the first region RJ1 in the active region 29 and connects the first wire 41 to the source pad 21. This connects and superimposes the end of the first wire 41, which is passed through the wedge RY, with the center of gravity position GJ1 of the first region RJ1. More specifically, the first connection portion 41b of the first wire 41 connected to the source pad 21 includes the center of gravity position GJ1 of the first region RJ1. In FIG. 34B, the center position of the first connection portion 41b coincides with the center of gravity position GJ1 of the first region RJ1. Then, the wedge bonding device separates the wedge RY from the source pad 21 to separate the first wire 41 from the source pad 21. Further, the wedge bonding device moves the wedge RY to position the wedge RY above the center of gravity position GJ2 of the second region RJ2 in the active region 29 and connects the first wire 41 to the source pad 21. This connects and superimposes the first wire 41, which is passed through the wedge RY, with the center of gravity position GJ2 of the second region RJ2. More specifically, the second connection portion 41c of the first wire 41 connected to the source pad 21 includes the center of gravity position GJ2 of the second region RJ2. In FIG. 34B, the center position of the second connection portion 41c coincides with the center of gravity position GJ2 of the second region RJ2. In this modified example, the first connection portion 41b only needs to include the center of gravity position GJ1 of the first region RJ1, and the center position of the first connection portion 41b may differ from the center of gravity position GJ1 of the first region RJ1. Further, the second connection portion 41c only needs to include the center of gravity position GJ2 of the second region RJ2, and the center position of the second connection portion 41c may differ from the center of gravity position GJ2 of the second region RJ2.

Figure 35B:
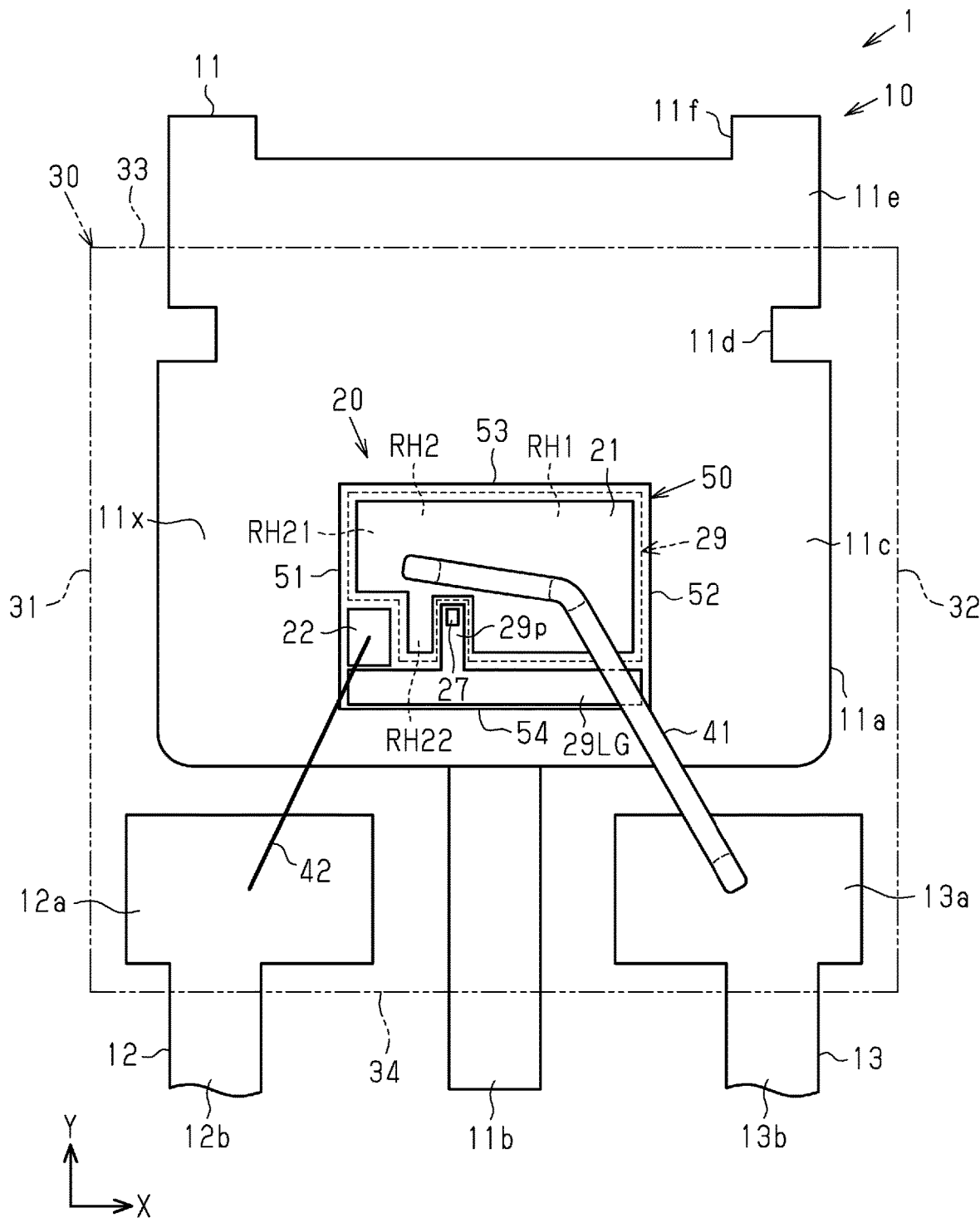
FIG. 35B is a schematic plan view showing the internal structure of a semiconductor device including the semiconductor element of FIG. 34B.
Figure 36:
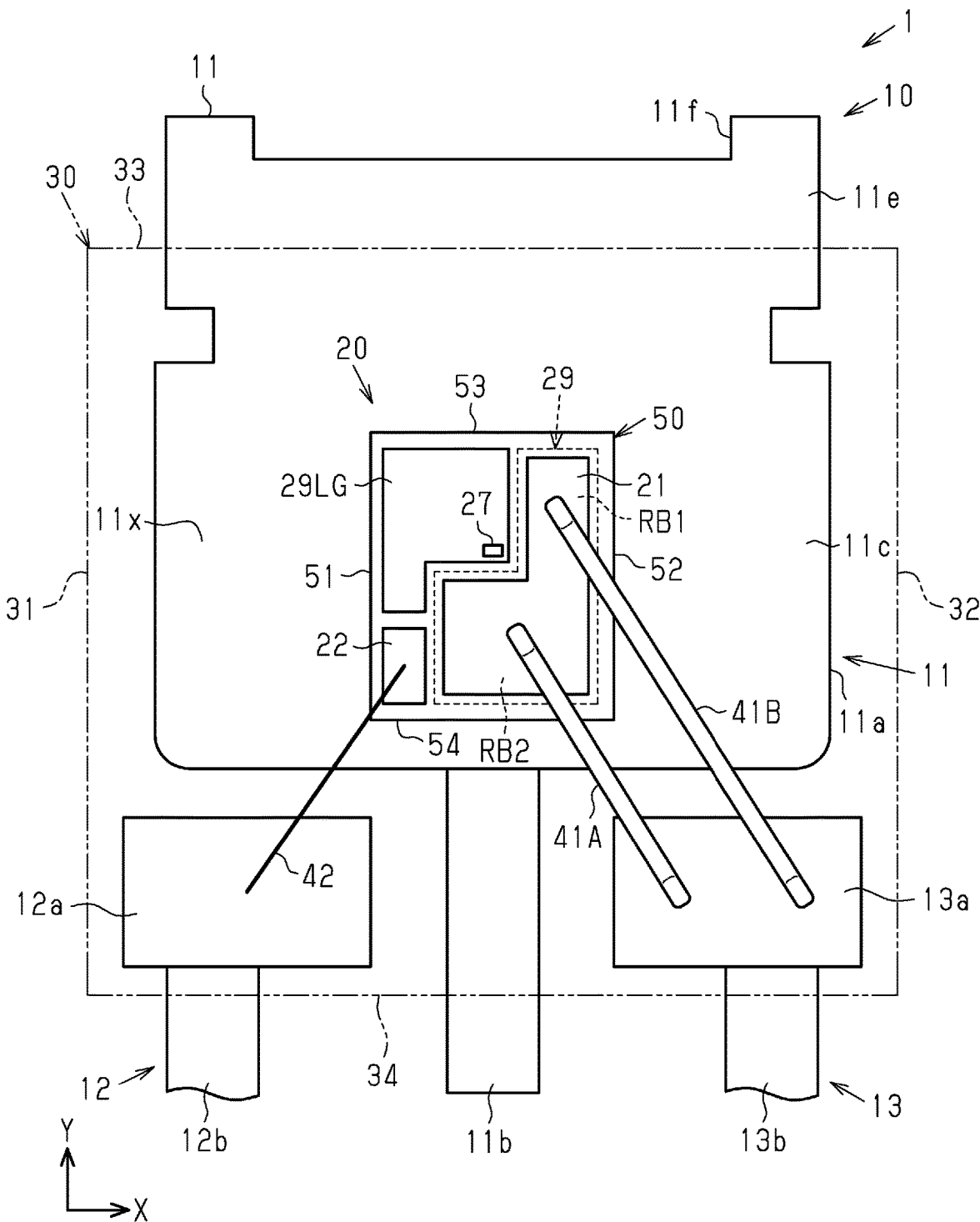
FIG. 36 is a schematic plan view showing the internal structure of a semiconductor device according to a modified example.
Figure 37:
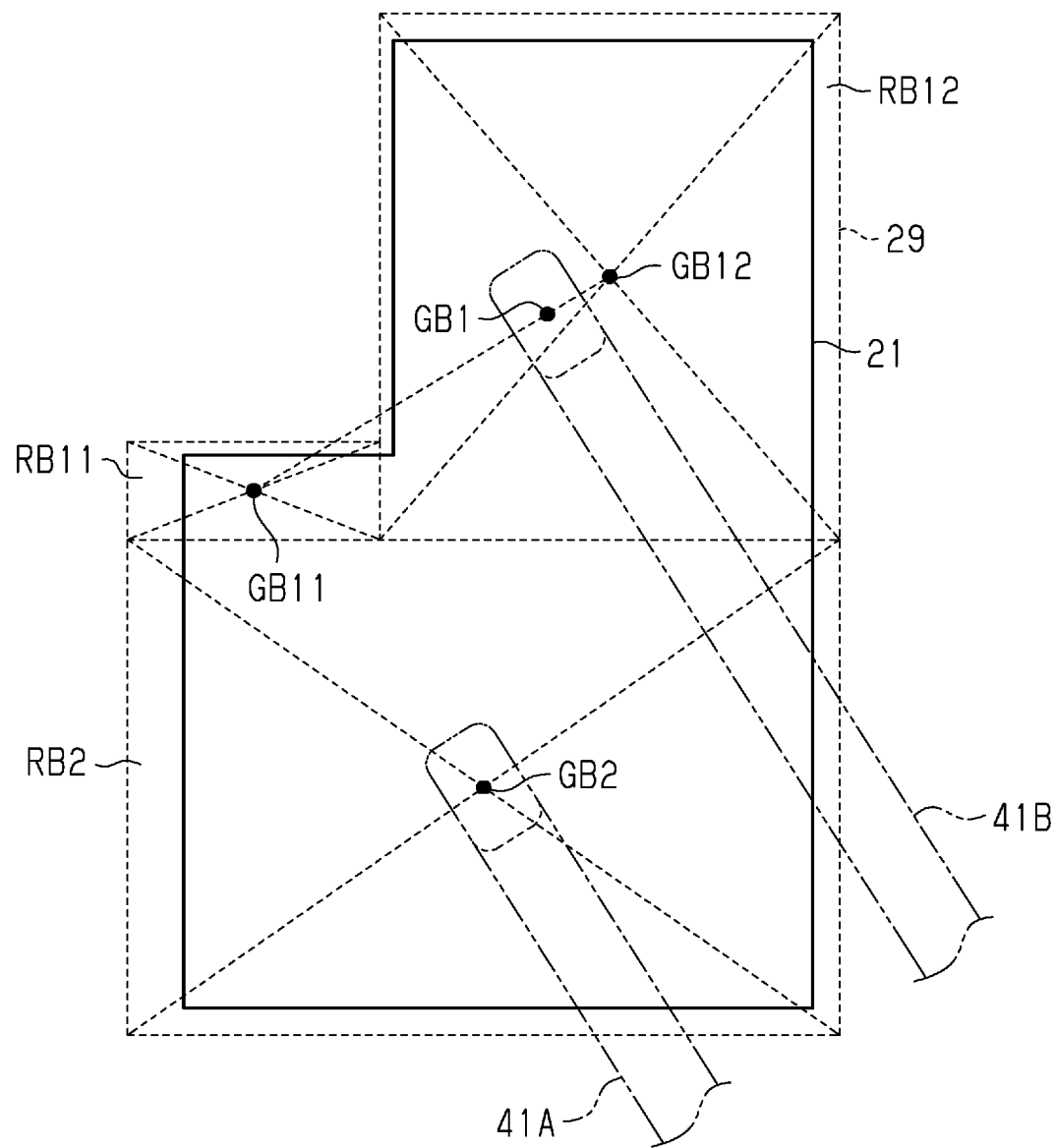
FIG. 37 is a schematic plan view showing an active region and a source pad of a semiconductor element in the semiconductor device of FIG. 36.

FIG. 35B shows one example of the semiconductor device 1 using the active region 29 of FIG. 34B and the region (wedge RX) where the first wire 41 contacts the source pad 21. The shapes of the active region 29 and the control circuitry region 29LG and the position of the temperature sensor 27 in FIG. 35B are the same as FIG. 35A. As shown in FIG. 35B, the temperature sensor 27 is arranged at a position separated from the first wire 41 in a plan view, that is, a position located closer to the second lead frame 12 than the first wire 41 in the vertical direction Y Plurality of First Wires In the second embodiment, there is one first wire 41. However, there is no limit to the number of the first wires 41. For example, as shown in FIG. 36, two first wires 41A and 41B may be connected to the semiconductor element 20 and the third lead frame 13. In this case, as shown in FIG. 37, when the active region 29 is divided into the first region RB1 and the second region R32 that have equal areas like in the second embodiment, the semiconductor element 20 is arranged so that the first region RB1 and the second region R32 are arranged next to each other in the vertical direction Y and so that the second region RB2 is arranged at the side of the third lead frame 13. Further, the gate pad 22 is arranged adjacent in the horizontal direction X to the end of the second region RB2 at the side of the third lead frame 13 in the vertical direction Y The gate pad 22 is located closer to the second lead frame 12 than the second region R32. The position of temperature sensor 27 relative to the active region 29 is the same as the second embodiment.

In FIG. 37, the active region 29 is divided into the first region RB1 and the second region R32 that have equal areas like in the second embodiment, and the center of gravity position GB1 of the first region RB1 and the center of gravity position GB2 of the second region R32 are obtained. As shown in FIG. 37, the first wire 41A is connected to a region of the source pad 21 corresponding to the center of gravity position GB1 of the first region RB1, and the first wire 41B is connected to a region of the source pad 21 corresponding to the center of gravity position GB2 of the second region RB2. As shown in FIG. 36, the temperature sensor 27 is arranged at a position separated from the two first wires 41A and 41B in a plan view. That is, the temperature sensor 27 is located closer to the second lead frame 12 than the first wire 41A in the horizontal direction X and at the side of the gate pad 22 opposite to the first wire 41B in the vertical direction Y.

Modified Example of First Connection Member

Figure 38:
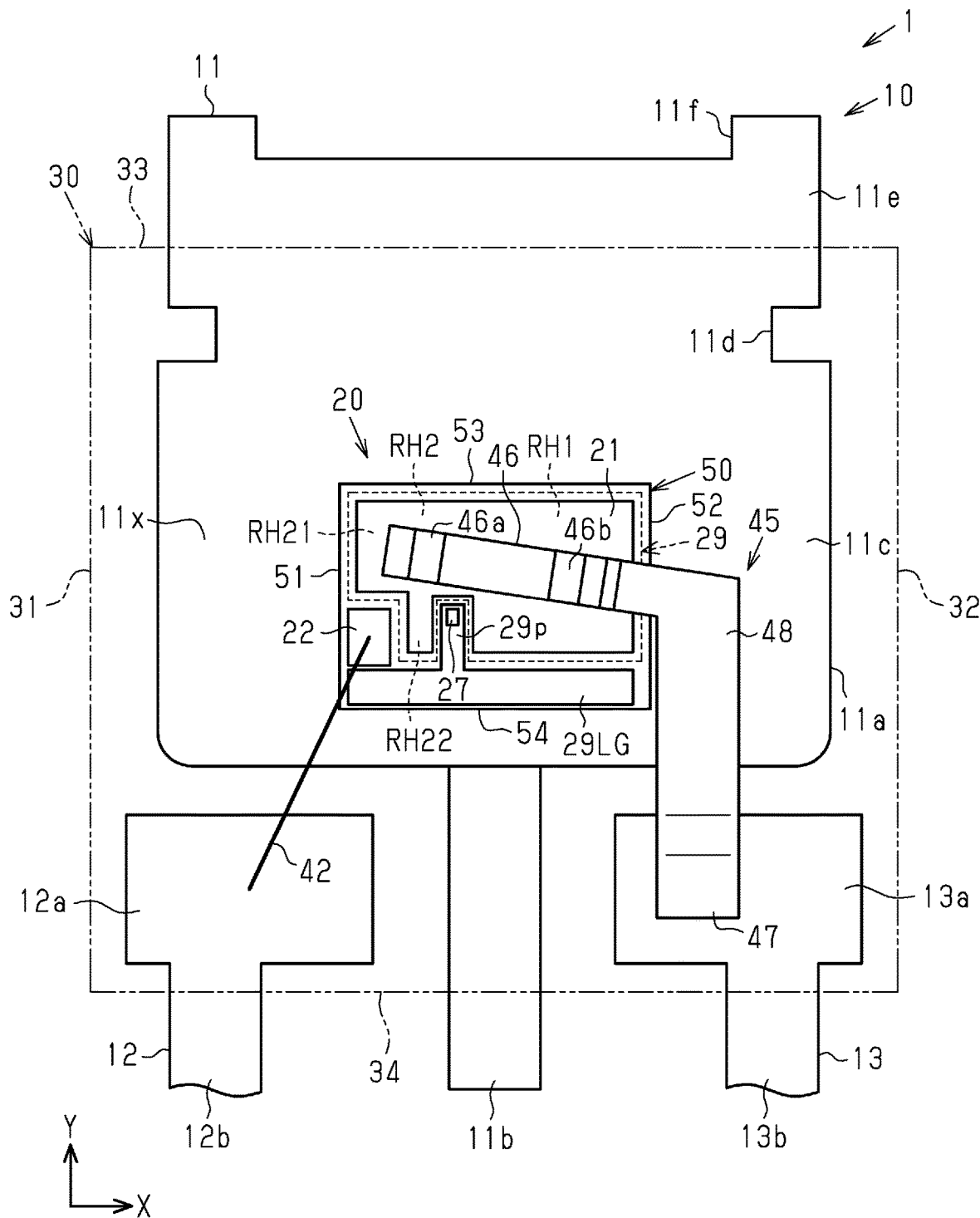
FIG. 38 is a schematic plan view showing the internal structure of a semiconductor device according to a modified example.

In each of the above embodiments, the first wire 41 does not necessarily have to be used as the first connection member. Instead of the first wire 41, for example, a connection plate (hereafter referred to as "the clip 45"), which is shown in FIG. 38, may be used as the first connection member. The clip 45 includes an element connection portion 46 connected to the semiconductor element 20, a lead connection portion 47 connected to the third island 13a of the third lead frame 13, and a coupling portion 48 coupling the element connection portion 46 and the lead connection portion 47.

The element connection portion 46 is, for example, soldered and connected to the source pad 21 of the semiconductor element 20. The element connection portion 46 has the form of a strip in a plan view. The element connection portion 46 includes a first projection 46a and a second projection 46b. The first projection 46a and the second projection 46b are arranged closer to the source pad 21 than other parts of the element connection portion 46. The first projection 46a is located at a position including the wedge RY that includes the center of gravity position GB1 of the first region RB1, and the second projection 46b is located at a position including the wedge RY that includes the center of gravity position GB2 of the second region RB2.

The lead connection portion 47 has the form of a rectangular plate. The lead connection portion 47 is soldered and connected to the third island 13a of the third lead frame 13.

The coupling portion 48 extends in the vertical direction Y In FIG. 38, the size of the coupling portion 48 in the horizontal direction X gradually increases in the vertical direction Y from the lead connection portion 47 toward the element connection portion 46. The coupling portion 48 is bent from each of the element connection portion 46 and the lead connection portion 47 so as to be located at a position farther from the semiconductor element 20 than the element connection portion 46 and the lead connection portion 47 in the thickness direction Z.

The material of the clip 45 may be, for example, copper (Cu), aluminum (Al), a copper alloy, an aluminum alloy, or the like. A plating layer substantially covers the entire surface of the clip 45. The material of the plating layer may be, for example, silver (Ag), nickel (Ni), an alloy of these metals, or the like. A plurality of plating layers may be used. The shape of the clip 45 is not limited to the form shown in FIG. 38 and may be freely changed.

Structure of MISFET

In each of the above embodiments, the structure of the MISFET 23a can be freely changed. In one example, the MISFET 23a may have the structure shown in FIG. 39. The MISFET 23a of FIG. 39 differs from the MISFET 23a of each of the above embodiments in the structure of the gate electrode and the structure of the source pad 21.

Figure 39:
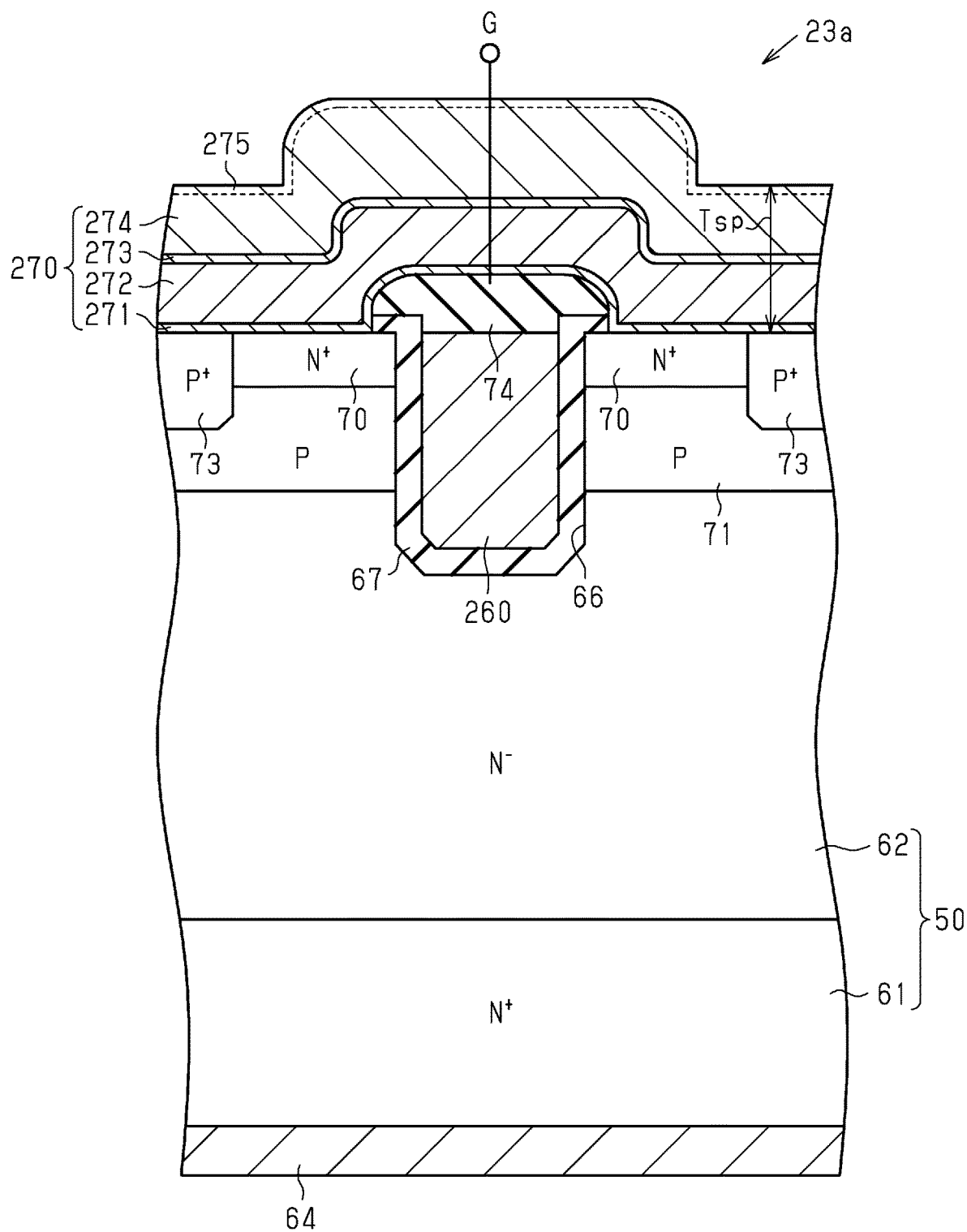
FIG. 39 is a schematic cross-sectional view showing the structure of part of a MISFET in a semiconductor element according to a modified example.

As shown in FIG. 39, only a gate electrode 260 is embedded in the trench 66. More specifically, the MISFET 23a of FIG. 39 has a structure in which the embedded electrode 69 is omitted from the MISFET 23a of each of the above embodiments. In accordance with this structure, the gate electrode 260 does not include the recess 68a. Further, the depth of the trench 66 may be freely changed. For example, the trench 66 of the MISFET 23a shown in FIG. 39 may be shallower than the trench 66 of the MISFET 23a in each of the above embodiments. As shown in FIG. 39, the body contact region 73 may be thicker than the source region 70.

As shown in FIG. 39, a source pad 270 has a laminated structure of a plurality of layers. In detail, the source pad 270 includes a first projection layer 271 that covers the epitaxial layer 62 and the interlayer insulation film 74 from above, a first electrode layer 272 that covers the first projection layer 271, a second protection layer 273 that covers the first electrode layer 272, and a second electrode layer 274 that covers the second protection layer 273. Further, a connection layer 275 is formed on the second electrode layer 274 for connection with the first wire 41. The connection layer 275 is formed by a nickel palladium (NiPd) alloy plating.

The first projection layer 271 and the second protection layer 273 are formed from, for example, titanium nitride (TiN). The first projection layer 271 and the second protection layer 273 are each thinner than the first electrode layer 272 and the second electrode layer 274. The first electrode layer 272 and the second electrode layer 274 are each formed from, for example, aluminum or an aluminum alloy. In one example, the first electrode layer 272 is formed from AlSiCu. The second electrode layer 274 is formed from AlCu. The first electrode layer 272 and the second electrode layer 274 may be formed from copper. The first projection layer 271 and the second protection layer 273 each have a Vickers hardness that is greater than that of each of the first electrode layer 272 and the second electrode layer 274. Thus, in comparison with the first electrode layer 272 and the second electrode layer 274, the first projection layer 271 and the second protection layer 273 has a higher resistance to deformation.

The structure of the source pad 270 will reduce the stress applied to the gate insulation film 67 by the force and vibration that acts on the source pad 270 when, for example, connecting the first wire 41 to the source pad 270 through wedge bonding. This obviates the formation of cracks in the gate insulation film 67.

The source pad 270 has a thickness Tsp of 16000 Å or greater, preferably, 20000 Å or greater.

Figure 40:
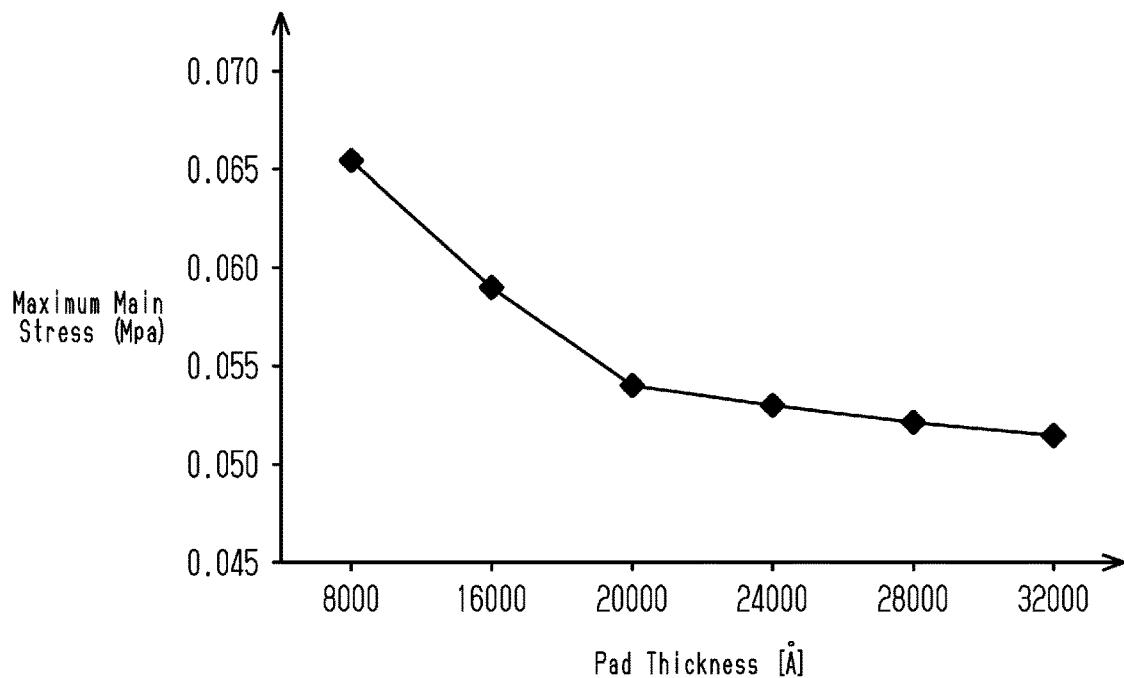
FIG. 40 is a graph showing the relationship of the pad thickness of a source pad and the maximum main stress.

FIG. 40 is a graph showing the relationship of the thickness Tsp of the source pad 270 and the stress applied to the gate insulation film 67 when connecting the first wire 41 to the source pad 270 (maximum main stress). As can be understood from the graph of FIG. 40, as the thickness Tsp of the source pad 270 increases, the stress applied to the gate insulation film 67 decreases. In particular, when the thickness Tsp is less than 20000 Å, the stress applied to the gate insulation film 67 increases at a high rate as the thickness Tsp decreases. When the thickness Tsp is greater than 20000 Å, the stress applied to the gate insulation film 67 increases at a low rate even if the thickness Tsp decreases.

Figure 41:
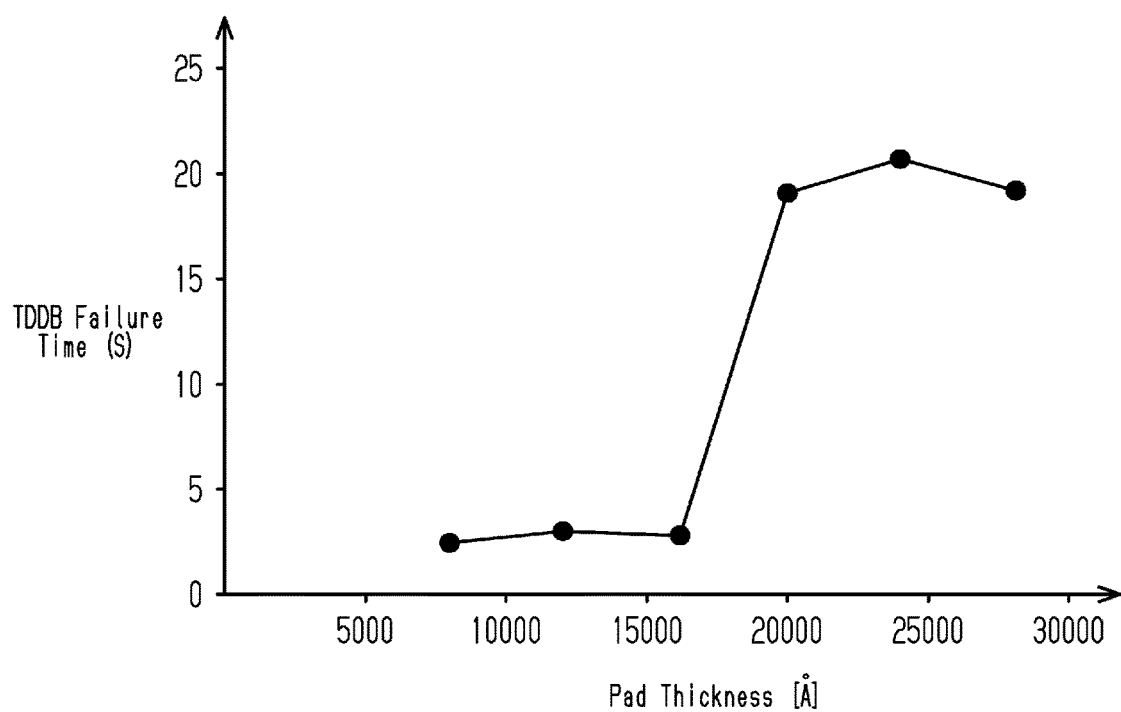
FIG. 41 is a graph showing the relationship of the pad thickness of a source pad and the TDDB failure time.

FIG. 41 is a graph showing the relationship of the thickness Tsp of the source pad 270 and the TDDB failure time. The TDDB failure time is, for example, the time until the accumulated failures reaches 0.1% when conducting a time dependent dielectric breakdown (TDDB) test.

As can be understood from FIG. 41, when the thickness Tsp of the source pad 270 is 8000 Å or greater and less than 16000 Å, the stress applied to the gate insulation film 67 increases when connecting the first wire 41 to the source pad 270. This damages the gate insulation film 67, and the semiconductor element 20 fails within a short period of time. When the thickness Tsp of the source pad 21 is greater than or equal to 16000 Å, in particular, when the thickness Tsp is in the range of 16000 Å or greater and 20000 Å or less, the TDDB failure time drastically increases as the thickness Tsp increases. Thus, as the thickness Tsp increases in the range of 16000 Å or greater and 20000 Å or less, failures drastically decrease in the semiconductor element 20. In this manner, when the thickness Tsp of the source pad 270 is 16000 Å or greater, particularly, 20000 Å or greater, failures seldomly occur in the semiconductor element 20.

Encapsulation Resin

In each of the above embodiments, an ion trap including aluminum (Al) and magnesium (Mg) may be added to the encapsulation resin 30. With this structure, the ion trap material captures chloride ions (Cl—) in the encapsulation resin 30 and avoids the occurrence of pitting corrosion that would occur when chloride ions bond to the first wire 41.

Lead Frame

In each of the above embodiments, the location where the plating layer 14 is formed in the lead frame 10 may be freely changed. For example, the plating layer 14 may be formed on part of the lead frame 10. In one example, the plating layer 14 is formed on each of the first island 11a of the first lead frame 11, the second island 12a of the second lead frame 12, and the third island 13a of the third lead frame 13. The plating layer 14 does not have to be formed on at least one of the first terminal 11b of the first lead frame 11, the second terminal 12b of the second lead frame 12, and the third terminal 13b of the third lead frame 13.

Functional Element Formation Region

In the first to third embodiments, the percentage of the area occupied by the channel formation region 72 per unit area is not limited to 50% and may be freely changed. For example, the percentage of the area occupied by the channel formation region 72 per unit area may be 25% or 75%. The percentage of the area occupied by the channel formation region 72 per unit area is set based on the relationship of the active clamp capacity Eac and the ON resistance. Preferably, the percentage of the area occupied by the channel formation region 72 per unit area is, for example, 20% or greater and 80% or less.

In the fourth embodiment, the second functional element formation region units U2, which generate a large amount of heat, may be arranged in regions adjacent to the temperature sensor 27 in the active region 29. This allows for adjustment so that the temperature is the highest in the active region 29 in the proximity of the temperature sensor 27.

In the fourth embodiment, the functional element formation regions 231 include the first to third functional element formation regions 232 to 234. However, the functional element formation regions 231 are not limited to these types. The number of types of the functional element formation regions 231 may be freely changed. For example, the functional element formation regions 231 may include two types of functional element formation regions. Alternatively, the functional element formation regions 231 may include four or more types of functional element formation regions. Further, the percentage of the area occupied by the channel formation region 72 per unit area in the fourth embodiment is 25%, 50%, or 75% but not limited to these values and may be other values (e.g., 30%, 60%, 80%, etc.).

Application Example of Semiconductor Device 1

Examples of circuits to which the semiconductor device 1 is applied will now be described with reference to FIGS. 42 to 46.

First Application Example

Figure 42:
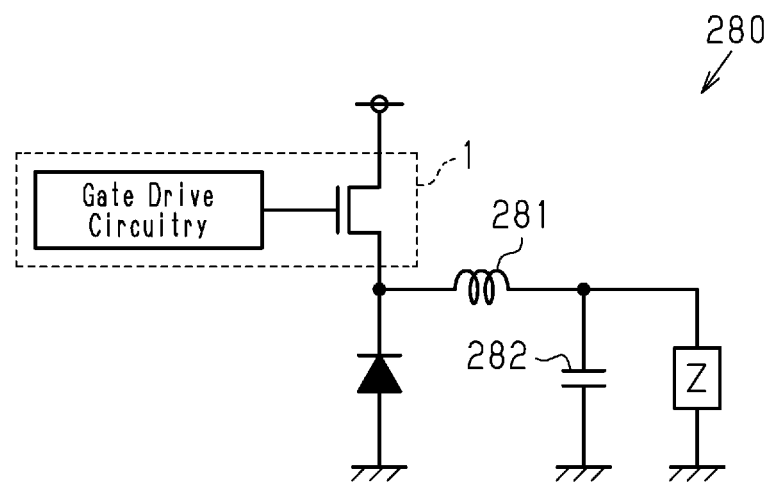
FIG. 42 is a diagram illustrating a first application example of the semiconductor device.

As shown in FIG. 42, the semiconductor device 1 may form a non-synchronous rectification type switching power supply circuit 280. The switching power supply circuit 280 includes a single semiconductor device 1, an inductor 281, and a smoothing capacitor 282. The switching power supply circuit 280 drives the semiconductor device 1 and generates the desired output voltage Vout from the input voltage Vin.

Second Application Example

Figure 43:
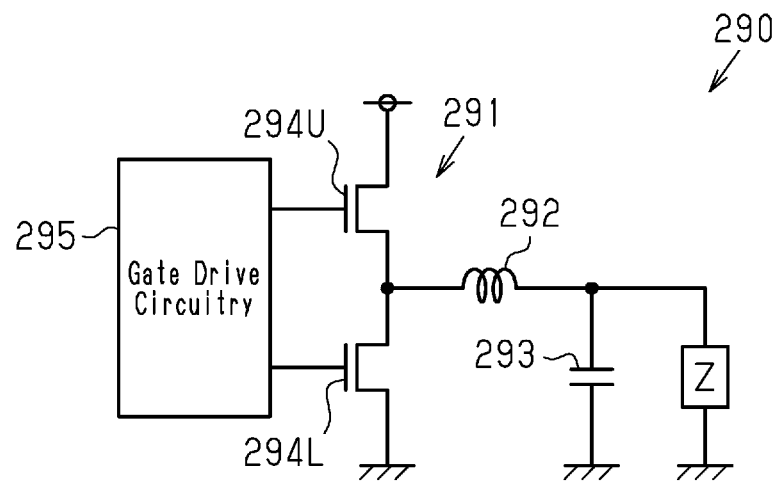
FIG. 43 is a diagram illustrating a second application example of the semiconductor device.

As shown in FIG. 43, the semiconductor device 1 may form a synchronous rectification type switching power supply circuit 290. The switching power supply circuit 290 includes an inverter unit 291, an inductor 292, and a smoothing capacitor 293. The inverter unit 291 includes an upper switching element 294U and a lower switching element 294L. The source terminal of the upper switching element 294U is electrically connected to the drain terminal of the lower switching element 294L. The gate terminal of the upper switching element 294U and the gate terminal of the lower switching element 294L are connected to a gate drive circuitry 295. The switching power supply circuit 290 drives the upper switching element 294U and the lower switching element 294L is a complementary (exclusive) manner to generate the desired output voltage Vout from the input voltage Vin. The semiconductor device 1 may be applied to at least one of the upper switching element 294U and the lower switching element 294L. For example, when the semiconductor device 1 is applied to the lower switching element 294L, the lower switching element 294L in the inverter unit 291 and a gate drive circuit that drives the lower switching element 294L in the gate drive circuitry 295 is replaced by the semiconductor device 1.

Third Application Example

Figure 44:
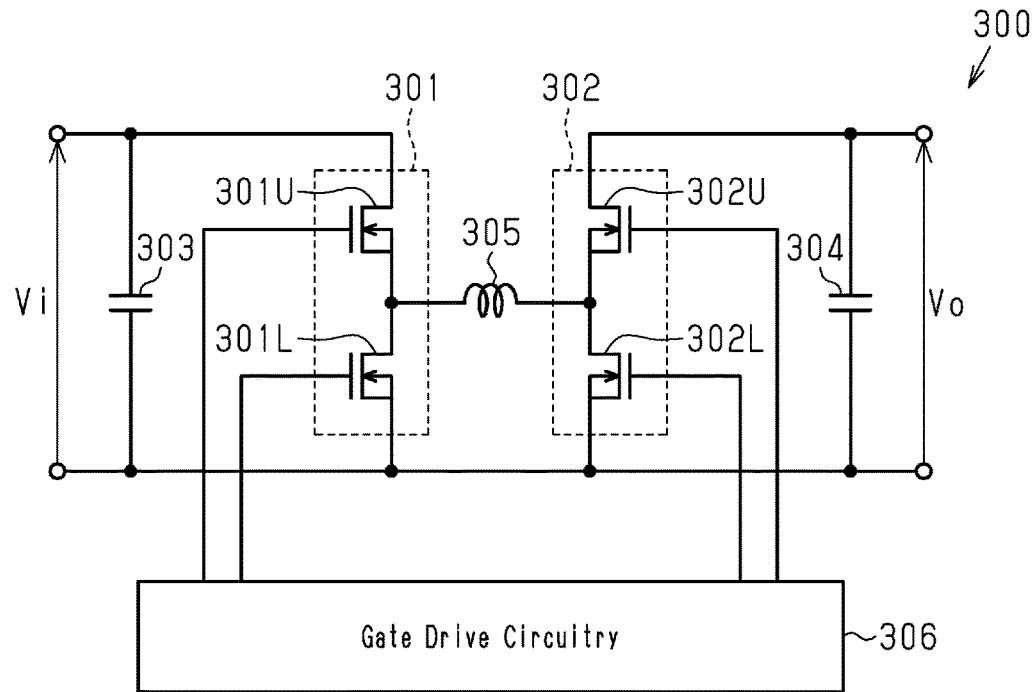
FIG. 44 is a diagram illustrating a third application example of the semiconductor device.

The semiconductor device 1 may be applied to an H-bridge type converter. FIG. 44 shows the circuit configuration of an H-bridge type step-down converter circuit (hereafter, simply referred to as "the converter circuit 300"), which is one example of an H-bridge type converter.

The converter circuit 300 includes a first inverter unit 301, a second inverter unit 302, an input capacitor 303, an output capacitor 304, an inductance 305, and a gate drive circuitry 306 to increase an input voltage Vi to an output voltage Vo.

The first inverter unit 301 includes an upper switching element 301U and a lower switching element 301L. The source terminal of the upper switching element 301U is electrically connected to the drain terminal of the lower switching element 301L. The first inverter unit 301 is connected in parallel to the input capacitor 303. In detail, the drain terminal of the upper switching element 301U is electrically connected to a first terminal of the input capacitor 303, and the source terminal of the lower switching element 301L is electrically connected to a second terminal of the input capacitor 303.

The second inverter unit 302 includes an upper switching element 302U and a lower switching element 302L. The source terminal of the upper switching element 302U is electrically connected to the drain terminal of the lower switching element 302L. The second inverter unit 302 is connected in parallel to the output capacitor 304. In detail, the drain terminal of the upper switching element 302U is connected to a first terminal of the output capacitor 304, and the source terminal of the lower switching element 302L is connected to a second terminal of the output capacitor 304.

The inductance 305 is connected to the first inverter unit 301 and the second inverter unit 302. In detail, a first terminal of the inductance 305 is connected to a connection point in the first inverter unit 301 between the source terminal of the upper switching element 301U and the drain terminal of the lower switching element 301L. A second terminal of the inductance 305 is connected to a connection point in the second inverter unit 302 between the source terminal of the upper switching element 302U and the drain terminal of the lower switching element 302L.

The gate drive circuitry 306 is electrically connected to the gate terminal of each of the switching elements 301U, 301L, 302U, and 302L. The gate drive circuitry 306 ON/OFF-controls each of the switching elements 301U, 301L, 302U, and 302L.

The semiconductor device 1 may be applied to at least one of the switching elements 301U, 301L, 302U, and 302L. For example, when the semiconductor device 1 is applied to the lower switching element 301L of the first inverter unit 301, the lower switching element 301L in the first inverter unit 301 and a gate drive circuit that drives the lower switching element 301L in the gate drive circuitry 306 is replaced by the semiconductor device 1.

Fourth Application Example

Figure 45:
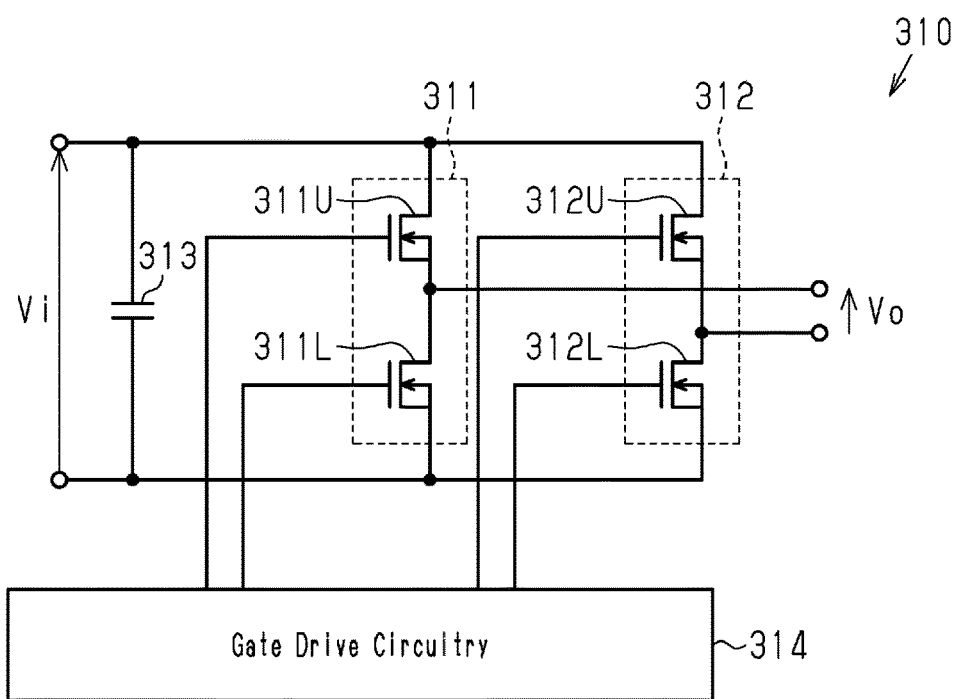
FIG. 45 is a diagram illustrating a fourth application example of the semiconductor device.

The semiconductor device 1 may be applied to a full-bridge type inverter circuit (hereafter, simply referred to as "the inverter circuit 310") that is shown in FIG. 45. The inverter circuit 310 includes a first inverter unit 311, a second inverter unit 312, an input capacitor 313, and a gate drive circuitry 314 and converts the input voltage Vi to the output voltage Vo between the first inverter unit 311 and the second inverter unit 312.

The first inverter unit 311 includes an upper switching element 311U and a lower switching element 311L. The source terminal of the upper switching element 311U is electrically connected to the drain terminal of the lower switching element 311L. The first inverter unit 311 is connected in parallel to the input capacitor 313. In detail, the drain terminal of the upper switching element 311U is electrically connected to a first terminal of the input capacitor 313, and a source terminal of the lower switching element 311L is electrically connected to a second terminal of the input capacitor 313.

The second inverter unit 312 includes an upper switching element 312U and a lower switching element 312L. The source terminal of the upper switching element 312U is electrically connected to the drain terminal of the lower switching element 312L. The second inverter unit 312 is connected in parallel to the first inverter unit 311. In detail, the drain terminal of the upper switching element 312U is electrically connected to the drain terminal of the upper switching element 311U, and the source terminal of the lower switching element 312L is electrically connected to the source terminal of the lower switching element 311L. The output voltage Vo is set by the voltage obtained between a connection point of the source terminal of the upper switching element 311U and the drain terminal of the lower switching element 311L and a connection point of the source terminal of the upper switching element 312U and the drain terminal of the lower switching element 312L.

The gate drive circuitry 314 is electrically connected to the gate terminal of each of the switching elements 311U, 311L, 312U, and 312L. The gate drive circuitry 314 ON/OFF-controls each of the switching elements 311U, 311L, 312U, and 312L.

The semiconductor device 1 may be applied to at least one of the switching elements 311U, 311L, 312U, and 312L. For example, when the semiconductor device 1 is applied to the lower switching element 311L of the first inverter unit 311, the lower switching element 311L in the first inverter unit 311 and a gate drive circuit that drives the lower switching element 311L in the gate drive circuitry 314 is replaced by the semiconductor device 1.

Fifth Application Example

Figure 46:
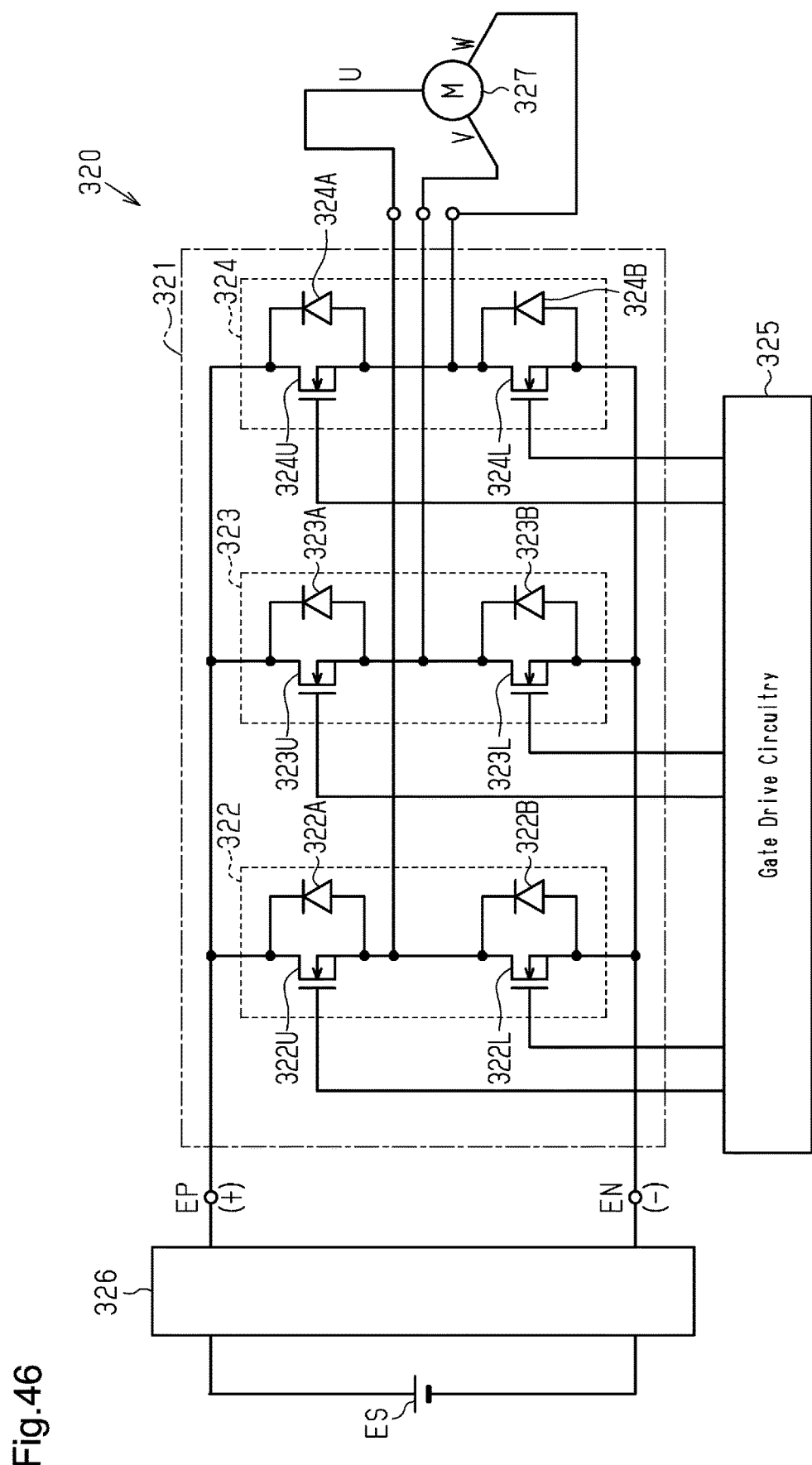
FIG. 46 is a diagram illustrating a fifth application example of the semiconductor device.

The semiconductor device 1 may be applied to a three-phase AC inverter circuit (hereafter, simply referred to as "the three-phase inverter circuit 320") that is shown in FIG. 46.

The three-phase inverter circuit 320 includes a power drive unit 321 electrically connected to the U-phase, V-phase, and W-phase coils of a three-phase AC motor (hereafter, simply referred to as "the motor 327"), a gate drive circuitry 325 that controls the power drive unit 321, and a converter unit 326 connected to the power drive unit 321 and a power supply ES. The converter unit 326 includes a positive power terminal EP and a negative power terminal EN.

The power drive unit 321 controls the power supplied to the U-phase, V-phase, and W-phase coils of the motor 327. The power drive unit 321 includes a U-phase inverter unit 322, a V-phase inverter unit 323, and a W-phase inverter unit 324. The U-phase inverter unit 322, the V-phase inverter unit 323, and the W-phase inverter unit 324 are connected in parallel to one another between the positive power terminal EP and the negative power terminal EN.

The U-phase inverter unit 322 includes an upper switching element 322U and a lower switching element 322L. The drain terminal of the upper switching element 322U is electrically connected to the positive power terminal EP. The source terminal of the upper switching element 322U is electrically connected to the drain terminal of the lower switching element 322L. The source terminal of the lower switching element 322L is connected to the negative power terminal EN. A snubber diode 322A is connected in inverse-parallel to the upper switching element 322U, and a snubber diode 322B is connected in inverse-parallel to the lower switching element 322L. In detail, the anode of the snubber diode 322A is electrically connected to the source terminal of the upper switching element 322U, and the cathode of the snubber diode 322A is electrically connected to the drain terminal of the upper switching element 322U. The anode of the snubber diode 322B is electrically connected to the source terminal of the lower switching element 322L, and the cathode of the snubber diode 322B is electrically connected to the drain terminal of the lower switching element 322L.

The V-phase inverter unit 323 includes an upper switching element 323U and a lower switching element 323L. The drain terminal of the upper switching element 323U is electrically connected to the positive power terminal EP. The source terminal of the upper switching element 323U is electrically connected to the drain terminal of the lower switching element 323L. The source terminal of the lower switching element 323L is connected to the negative power terminal EN. A snubber diode 323A is connected in inverse-parallel to the upper switching element 323U, and a snubber diode 323B is connected in inverse-parallel to the lower switching element 323L. In detail, the anode of the snubber diode 323A is electrically connected to the source terminal of the upper switching element 323U, and the cathode of the snubber diode 323A is electrically connected to the drain terminal of the upper switching element 323U. The anode of the snubber diode 323B is electrically connected to the source terminal of the lower switching element 323L, and the cathode of the snubber diode 323B is electrically connected to the drain terminal of the lower switching element 323L.

The W-phase inverter unit 324 includes an upper switching element 324U and a lower switching element 324L. The drain terminal of the upper switching element 324U is electrically connected to the positive power terminal EP. The source terminal of the upper switching element 324U is electrically connected to the drain terminal of the lower switching element 324L. The source terminal of the lower switching element 324L is connected to the negative power terminal EN. A snubber diode 324A is connected in inverse-parallel to the upper switching element 324U, and a snubber diode 324B is connected in inverse-parallel to the lower switching element 324L. In detail, the anode of the snubber diode 324A is electrically connected to the source terminal of the upper switching element 324U, and the cathode of the snubber diode 324A is electrically connected to the drain terminal of the upper switching element 324U. The anode of the snubber diode 324B is electrically connected to the source terminal of the lower switching element 324L, and the cathode of the snubber diode 324B is electrically connected to the drain terminal of the lower switching element 324L.

The gate drive circuitry 325 is electrically connected to the gate terminal of each of the switching elements 322U, 322L, 323U, 323L, 324U, and 324L. The gate drive circuitry 325 ON/OFF-controls each of the switching elements 322U, 322L, 323U, 323L, 324U, and 324L.

The semiconductor device 1 may be applied to at least one of the switching elements 322U, 322L, 323U, 323L, 324U, and 324L. For example, when the semiconductor device 1 is applied to the lower switching element 322L of the U-phase inverter unit 322, the lower switching element 322L in the U-phase inverter unit 322 and a gate drive circuit that drives the lower switching element 322L in the gate drive circuitry 325 is replaced by the semiconductor device 1.

Additional Concepts

Technical concepts that can be recognized from the above embodiments and modified examples will now be described.

Additional Concept 1-1

A semiconductor device including a substantially L-shaped active region obtained by joining a first region having a small quadrangular shape and a second region having a large quadrangular shape, wherein a first wire serving as a connection member and a source pad are connected to each other at a position on a line segment connecting a center of gravity position of the first region and a center of gravity position of the second region.

Additional Concept 1-2

The semiconductor device according to additional concept 1-1, wherein a semiconductor element includes a transistor, and the semiconductor device includes a second lead frame that ON/OFF-controls the transistor and a third lead frame that is connected to the first wire, the second lead frame is arranged at a side of the first region, and the third lead frame is arranged at a side of the second region.

Additional Concept 1-3

The semiconductor device according to additional concept 1-2, wherein the semiconductor element includes a gate pad connected to the second lead frame, and in a region surrounded by an extended line of a side (first side) of the first region RA1 and an extended line of a side (fourth side) of a second region, the gate pad is arranged in a tetragonal region where the transistor is not located.

Additional Concept 1-4

The semiconductor device according to additional concept 1-3, wherein a source pad is also substantially L-shaped, the source pad is formed over the first region and the second region that are included in the active region, and the source pad is configured so that a first side of the source pad that is the farthest from the second region coincides in a horizontal direction with a position where the gate pad is arranged.

Additional Concept 1-5

The semiconductor device according to additional concept 1-3, wherein a temperature sensor is arranged between the gate pad and the source pad.

Additional Concept 1-6

The semiconductor device according to additional concept 1-1, wherein the first wire and the source pad are connected to each other at two locations that are the center of gravity position of the first region and the center of gravity position of the second region.

Additional Concept 2-1

A semiconductor device including a semiconductor element including a substrate having a transistor formation region in which a transistor is formed and an electrode pad formed on the transistor formation region, and a first connection member connected to the electrode pad at one location, wherein the transistor formation region is formed to have a recessed shape in a plan view in which a single recess is recessed in a vertically central part of a tetragon or a single recess is recessed in a horizontally central part, the electrode pad is arranged to cover a center of gravity of transistor formation region in the plan view, and a connection region where the first connection member is connected to the electrode pad in the plan view includes a center of gravity position of the transistor formation region.

Additional Concept 2-2

The semiconductor device according to additional concept 2-1, wherein a center position of the connection region coincides with the center of gravity position of the transistor formation region.

Additional Concept 2-3

A semiconductor device including a semiconductor element including a substrate having a transistor formation region in which a transistor is formed and an electrode pad formed on the transistor formation region, and a first connection member connected to the electrode pad at multiple locations, wherein the transistor formation region is formed to have a recessed shape in a plan view in which a single recess is recessed in a vertically central part of a tetragon or a single recess is recessed in a horizontally central part and the transistor formation region is divided into divided regions having equal areas in accordance with the number of locations where the first connection member is connected, the electrode pad is arranged to cover a center of gravity of each of the divided regions in the plan view, and a connection region where the first connection member is connected to the electrode pad includes a center of gravity position of each of the divided regions in the plan view.

Additional Concept 2-4

A semiconductor device including a semiconductor element including a substrate having a transistor formation region in which a transistor is formed and an electrode pad formed on the transistor formation region, and first connection members connected to the electrode pad, wherein the transistor formation region is formed to have a recessed shape in a plan view in which a single recess is recessed in a vertically central part of a tetragon or a single recess is recessed in a horizontally central part and the transistor formation region is divided into divided regions having equal areas in accordance with the number of the first connection members, the electrode pad is arranged to cover a center of gravity of each of the divided regions in the plan view, and a connection region where each of the first connection members is connected to the electrode pad includes a center of gravity position of each of the divided regions in the plan view.

Additional Concept 2-5

The semiconductor device according to additional concept 4, wherein the number of the first connection members is two, when the recess is arranged at the vertically central part, the transistor formation region is divided into two divided regions by a hypothetical line extending in a horizontal direction at the vertically central part, and when the recess is arranged at the horizontally central part, the transistor formation region is divided into two divided regions by a hypothetical line extending in a vertical direction at the horizontally central part.

Additional Concept 2-6

The semiconductor device according to any one of additional concepts 2-1 to 2-5, further including a control circuit region formed in a region of the semiconductor element that differs from the transistor formation region to control current flowing to the semiconductor device.

Additional Concept 2-7

The semiconductor device according to additional concept 2-6, wherein at least part of the control circuit region is located in a recess of the transistor formation region.

Additional Concept 2-8

The semiconductor device according to additional concept 2-6 or 2-7, wherein a temperature sensor is arranged in the control circuit region.

Additional Concept 2-9

The semiconductor device according to additional concept 2-8, wherein the temperature sensor is located in the control circuit region at a portion separated from the first connection member in the plan view.

Additional Concept 2-10

The semiconductor device according to additional concept 2-8 or 2-9, wherein the temperature sensor is arranged in the control circuit region, which is located in the recess, at a location adjacent to a bottom surface of the recess.

Additional Concept 2-11

The semiconductor device according to additional concept 2-8 or 2-9, wherein the transistor formation region includes a first recess and a second recess as the recess, the second recess is recessed from a bottom surface of the first recess, at least part of the control circuit region is located in the second recess, and the temperature sensor is arranged in the control circuit region at a position located in the second recess.

Additional Concept 2-12

The semiconductor device according to any one of additional concepts 2-1 to 2-11, wherein the semiconductor element includes a power transistor and a control electrode pad connected to a control terminal of the power transistor, and the control electrode pad is arranged in a cutout region of the transistor formation region at a location that differs from the recess.

Additional Concept 3-1

A semiconductor device comprising:
a semiconductor element including a substrate, having a transistor formation region in which a transistor is formed and which is shaped to be non-quadrangular, and an electrode pad on the transistor formation region; and
a first connection member connected to the electrode pad at one location, wherein
the electrode pad is arranged to cover a center of gravity of the transistor formation region in a plan view of the electrode pad, and
in the plan view, a connection region in which the first connection member is connected to the electrode pad includes a center of gravity position of the transistor formation region.

Additional Concept 3-2

The semiconductor device according to claim 1, wherein a center position of the connection region coincides with the center of gravity position of the transistor formation region.

Additional Concept 3-3

A semiconductor device comprising:
a semiconductor element including a substrate, having a transistor formation region in which a transistor is formed and which is shaped to be non-quadrangular, and an electrode pad on the transistor formation region; and
a first connection member connected to the electrode pad at multiple locations, wherein
the transistor formation region is divided into divided regions having equal areas in accordance with the number of locations where the first connection member is connected, the electrode pad is arranged to cover a center of gravity of each of the divided regions in a plan view, and in the plan view, a connection region in which the first connection member is connected to the electrode pad includes a center of gravity position of each of the divided regions.

Additional Concept 3-4

A semiconductor device comprising:
a semiconductor element including a substrate, having a transistor formation region in which a transistor is formed and which is shaped to be non-quadrangular, and an electrode pad on the transistor formation region; and
first connection members connected to the electrode pad, wherein
the transistor formation region is divided into divided regions having equal areas in accordance with the number of the first connection members,
the electrode pad is arranged to cover a center of gravity of each of the divided regions in a plan view, and
in the plan view, a connection region in which the first connection members are each connected to the electrode pad includes a center of gravity position of each of the divided regions Additional Concept 3-5

The semiconductor device according to claim 3 or 4, wherein the divided regions are equally divided to approach a square.

Additional Concept 3-6

The semiconductor device according to any one of claims 3 to 5, wherein a center position of the connection region coincides with the center of gravity position of each of the divided regions.

Additional Concept 3-7

The semiconductor device according to any one of claims 1 to 6, wherein the semiconductor element includes a power transistor and a control electrode pad connected to a control terminal of the power transistor, the semiconductor device comprising:
a first lead frame on which the semiconductor element is mounted;
a second lead frame connected to a second connection member, wherein the second connection member has one end connected to the control electrode pad and another end connected to the second lead frame; and
a third lead frame connected to the first connection member, wherein the first connection member has one end connected to the semiconductor element and another end connected to the third lead frame.

Additional Concept 3-8

The semiconductor device according to claim 7, wherein the first lead frame and the third lead frame are formed including copper,
the first connection member is formed including aluminum, and
a surface of at least one of the first lead frame and the third lead frame includes a plating layer.

Additional Concept 3-9

The semiconductor device according to claim 8, wherein the first lead frame includes a first island on which the semiconductor element is mounted, and
a surface of the first island on which the semiconductor element is mounted includes a plating layer.

Additional Concept 3-10

The semiconductor device according to claim 8 or 9, wherein
the third lead frame includes a third island to which the first connection member is connected, and
a surface of the third island where the first connection member is connected includes a plating layer.

Additional Concept 3-11

The semiconductor device according to any one of claims 7 to 10, wherein
the second lead frame is formed including copper and includes a second island to which the second connection member is connected,
the second connection member is formed including aluminum, and
a surface of the third island where the second connection member is connected includes a plating layer.

Additional Concept 3-12

The semiconductor device according to claim 10, wherein
the first connection member is wedge-bonded to the electrode pad and includes a connection portion connected to the electrode pad, and
in a plan view, the connection portion extends from the semiconductor element toward the third island.

Additional Concept 3-13

The semiconductor device according to any one of claims 1 to 12, comprising:
a temperature sensor arranged on the substrate outside the electrode pad,
wherein the temperature sensor is located in a region outside the electrode pad where heat is most concentrated when the semiconductor device is driven.

Additional Concept 3-14

The semiconductor device according to any one of claims 1 to 13, wherein:
the substrate includes trenches and functional element formation regions, which are respectively laid out along the trenches and include a channel formation region that becomes a current path;
the functional element formation regions include a first functional element formation region, in which an area occupied by the channel formation region per unit area is relatively small, and a second functional element formation region, in which an area occupied by the channel formation region per unit area is relatively large; and among the functional element formation regions, the first functional element formation region is arranged in a region where heat generation is to be limited.

Additional Concept 3-15

The semiconductor device according to claim 14, wherein
the first connection member is electrically connected to the functional element formation regions, and
among the functional element formation regions, the first functional element formation region is arranged in a region where the first connection member is connected.

Additional Concept 3-16

The semiconductor device according to claim 15 that is dependent on claim 2 or 3, wherein
the first connection member is connected to the electrode pad at multiple locations, and
in the first functional element formation region where the first connection member is connected to the functional element formation regions, the second functional element formation region is arranged in a region between adjacent ones of the first functional element formation regions.

Additional Concept 3-17

The semiconductor device according to any one of claims 14 to 16, comprising:
a metal layer formed between the functional element formation regions and the electrode pad and electrically connecting the functional element formation regions and the electrode pad, and
a portion of the metal layer opposing at least the electrode pad includes one or more slits.

Additional Concept 3-18

The semiconductor device according to claim 17, wherein
the metal layer includes a first metal layer and a second metal layer superposed on the first metal layer by way of a contact electrically connected to the first metal layer,
portions of the first metal layer and the second metal layer opposing at least the electrode pad include one or more slits, and
the slit of the first metal layer and the slit of the second metal layer are opposed in a superimposing direction of the first metal layer and the second metal layer.

Additional Concept 3-19

The semiconductor device according to claim 18, comprising
an interlayer insulation film formed on the functional element formation regions and covering the first metal layer and the second metal layer.
wherein the interlayer insulation film is embedded in the slit of the first metal layer and the slit of the second metal layer.

Additional Concept 3-20

The semiconductor device according to any one of claims 1 to 19, wherein the electrode pad is formed including copper.

Additional Concept 3-21

The semiconductor device according to any one of claims 1 to 20, comprising a connection layer arranged on a surface of the electrode pad to connects the first connection member.

Additional Concept 3-22

The semiconductor device according to any one of claims 1 to 21, wherein the electrode pad has a thickness of 16000 Å or greater.

Additional Concept 3-23

The semiconductor device according to claim 22, wherein the electrode pad has a thickness of 20000 Å or greater.

Additional Concept 3-24

The semiconductor device according to any one of claims 1 to 23, wherein
the first connection member is aluminum,
an encapsulation resin encapsulates at least the semiconductor element and the first connection member, and
the encapsulation resin has a coefficient of linear expansion that is greater than 10 ppm/K and less than 15 ppm/K.

Additional Concept 3-25

The semiconductor device according to claim 24, wherein the coefficient of linear expansion of the encapsulation resin is 12 ppm/K.

Additional Concept 3-26

The semiconductor device according to claim 24 or 25, wherein an ion trap material containing aluminum and magnesium is added to the encapsulation resin.

Additional Concept 3-27

The semiconductor device according to any one of claims 1 to 26, wherein
the electrode pad includes
a first protection layer covering an interlayer insulation film,
a first electrode layer covering the first protection layer,
a second protection layer covering the first electrode layer, and
a second electrode layer covering the second protection layer,
the first protection layer and the second protection layer each have a Vickers hardness greater than that of the first electrode layer and the second electrode layer.

Additional Concept 3-28

The semiconductor device according to claim 27, wherein
the first electrode layer and the second electrode layer are formed from aluminum or an aluminum alloy, and the first protection layer and the second protection layer are formed from titanium nitride.

Additional Concept 3-29

The semiconductor device according to any one of claims 1 to 28, wherein the first connection member is an aluminum wire that is wedge-bonded to the electrode pad.

Additional Concept 3-30

The semiconductor device according to claim 29, wherein the aluminum wire has a diameter of 300 μm or greater and 400 μm or less.

Additional Concept 3-31

The semiconductor device according to any one of claims 1 to 30, wherein the first connection member is a copper wire that is wedge-bonded to the electrode pad.

Additional Concept 3-32

The semiconductor device according to any one of claims 1 to 31, wherein the semiconductor element includes a power transistor and a control circuit that controls the power transistor.

Additional Concept 3-33

The semiconductor device according to any one of claims 1 to 32, wherein the semiconductor device has an on resistance of 30 mΩ or less.

DESCRIPTION OF REFERENCE CHARACTERS 1) semiconductor device; 11) first lead frame; 11a) first island; 12) second lead frame; 12a) second island; 13) third lead frame; 13a) third island; 14) plating layer; 20) semiconductor element; 21) source pad (electrode pad); 21a) connection layer; 22) gate pad (control electrode pad); 23a) MISFET (power transistor); 27) temperature sensor; 29) active region (transistor formation region); 30) encapsulation resin; 41) first wire (first connection member); 41a) connection portion; 41b) first connection portion; 41c) second connection portion; 42) second wire (second connection member); 50) substrate; 66) trench; 72) channel formation region; 74) interlayer insulation film; 80) first source electrode (first metal layer, metal layer); 81) contact; 82) second source electrode (second metal layer, metal layer); 83) contact; 220) first slit; 221) second slit; 231) functional element formation region; 232) first function element formation region; 233) second functional element formation region; 270) source pad (electrode pad); 271) first protection layer; 272) first electrode layer; 273) second protection layer; 274) second electrode layer; 275) connection layer; GC, GD, GF, GH) center of gravity positions; GB1, GE1, GG1, GJ1) center of gravity positions of regions having equal areas obtained by dividing transistor formation region; GB2, GE2, GG2, GJ2) center of gravity positions having equal areas obtained by dividing transistor formation region; RX, RY) wedge (connection region)

The invention claimed is:
1. A semiconductor device, comprising:
a semiconductor element comprising:
a substrate having a transistor formation region in which a transistor is formed and which is shaped to be non-quadrangular, and
an electrode pad on the transistor formation region;
a surface protection film that covers the electrode pad; and
a first connection member connected to the electrode pad at one location, wherein
the first connection member is a bonding wire,
the electrode pad is arranged to cover a center of gravity of the transistor formation region in a plan view of the electrode pad,
in the plan view, a connection region in which the first connection member is connected to the electrode pad includes a center of gravity position of the transistor formation region to increase active clamp capacity,
a center position of the connection region coincides with the center of gravity position of the transistor formation region, and
the surface protection film has an opening for the connection region.

2. A semiconductor device, comprising:
a semiconductor element comprising:
a substrate having a transistor formation region in which a transistor is formed and which is shaped to be non-quadrangular, and
an electrode pad on the transistor formation region;
a surface protection film that covers the electrode pad; and
a first connection member connected to the electrode pad at multiple locations, wherein
the first connection member is a bonding wire,
the transistor formation region is divided into divided regions having equal areas in accordance with the number of locations where the first connection member is connected,
the electrode pad is arranged to cover a center of gravity of each of the divided regions in a plan view,
in the plan view, a connection region in which the first connection member is connected to the electrode pad includes a center of gravity position of each of the divided regions to increase active clamp capacity,
a center position of the connection region coincides with the center of gravity position of each of the divided regions, and
the surface protection film has an opening for the connection region.

3. A semiconductor device, comprising:
a semiconductor element comprising:
a substrate having a transistor formation region in which a transistor is formed and which is shaped to be non-quadrangular, and
an electrode pad on the transistor formation region;
a surface protection film that covers the electrode pad; and
first connection members connected to the electrode pad, wherein
each of the first connection members is a bonding wire,
the transistor formation region is divided into divided regions having equal areas in accordance with the number of the first connection members,
the electrode pad is arranged to cover a center of gravity of each of the divided regions in a plan view,
in the plan view, a connection region in which the first connection member is connected to the electrode pad includes a center of gravity position of each of the divided regions to increase active clamp capacity,
a center position of the connection region coincides with the center of gravity position of each of the divided regions, and the surface protection film has an opening for the connection region.

4. The semiconductor device according to claim 2, wherein the divided regions are equally divided to approach a square.

5. The semiconductor device according to claim 1, wherein the semiconductor element includes a power transistor and a control electrode pad connected to a control terminal of the power transistor, the semiconductor device comprising:
- a first lead frame on which the semiconductor element is mounted;
- a second lead frame connected to a second connection member, wherein the second connection member has one end connected to the control electrode pad and another end connected to the second lead frame; and
- a third lead frame connected to the first connection member, wherein the first connection member has one end connected to the semiconductor element and another end connected to the third lead frame.

6. The semiconductor device according to claim 5, wherein
the first lead frame and the third lead frame are formed including copper,
the first connection member is formed including aluminum, and
a surface of at least one of the first lead frame and the third lead frame includes a plating layer.

7. The semiconductor device according to claim 6, wherein
the first lead frame includes a first island on which the semiconductor element is mounted, and
a surface of the first island on which the semiconductor element is mounted includes a plating layer.

8. The semiconductor device according to claim 6, wherein
the third lead frame includes a third island to which the first connection member is connected, and
a surface of the third island where the first connection member is connected includes a plating layer.

9. The semiconductor device according to claim 5, wherein
the second lead frame is formed including copper and includes a second island to which the second connection member is connected,
the second connection member is formed including aluminum, and
a surface of the third island where the second connection member is connected includes a plating layer.

10. The semiconductor device according to claim 8, wherein
the first connection member is wedge-bonded to the electrode pad and includes a connection portion connected to the electrode pad, and
in a plan view, the connection portion extends from the semiconductor element toward the third island.

11. The semiconductor device according to claim 1, further comprising:
- a temperature sensor arranged on the substrate outside the electrode pad,
  - wherein the temperature sensor is located in a region outside the electrode pad where heat is most concentrated when the semiconductor device is driven.

12. The semiconductor device according to claim 3, wherein the divided regions are equally divided to approach a square.

13. The semiconductor device according to claim 2, wherein the semiconductor element includes a power transistor and a control electrode pad connected to a control terminal of the power transistor, the semiconductor device further comprising:
- a first lead frame on which the semiconductor element is mounted;
- a second lead frame connected to a second connection member, wherein the second connection member has one end connected to the control electrode pad and another end connected to the second lead frame; and
- a third lead frame connected to the first connection member, wherein the first connection member has one end connected to the semiconductor element and another end connected to the third lead frame.

14. The semiconductor device according to claim 3, wherein the semiconductor element includes a power transistor and a control electrode pad connected to a control terminal of the power transistor, the semiconductor device further comprising:
- a first lead frame on which the semiconductor element is mounted;
- a second lead frame connected to a second connection member, wherein the second connection member has one end connected to the control electrode pad and another end connected to the second lead frame; and
- a third lead frame connected to the first connection member, wherein the first connection member has one end connected to the semiconductor element and another end connected to the third lead frame.

15. The semiconductor device according to claim 2, further comprising:
- a temperature sensor arranged on the substrate outside the electrode pad,
  - wherein the temperature sensor is located in a region outside the electrode pad where heat is most concentrated when the semiconductor device is driven.

16. The semiconductor device according to claim 3, further comprising:
- a temperature sensor arranged on the substrate outside the electrode pad,
  - wherein the temperature sensor is located in a region outside the electrode pad where heat is most concentrated when the semiconductor device is driven.

* * * * *